(12) United States Patent
Olsson et al.

(10) Patent No.: US 11,476,851 B1
(45) Date of Patent: *Oct. 18, 2022

(54) MAGNETICALLY SENSED USER INTERFACE DEVICES

(71) Applicant: SeeScan, Inc., San Diego, CA (US)

(72) Inventors: Mark S Olsson, La Jolla, CA (US); Austin Rutledge, San Diego, CA (US); Loni M Heyenbruch, Escondido, CA (US); Alexander L Warren, Escondido, CA (US); Michael E Turgeon, San Diego, CA (US); Ray Merewether, La Jolla, CA (US); Michael J Martin, San Diego, CA (US)

(73) Assignee: SEESCAN, INC., San Diego, CA (US)

( * ) Notice: Subject to any disclaimer, the term of this patent is extended or adjusted under 35 U.S.C. 154(b) by 62 days.

This patent is subject to a terminal disclaimer.

(21) Appl. No.: 16/725,995

(22) Filed: Dec. 23, 2019

Related U.S. Application Data

(63) Continuation of application No. 15/237,195, filed on Aug. 15, 2016, now Pat. No. 10,523,202, which is a
(Continued)

(51) Int. Cl.
*H03K 17/97* (2006.01)
*H01H 36/02* (2006.01)
(Continued)

(52) U.S. Cl.
CPC ............. *H03K 17/97* (2013.01); *G05G 9/047* (2013.01); *G06F 1/169* (2013.01); *G06F 3/00* (2013.01);
(Continued)

(58) Field of Classification Search
CPC ........ H03K 17/97; G05G 9/047; G06F 1/169; G06F 3/00; G06F 3/016; G06F 3/0338;
(Continued)

(56) References Cited

U.S. PATENT DOCUMENTS 3,112,464 A 11/1963 Ratajaski
3,170,323 A 2/1965 Kurt
(Continued)

FOREIGN PATENT DOCUMENTS

DE 19501439 9/1996
DE 19806611 8/1999
(Continued)

OTHER PUBLICATIONS

International Searching Authority, "Written Opinion of the International Searching Authority" for PCT Patent Application No. PCT/IB10/01039, dated Oct. 15, 2011, European Patent Office, Munich.
(Continued)

*Primary Examiner* — Bernard Rojas
(74) *Attorney, Agent, or Firm* — Steven C. Tietsworth, Esq; Michael J. Pennington, Esq

(57) ABSTRACT

A user interface device including a floating actuator subassembly and a base assembly flexibly coupled to the floating actuator assembly is disclosed. The floating actuator assembly may include a magnet array assembly with a plurality of magnets fixed relative to each other.

13 Claims, 58 Drawing Sheets

Related U.S. Application Data continuation of application No. 13/310,670, filed on Dec. 2, 2011, now Pat. No. 9,423,894.

(60) Provisional application No. 61/525,766, filed on Aug. 20, 2011, provisional application No. 61/438,738, filed on Feb. 2, 2011, provisional application No. 61/424,496, filed on Dec. 17, 2010, provisional application No. 61/419,150, filed on Dec. 2, 2010.

(51) Int. Cl.
| | | |
|---|---|---|
| *G05G 9/047* | (2006.01) | |
| *G06F 1/16* | (2006.01) | |
| *G06F 3/01* | (2006.01) | |
| *H01H 9/54* | (2006.01) | |
| *H01H 25/04* | (2006.01) | |
| *G06F 3/0362* | (2013.01) | |
| *G06F 3/00* | (2006.01) | |
| *G06F 3/0338* | (2013.01) | |

(52) U.S. Cl.
CPC ............ *G06F 3/016* (2013.01); *G06F 3/0338* (2013.01); *G06F 3/0362* (2013.01); *H01H 9/54* (2013.01); *H01H 25/04* (2013.01); *H01H 36/02* (2013.01)

(58) Field of Classification Search
CPC ........ G06F 3/0362; H01H 9/54; H01H 25/04; H01H 36/02
See application file for complete search history.

(56) References Cited

U.S. PATENT DOCUMENTS

| | | |
|---|---|---|
| 3,331,971 A | 7/1967 | Moller |
| 3,764,779 A | 10/1973 | Kadoya |
| 3,980,808 A | 9/1976 | Kikuchi |
| 4,107,604 A | 8/1978 | Bernier |
| 4,161,726 A | 7/1979 | Burson |
| 4,216,467 A | 8/1980 | Colston |
| 4,293,837 A | 10/1981 | Jaffe |
| 4,348,142 A | 9/1982 | Figour |
| 4,459,578 A | 7/1984 | Sava |
| 4,489,303 A | 12/1984 | Martin |
| 4,500,867 A | 2/1985 | Ishitobo |
| 4,651,558 A | 3/1987 | Martin |
| 4,733,214 A | 3/1988 | Andresen |
| 4,774,458 A | 9/1988 | Aronoff |
| 4,785,180 A | 11/1988 | Dietrich |
| 4,825,157 A | 4/1989 | Milkan |
| 4,853,630 A | 8/1989 | Houston |
| 4,879,556 A | 11/1989 | Duimel |
| 4,998,182 A | 3/1991 | Krauter |
| 5,045,842 A | 9/1991 | Galvin |
| 5,146,566 A | 9/1992 | Hollis, Jr |
| 5,160,918 A | 11/1992 | Saposnik |
| 5,168,221 A | 12/1992 | Houston |
| 5,450,054 A | 9/1995 | Schmersal |
| 5,504,502 A | 4/1996 | Arita |
| 5,525,901 A | 6/1996 | Clymer |
| 5,565,891 A | 10/1996 | Armstrong |
| 5,598,090 A | 1/1997 | Baker |
| 5,619,195 A | 4/1997 | Alien |
| 5,670,987 A | 9/1997 | Doi |
| 5,687,080 A | 11/1997 | Hoyt |
| 5,766,027 A | 1/1998 | Hilton |
| 5,749,577 A | 5/1998 | Couch |
| 5,767,840 A | 6/1998 | Selker |
| 5,831,554 A | 11/1998 | Hedayat |
| 5,831,596 A | 11/1998 | Marshall |
| 5,850,142 A | 12/1998 | Rountos |
| 5,939,679 A | 8/1999 | Olsson |
| 5,959,863 A | 9/1999 | Hoyt |
| 5,969,520 A | 10/1999 | Schottler |
| 6,002,184 A | 12/1999 | Delson |
| 6,129,527 A | 10/2000 | Donahoe |
| 6,144,125 A | 11/2000 | Birkestrand |
| 6,225,980 B1 | 5/2001 | Weiss |
| 6,329,812 B1 | 12/2001 | Sundin |
| 6,333,734 B1 | 12/2001 | Rein |
| 6,462,731 B1 | 10/2002 | Stotters |
| 6,501,458 B2 | 12/2002 | Baker |
| 6,550,346 B2 | 4/2003 | Gombert |
| 6,573,709 B1 | 6/2003 | Gandel |
| 6,593,729 B2 | 7/2003 | Sundin |
| 6,597,347 B1 | 7/2003 | Yasutake |
| 6,707,446 B2 | 3/2004 | Nakamura |
| 6,727,889 B2 | 4/2004 | Shaw |
| 6,738,043 B2 | 5/2004 | Endo |
| 6,753,519 B2 | 6/2004 | Gombert |
| 6,762,748 B2 | 7/2004 | Maatta |
| 6,804,012 B2 | 10/2004 | Gombert |
| 6,822,635 B2 | 11/2004 | Shahoian |
| 6,831,679 B1 | 12/2004 | Olsson |
| 6,879,316 B2 | 4/2005 | Kehlstadt |
| 6,891,526 B2 | 5/2005 | Gombert |
| 6,925,975 B2 | 8/2005 | Ozawa |
| 6,928,886 B2 | 8/2005 | Muesel |
| 6,952,197 B1 * | 10/2005 | Nakamura ............ G06F 3/0338 345/157 |
| 7,084,856 B2 | 8/2006 | Huppi |
| 7,148,880 B2 | 12/2006 | Magara |
| 7,151,526 B2 | 12/2006 | Endo |
| 7,164,412 B2 | 1/2007 | Kao |
| 7,233,318 B1 | 6/2007 | Farag |
| 7,474,296 B2 | 1/2009 | Obermeyer |
| 7,552,541 B2 | 6/2009 | Sakuri |
| 7,595,712 B2 * | 9/2009 | Nishino ................ G05G 9/047 200/302.3 |
| 7,733,327 B2 | 6/2010 | Harley |
| 7,737,945 B2 | 6/2010 | West |
| 7,800,581 B2 | 9/2010 | Lye |
| 7,825,903 B2 | 11/2010 | Anastas |
| 8,261,630 B2 * | 9/2012 | Bak ....................... F16H 59/044 74/473.12 |
| 8,344,834 B2 * | 1/2013 | Niiyama ............... G06F 3/0338 335/207 |
| 9,870,021 B2 * | 1/2018 | Olsson ................. G05G 5/05 |
| 2002/0033795 A1 | 3/2002 | Shahoian |
| 2002/0033798 A1 | 3/2002 | Nakamura et al. |
| 2003/0107551 A1 | 6/2003 | Dunker |
| 2003/0126980 A1 | 7/2003 | Barden |
| 2006/0256075 A1 | 11/2006 | Anastas |
| 2007/0182842 A1 | 8/2007 | Sonnenschein |
| 2007/0216650 A1 | 9/2007 | Frohlich |
| 2007/0262959 A1 * | 11/2007 | Gu ......................... G05G 9/047 345/161 |
| 2008/0001919 A1 | 1/2008 | Pascuoci |
| 2008/0174550 A1 | 7/2008 | Laurila |
| 2008/0290821 A1 | 11/2008 | Brandt |
| 2009/0025094 A1 | 1/2009 | York |
| 2009/0058802 A1 | 3/2009 | Orsley |
| 2009/0071808 A1 | 3/2009 | Kang |
| 2009/0115749 A1 | 5/2009 | Kim |
| 2010/0265176 A1 | 10/2010 | Olsson |
| 2014/0340372 A1 * | 11/2014 | Olsson ................. G06F 3/0338 345/184 |

FOREIGN PATENT DOCUMENTS

| | | |
|---|---|---|
| DE | 19954497 | 4/2001 |
| EP | 0628976 | 12/1994 |
| EP | 0982646 | 3/2000 |
| EP | 1193643 | 4/2002 |
| EP | 1708074 A2 | 10/2006 |
| EP | 1926016 A1 | 5/2008 |
| EP | 1953621 | 6/2008 |
| JP | 03036946 | 2/1991 |
| WO | WO 01/69343 | 9/2001 |

(56) References Cited

FOREIGN PATENT DOCUMENTS

| WO | WO 04/049092 A1 | 6/2004 |
| WO | WO 06/106454 A1 | 10/2006 |

OTHER PUBLICATIONS

International Searching Authority, "Written Opinion of the International Searching Authority" for PCT Patent Application No. PCT/US11/37069, dated Nov. 18, 2012, European Patent Office, Munich.
International Searching Authority, "Written Opinion of the International Searching Authority" for PCT Patent Application No. PCT/US11/48535, dated Feb. 20, 2013, European Patent Office, Munich.
International Searching Authority, "Written Opinion of the International Searching Authority" for PCT Patent Application No. PCT/US11/56039, dated Apr. 12, 2013, European Patent Office, Munich.
International Searching Authority, "Written Opinion of the International Searching Authority" for PCT Patent Application No. PCT/US11/59835, dated May 8, 2013, European Patent Office, Munich.
International Searching Authority, "Written Opinion of the international Searching Authority" for PCT Patent Application No. PCT/US11/63186, dated Jun. 2, 2013, European Patent Office, Munich.
Melexis Microelectronic Integrated Systems, Product Information on Absolute Position Sensor IC, MLX90333.
Tietsworth, Steven C., Response to Non-Final Office Action and Amendment (dated Jan. 7, 2012), regarding Magnetic Manual User interface Devices, U.S. Appl. No. 12/756,068.

\* cited by examiner

Example Magnet and Magnetic Sensor Configuration

Example Floating Magnet Array Assembly with Fixed Magnets and Associated Sensor Base Assembly (in Released State Position)

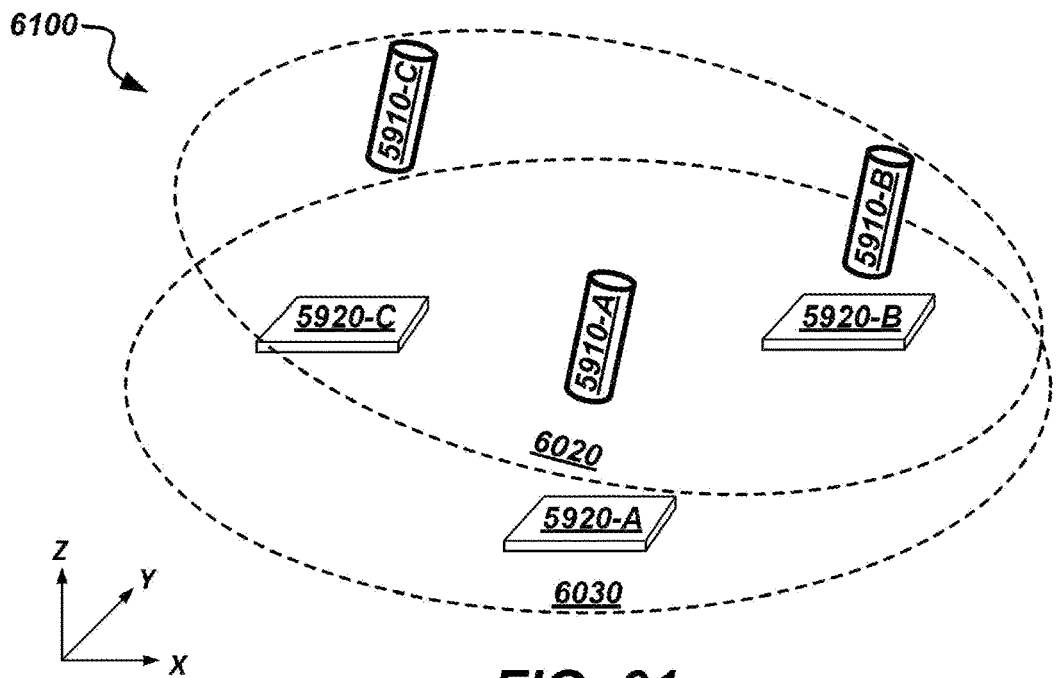
FIG. 61
Example Floating Magnet Array and Associated Base Assembly in Tilt Displacement
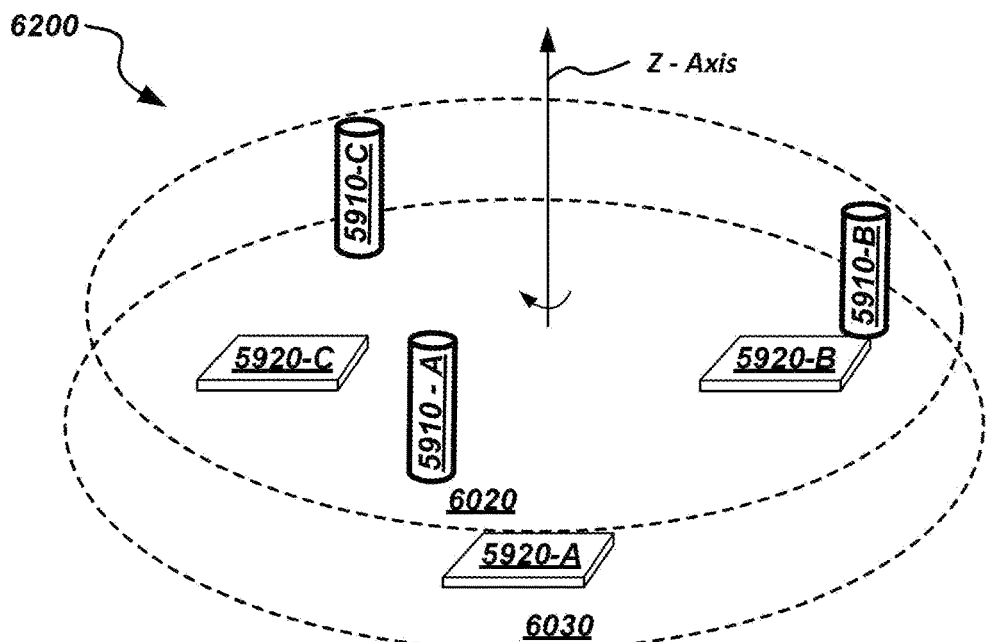
FIG. 62
Example Floating Magnet Array and Associated Base Assembly in Rotational Displacement (in X-Y Plane, About Z Axis)
FIG. 62

Example Floating Magnet Array and Associated Base Assembly in Elevated/Raised Displacement Example Floating Magnet Array and Associated Base Assembly in Lowered/Depressed Displacement Example Deformable Magnet Array Assembly with Movable Magnets and Associated Sensor Base Assembly (in Released State Position)

Example Floating Magnet Array Assembly with Movable Magnets and Associated Sensor Base Assembly
(in Squeezed Position)

*Example User Interface Device Configuration with Floating and Deformable Magnet Assemblies and associated Fixed Sensor Bases*

MAGNETICALLY SENSED USER INTERFACE DEVICES

CROSS-REFERENCE TO RELATED APPLICATIONS

This application is a continuation of and claims priority to co-pending U.S. Utility patent application Ser. No. 13/310,670, filed Dec. 2, 2011, entitled MAGNETICALLY SENSED USER INTERFACE APPARATUS AND DEVICES, which claims priority under 35 U.S.C. § 119(e) to U.S. Provisional Patent Application Ser. No. 61/419,150, filed Dec. 2, 2010, entitled MAGNETICALLY SENSED KNOB-ACTUATOR USER INTERFACE DEVICE, to U.S. Provisional Patent Application Ser. No. 61/424,496, filed Dec. 17, 2010, entitled KNOB-ACTUATOR USER INTERFACE DEVICE WITH MAGNETIC SENSORS, to U.S. Provisional Patent Application Ser. No. 61/438,738, filed Feb. 2, 2011, entitled KNOB ACTUATOR USER INTERFACE DEVICE WITH MAGNETIC SENSORS, and to U.S. Provisional Patent Application Ser. No. 61/525,766, filed Aug. 20, 2011, entitled USER INTERFACE DEVICE METHODS AND APPARATUS USING PERMANENT MAGNETS OR ELECTROMAGNETS AND CORRESPONDING MAGNETIC SENSORS. The content of each of these applications is hereby incorporated by reference herein in its entirety for all purposes.

FIELD

This disclosure relates generally to user interface devices for use with computers, gaming systems, control systems, and other electronic computing systems. More specifically, but not exclusively, the disclosure relates to magnetically sensed user interface apparatus, devices, and systems using magnets and magnetic sensors to determine user-applied actuator displacements and/or deformations.

BACKGROUND

Many electronic computing systems have interface circuitry and/or interface software designed to function with a variety of different user interface devices. These user interface devices can typically be manipulated by a user to input commands, move a cursor, select an icon, move a player in virtual space, and the like.

Existing user interface devices, however, leave much room for improvement. For example, there is a need for compact, durable user interface devices with high resolution configured for ergonomics and ease of use, as well as devices for sensing displacement motions and deformations in multiple axes of motion and degrees of freedom, as well as to provide other improvements in user-interface device technology.

SUMMARY

The present invention relates generally to user interface devices for use with computers, gaming systems, control systems, and other electronic computing systems. More specifically, but not exclusively, the invention relates to magnetically sensed user interface apparatus, devices, and systems using magnets and magnetic sensors to determine user-applied actuator displacements and/or deformations, as well as making and using such apparatus, devices, and system.

For example, in one aspect, the disclosure relates to a magnetic sensing user interface device (UID). The UID may include, for example, a floating actuator assembly including a plurality of magnets. The plurality of magnets may be positioned in a substantially fixed, non-deformable array structure relative to each other. The array structure may be integral with or may be coupled to an actuator element. The actuator element may be a floating actuator element. The UID may further include a base assembly including a plurality of multi-axis magnetic sensors configured to sense magnetic fields generated by the plurality of magnets. The magnetic sensor may be mounted on a printed circuit board or other structure of the base assembly. The base assembly may be fixed relative to the magnets and the actuator element. The UID may further include a flexible coupling assembly. The flexible coupling assembly may be configured to floatably couple the actuator assembly to the base assembly.

In another aspect, the present invention relates to a method of providing a user interface device (UID) output signal from a user interface device. The method may include, for example, receiving, at an actuator element, a user action including a displacement and/or deformation of the actuator element and a coupled actuator assembly, generating, at a plurality of multi-axis magnetic sensors of a base assembly, one or more sensor output signals corresponding to the displacement and/or deformation of the actuator element, and generating and providing an output signal from a processing element, based on the displacement and/or deformation, to an electronic computing system.

In another aspect, the present invention relates to an electronic computing system including a magnetically sensed user interface device, such as the user interface devices described above and/or subsequently herein. The electronic computing system may be a component of, for example, a computer system, a video gaming system, a camera control device, a buried utility locator device, or another electronic computing device or system.

In another aspect, the disclosure relates to a magnetic sensing user interface device (UID). The UID may include, for example, a floating actuator assembly including three magnets. The three magnets may be positioned in a substantially fixed, non-deformable magnet array relative to each other. The floating actuator assembly may be integral with or may be coupled to a floating actuator element. The UID may further include a base assembly. The base assembly may be in a fixed position relative to the floating actuator assembly and floating actuator element. The UID may further include a printed circuit board disposed on or within a base assembly, the printed circuit board including three three-axis magnetic sensors configured to sense magnetic fields generated by the plurality of magnets in three orthogonal directions. The circuit board may be integral with or coupled to the base assembly. The UID may further include a flexible coupling assembly. The flexible coupling assembly may include a plurality of coil springs oriented perpendicular to longitudinal axis through the base assembly. The flexible coupling assembly may be configured to floatably couple the floating actuator assembly to the base assembly. The UID may further include a cover or boot. The boot may be configured as a dampening element disposed about the floating actuator assembly and the base assembly to dampen movement of the floating actuator assembly relative to the base assembly.

In another aspect the disclosure relates to a magnetic sensing user interface device (UID). The UID may include, for example, a floating actuator assembly including three fixed magnets. The three fixed magnets may be positioned in a fixed, non-deformable array relative to each other. The floating actuator assembly may be integral with or may be coupled to a floating actuator element. The UID may further include a deformable actuator assembly coupled to the floating actuator assembly. The deformable actuator assembly may include three deformably positioned magnets. The deformable actuator assembly may be integral with or may be coupled to a deformable actuator element. The deformably positioned magnets may be disposed in a movable array relative to each other. The UID may further include a base assembly. The base assembly may include one or more circuit boards for mounting a first set of three three-axis magnetic sensors configured to sense magnetic fields generated corresponding to ones of the three fixed magnets in three orthogonal directions, and a second set of three multi-axis magnetic sensors configured to sense magnetic fields generated by ones of the deformably positioned magnets in three orthogonal directions. The UID may further include a flexible coupling assembly. The flexible coupling assembly may include a plurality of coil springs. The plurality of coil springs may be oriented substantially perpendicular to a longitudinal axis through the base assembly. The flexible coupling assembly may be configured to floatably couple the deformable actuator assembly to the base assembly. The UID may further include a boot dampening element. The boot may be disposed about the floating actuator assembly and the base assembly to dampen movement of the floating actuator assembly and/or deformable actuator assembly relative to the base assembly.

In another aspect, the present invention relates to apparatus and methods for manufacturing magnetically sensed user interface devices such as the devices described above, such as through use of inductive or other thermal forming or bonding.

In another aspect, the present invention relates to a non-transitory computer-readable medium including instructions for causing a processor or computer to implement methods in a magnetically sensed user interface device such as the devices described above.

Various additional aspects, features, and functions are described below in conjunction with the appended Drawings.

BRIEF DESCRIPTION OF THE DRAWINGS

The present application may be more fully appreciated in connection with the following detailed description taken in conjunction with the accompanying drawings, wherein:

FIGS. 61-64 illustrate details of motion associated with the embodiment of FIG. 60;

DETAILED DESCRIPTION

Overview

Figure 1:
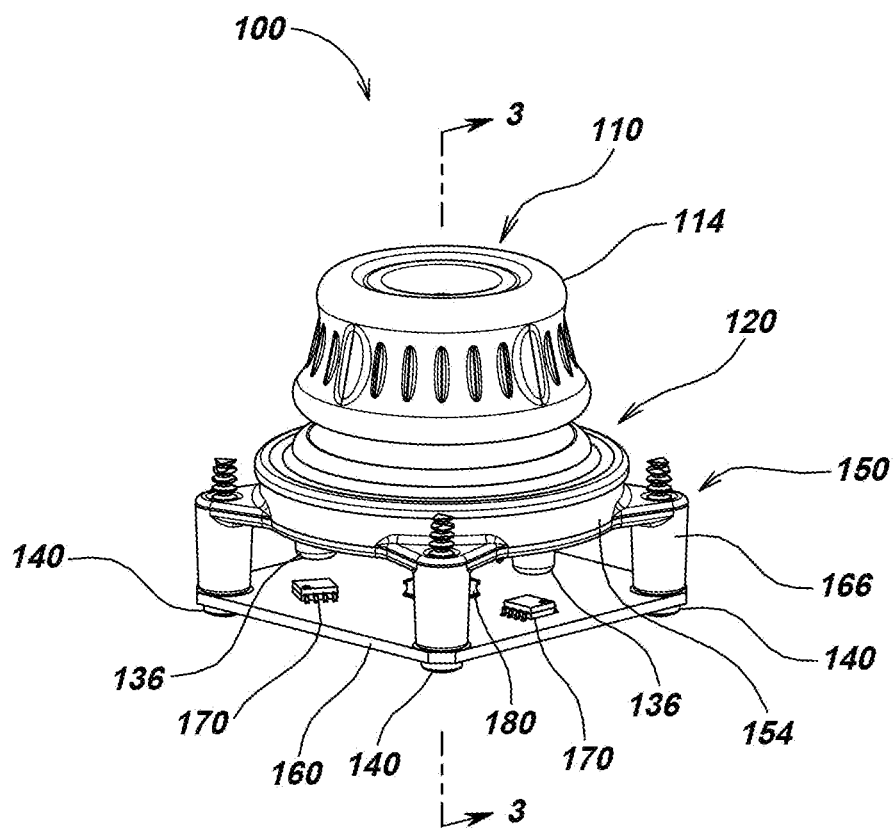
FIG. 1 is an isometric view of details of an embodiment of a knob-actuator user interface device.

The present invention relates generally to user interface devices (also denoted herein as "UIDs") as well as methods for making and using such devices. Various embodiments of the present invention may provide improved magnetically sensed user interface devices, which may be based on displacement and/or deformation sensing, such as by using magnets and multi-axis magnetic sensors. As used herein, magnetically sensed user interface devices may also be denoted as magnetic UIDs, magnetically sensed UIDs, or for brevity, as just user interface devices or UIDs.

Additional details of various aspects of apparatus, devices, configurations, and methods that may be used in conjunction with the UID embodiments in accordance with this disclosure are described in U.S. Utility patent application Ser. No. 13/110,910, filed May 18, 2011, entitled USER INTERFACE DEVICES, APPARATUS, & METHODS, U.S. Utility patent application Ser. No. 13/214,209, filed Aug. 21, 2011, entitled MAGNETIC SENSING USER INTERFACE DEVICE METHODS AND APPARATUS, U.S. Utility patent application Ser. No. 13/272,172, filed Oct. 12, 2011, entitled MAGNETIC THUMBSTICK USER INTERFACE DEVICES, and U.S. Utility patent application Ser. No. 13/292,038, filed Nov. 8, 2011, entitled SLIM PROFILE MAGNETIC USER INTERFACE DEVICES. The content of each of these applications is hereby incorporated by reference herein in its entirety for all purposes. These applications may be denoted collectively herein as the "Related Applications."

In one aspect, the disclosure relates to floating and deformable actuator elements and coupled actuator assemblies for facilitating user interaction, through the actuator, with other elements, components, devices, and/or systems. Dampening and/or restoration elements of the user interface device may be configured to provide restorative forces in response to user manipulation of the actuator elements. In one implementation, the actuator elements may exhibit resistance to manipulation and may return to a neutral or released state position with the use of springs to provide improvements over existing UIDs.

A flexible membrane or other compressed mechanical elements may also be used in place of or in addition to springs in some embodiments to generate a restorative force.

The magnetic user interface devices may use magnets and magnetic field measurements to provide output control data, which may be provided to other elements of a device, apparatus, and/or system incorporating the user interface device, such as a camera system, buried utility locator system, computer system coupled to the interface device, control system, remotely operated system, and/or other systems or devices configured to interface with a user interface device. In addition to providing output signals, in some embodiments magnetic UIDs may also provide tactile feedback to a user through a haptic element such as a vibrator motor or other feedback element.

In one embodiment, a user interface device may include an actuator element, a displacement element coupled to the actuator element to provide an indication of displacement of the actuator element from a released state position, and a sensing element positioned in proximity to the displacement element, where the sensing element is configured for generating one or more displacement signals representative of a displacement of the actuator element from the released state position in one or more dimensions.

The actuator element may be, for example, a knob-actuator element. The displacement element may include a plurality of magnets configured to provide the indication of displacement to the sensing element. The sensing element may include a plurality of magnetic sensors mounted in proximity to a corresponding plurality of the magnets, wherein the plurality of magnetic sensors may be configured to generate the displacement signal. The device may further include a plurality of springs coupled to the actuator element for biasing the actuator element to the released state position. The displacement may be a rotational displacement and/or a translational displacement.

The user interface device may further include, for example, an electronic circuit element, wherein the sensors may be electrically coupled to the electronic circuit element so as to provide the one or more displacement signals. The circuit element may include a printed circuit board (PCB) further including a processing element and/or a memory element coupled to the sensors, and/or additional electrical, electronic, and/or mechanical components or elements. The device may further include a switch element mechanically coupled to the actuator element and electrically coupled to the PCB. The switch element may be configured for actuation responsive to user input at the user interface so as to provide an actuation signal. The switch element may be a mechanical dome switch.

The magnets may be, for example, ferromagnets. The magnets may be positioned so that the north pole and south pole of each magnet are pointing in the same direction. The magnets may be positioned so that the north pole and south pole of each magnet are pointing in different directions. The magnetic sensors may be Hall-Effect sensors or other magnetic sensors. The device may further include a dampening element coupled to the actuator element or other elements of the UID so as to dampen oscillation of the actuator upon user release.

In another embodiment, a user interface device may include an actuator element and an actuator core element coupled to the actuator element for movement therewith.

The actuator core element may include, for example, a central core section and a plurality of arms that extend radially from the central core section. A support may surround the central core section of the actuator core and support the knob-actuator for displacement from a released state position. A plurality of springs may extend in a radial configuration between the actuator core and the support for biasing the knob-actuator to the released state position. A plurality of magnets may be mounted in corresponding ones of the arms. A plurality of magnetic sensors may each be mounted adjacent to a corresponding one of the magnets for generating signals representative of the displacement of the knob-actuator.

In another embodiment, a user interface device may include, for example, a knob-actuator element, an actuator core element coupled to the knob-actuator element so as to allow movement therewith, a support element coupled to the actuator core to support the knob-actuator for displacement from a released state position, a plurality of springs coupled to the actuator core for mechanically biasing the knob-actuator to the released state position, a plurality of magnets coupled to the actuator core, and a plurality of magnetic sensors mounted in proximity to a corresponding one of the magnets, wherein said plurality of magnetic sensors are configured for generating signals, responsive to movement of the magnets, representative of the displacement of the knob-actuator from the released state position in one or more dimensions.

The knob-actuator element may include, for example, a handgrip section substantially cylindrical in shape. The handgrip section may include a concave top. The device may further include a dampener element coupled to the knob-actuator element and the support element so as to dampen oscillation of the plurality of springs. The dampener element may include an elastomeric dampener. The actuator core element may be mounted centrally below the dampener. The dampener element may include a foam material.

The device may further include, for example, an electronic circuit element, wherein the magnetic sensors may be electrically coupled to the magnetic sensors. The circuit element may include a printed circuit board (PCB) and may further include a processing element and/or a memory element coupled to the sensors, and/or additional electrical, electronic, and/or mechanical components or elements. The device may further include a switch element. The switch element may be mechanically coupled to the knob-actuator element and electrically coupled to the PCB. The switch element may be configured for actuation responsive to user input at the knob-actuator element. The switch element may include a mechanical dome switch.

The actuator core may include, for example, a central core section and a plurality of arms extending radially from the central core section. The support element may at least partially surround the central core section so as to support the knob-actuator element for displacement from the released state position.

In another embodiment, a user interface device may include, for example, a deformable actuator element, a deformation element coupled to the deformable actuator element to provide an indication of deformation of the deformable actuator element from a non-deformed position, a displacement element coupled to the deformable actuator element to provide an indication of displacement of the deformable actuator element from a released state position, and a sensing element positioned in proximity to the deformation element and displacement element, where the sensing element may be configured for generating a first signal representative of a displacement of the deformable actuator element from the released state position in one or more dimensions, and a second signal representative of a deformation caused by a squeezing force applied to the deformable actuator.

The user interface device may further include, for example, a core join element coupled to the deformable actuator element to secure the deformable actuator element during displacement of the actuator element from the released state position. The deformation element may include a plurality of small magnets configured to provide the indication of deformation to the sensing element. The displacement element may include a plurality of magnets configured to provide the indication of displacement to the sensing element. The sensing element may include a first plurality of magnetic sensors mounted in proximity to a corresponding plurality of magnets and a second plurality of magnetic sensors mounted in proximity to a corresponding plurality of small magnets, wherein said first plurality of magnetic sensors and said second plurality of magnetic sensors are configured for generating the first and second signals, respectively.

The user interface device may further include, for example, a plurality of springs configured to mechanically bias the deformable actuator element to the released state position. The deformable actuator element may be configured in a substantially spherical shape. The deformable actuator element may include a top actuator half and a bottom actuator half, wherein said top actuator half is substantially dome shaped. The deformable actuator element may include a rubber over-mold shaped so as to provide a grip surface to facilitate squeezing and/or displacement. The displacements may be, for example, rotational displacements. Alternately, or in addition, the displacement may be translation displacements and/or other positional displacements.

The user interface device may further include, for example, one or more cushioning elements configured to cushion one or more components of the user interface device from scraping during displacements from the released state position. The user device may further include a ring join element coupled to the core join element so as to limit movement of the deformable actuator element during displacement from the released state position. The user device may further include an electronic circuit element, wherein the magnetic sensors are electrically coupled to the electronic circuit element so as to provide the first and/or second signals. The electronic circuit element may include a printed circuit board (PCB) including a processing element and/or a memory element and/or other electrical, electronic, optical, and/or mechanical elements. The user device may further include a PCB mounting platform positioned below the PCB and coupled to the deformable actuator element. The user device may further include a switch element mechanically coupled to the deformable actuator element and electrically coupled to the PCB. The switch element may be configured for actuation responsive to user input at the user interface.

The magnets and/or the small magnets may be, for example, ferromagnets. The magnets and/or small magnets may be positioned so that the north pole and south pole of each type of magnet are pointing in the same direction or are pointing in different directions. The magnetic sensors may be, for example, Hall-Effect sensors.

In another embodiment, a method for providing an output signal from a user interface device may include, for example, receiving, at an actuator element, a user action including a displacement and/or a deformation of the actuator element, generating, at a plurality of sensors, one or more displacement signals corresponding to the position, displacement, and/or deformation of the actuator element, and providing a UID output signal based on the one or more signals corresponding to the position, displacement and/or deformation of the actuator element.

The method may further include, for example, biasing the actuator element to a released state position prior to receiving the user action, and restoring the actuator element to the released state position subsequent to receiving the user action. The biasing and/or restoring may be mechanically performed, such as by using one or more springs or spring-like elements. The actuator element may be a knob-actuator element. The actuator element may be a floating actuator element. The actuator element may be a deformable actuator element. The actuator element may be combinations of knob, floating, and/or deformable actuator elements.

The method may further include, for example, generating, at a second plurality of magnetic sensors, one or more deformation signals corresponding to a deformation of the deformable actuator element corresponding to the user action, and providing the output signal based on the one or more deformation signals.

The sensors may be, for example, magnetic sensors. The magnetic sensors may be Hall-Effect sensors. The biasing and/or restoring may be performed by a plurality of spring elements coupled to the actuator element. The plurality of sensors may be a plurality of magnetic sensors, and the plurality of magnetic sensors may be positioned in proximity to a plurality of magnets so as to sense a displacement of the magnets in response to displacement of the actuator element. The plurality of sensors may include a first sub-plurality of magnetic sensors that may be positioned in proximity to a plurality of magnets, and a second sub-plurality of magnetic sensors that may be positioned in proximity to a plurality of small magnets so as to sense a displacement of the magnets and small magnets in response to displacement of the actuator element.

In another aspect, the disclosure relates to a magnetic sensing user interface device (UID). The UID may include, for example, a floating actuator assembly including a plurality of magnets. The plurality of magnets may be positioned in a substantially fixed, non-deformable array structure relative to each other. The array structure may be integral with or may be coupled to an actuator element. The actuator element may be a floating actuator element. The UID may further include a base assembly including a plurality of multi-axis magnetic sensors configured to sense magnetic fields generated by the plurality of magnets. The base assembly may be fixed relative to the magnets and the actuator element. The UID may further include a flexible coupling assembly. The coupling assembly may be configured to floatably couple the floating actuator assembly to the base assembly.

Ones of the plurality of magnets may, for example, be paired with corresponding ones of the plurality of multi-axis magnetic sensors. The plurality of magnets may be permanent magnets and/or electromagnets. The plurality of magnets may be three magnets, and the plurality of magnetic sensors may include three corresponding multi-axis magnetic sensors. The three magnets and three magnetic sensors may be arranged in a substantially equilateral triangular configuration. Alternately, the plurality of magnets may be two magnets or four or more magnets, and the plurality of magnetic sensors may be two magnetic sensors or four or more magnetic sensors.

Each of the plurality of magnetic sensors may, for example, be configured to sense a magnetic field generated by a corresponding magnet of the plurality of magnets in three orthogonal directions and provide a sensor output signal based on the sensed magnetic field. The sensor output signal may be provided to a processing element. The processing element may generate a UID output signal usable by an electronic computing system. The UID output signal may include information regarding a position of the magnets and/or the actuator element relative to the base assembly.

The flexible coupling assembly may include, for example, a spring assembly. The spring assembly may include a plurality of coil springs. The plurality of coil springs may be coupled to the base assembly. The plurality of coil springs may be disposed in a plane substantially perpendicular to a longitudinal axis of the floating actuator assembly. The plurality of coil springs may be metallic springs. The plurality of springs may be plastic springs or springs made of other flexible materials. The springs may be configured to provide a restorative action to the actuator assembly subsequent to user interaction with the UID.

The springs may, for example, be metallic springs, and the metallic springs may be thermally bonded to the base assembly and/or the floating actuator assembly, and/or to other actuator assemblies such as a deformable actuator assembly. One or both ends of the metallic springs may be thermally formed into the base assembly and/or to the floating actuator assembly and/or to the deformable actuator assembly. The springs may be thermally formed using an inductive heating process. Alternately, or in addition, the springs may be thermally formed using an injection molding and/or a hot melt process. Alternately, or in addition, the springs may be thermally formed using another thermal bonding process. Alternately, or in addition, the springs may be bonded to the base assembly and/or the floating actuator assembly, and/or the deformable actuator assembly using mechanical connectors. Alternately, or in addition, the springs may be bonded to the integral base assembly, and/or the floating actuator assembly, and/or the deformable actuator assembly using an adhesive.

The UID may further include, for example, a deformable actuator assembly. The deformable actuator assembly may include a second plurality of magnets. The second plurality of magnets may be configured in a movable array structure relative to each other. The second plurality of magnets may be coupled to or disposed in a deformable actuator element. The UID may further include a second base assembly. The second base assembly may include a second plurality of multi-axis magnetic sensors. The second plurality of multi-axis magnetic sensors may be configured to sense magnetic fields generated by the second plurality of magnets. The first base assembly and the second base assembly may be integral or may be combined to form an integral base assembly. The magnetic sensors may be disposed on opposite sides of the integral base assembly.

The floating actuator assembly and the deformable actuator assembly may, for example, be coupled or combined to form an integral actuator assembly. The floating actuator element and the deformable actuator element may be coupled or combined to form an integral actuator element. The floating actuator element may be configured in a spherical or dome shape and the deformable actuator element may be configured in a cylindrical or partially conical shape.

The flexible coupling assembly may include, for example, a spring assembly. The spring assembly may be configured to floatable couple the integral actuator assembly to the integral base assembly. The spring assembly may include a plurality of coil springs. The plurality of coil springs may be disposed in a plane substantially perpendicular to a longitudinal axis of the integral actuator assembly. The springs may, for example, be metallic springs, and the metallic springs may be thermally bonded to the base assembly and/or the deformable actuator assembly. One or both ends of the metallic springs may be thermally formed into the base assembly and/or to the deformable actuator assembly. The springs may be thermally formed using an inductive heating process. Alternately, or in addition, the springs may be thermally formed using an injection molding and/or a hot melt process. Alternately, or in addition, the springs may be thermally formed using another thermal bonding process. Alternately, or in addition, the springs may be bonded to the integral base assembly and/or the deformable actuator assembly using mechanical connectors. Alternately, or in addition, the springs may be bonded to the integral base assembly and/or the deformable actuator assembly using an adhesive.

The UID may further include, for example, one or more dampening elements. The dampening elements may be configured to dampen a motion of the floating actuator assembly relative to the base assembly. The dampening element may be a boot disposed about the floating actuator assembly and the base assembly. The boot may include a longitudinal flexing section. The boot may further include a rotational flexing section. The dampening element may be an alternate or additional element to a boot element.

The UID may further include, for example, a haptic feedback element. The haptic feedback may be a vibrator motor or other vibrational device. The haptic feedback element may be disposed in or coupled to the floating actuator assembly. The haptic feedback element may be disposed in or coupled to the floating actuator element or the deformable actuator element.

The UID may further include, for example, a housing, mounting base, or mounting base element for coupling to the base assembly and/or the boot. The mounting base may be configured to position the floating and/or deformable actuator assemblies in a substantially vertical orientation relative to a mounting surface. Alternately, the mounting base may be configured to position the floating and/or deformable actuator assemblies in a substantially horizontal orientation relative to a mounting surface. Alternately, the mounting base may be configured to position the floating and/or deformable actuator assemblies at an offset from a horizontal orientation relative to a mounting surface of between approximately five degrees and approximately 30 degrees. Alternately, the mounting base may be configured to position the floating and/or deformable actuator assemblies at an adjustable orientation relative to a mounting surface.

The UID may further include, for example, a processing element. The processing element may be electrically coupled to the plurality of multi-axis magnetic sensors to receive magnetic sensor output signals from ones of the magnetic sensors and generate, based on the magnetic sensor output signals, a UID output signal corresponding to a position or movement of the floating actuator assembly and/or the deformable actuator assembly relative to the base assembly. The processing element may be electrically coupled to the second plurality of multi-axis magnetic sensors to receive second magnetic sensor output signals from ones of the magnetic sensors and generate, based on the second magnetic sensor output signals, a second UID output signal corresponding to a deformation of the deformable actuator assembly. The second UID output signal includes vector deformation information associated with a magnitude and a direction of the deformation.

In another aspect, the disclosure relates to a magnetic sensing user interface device (UID). The UID may include, for example, a floating actuator assembly including three magnets. The three magnets may be positioned in a substantially fixed, non-deformable magnet array relative to each other. The floating actuator assembly may be integral with or may be coupled to a floating actuator element. The UID may further include a base assembly. The base assembly may be in a fixed position relative to the floating actuator assembly and floating actuator element. The UID may further include a printed circuit board including three three-axis magnetic sensors configured to sense magnetic fields generated by the plurality of magnets in three orthogonal directions. The circuit board may be integral with or coupled to the base assembly. The UID may further include a flexible coupling assembly. The flexible coupling assembly may include a plurality of coil springs oriented perpendicular to longitudinal axis through the base assembly. The flexible coupling assembly may be configured to floatably couple the floating actuator assembly to the base assembly. The UID may further include a cover or boot. The boot may be configured as a dampening element disposed about the floating actuator assembly and the base assembly to dampen movement of the floating actuator assembly relative to the base assembly.

The UID may further include, for example, a housing or mounting base element. The housing may be configured to position the floating actuator assembly in a substantially vertical orientation relative to a mounting surface. Alternately, the housing may be configured to position the floating actuator assembly in a substantially horizontal orientation relative to a mounting surface. Alternately, the mounting base may be configured to position the floating actuator assembly at an offset from a horizontal orientation relative to a mounting surface of between approximately five degrees and approximately 30 degrees. Alternately, the mounting base may be configured to position the floating actuator assembly in an adjustable position relative to a mounting surface.

In another aspect the disclosure relates to a magnetic sensing user interface device (UID). The UID may include, for example, a floating actuator assembly including three fixed magnets. The three fixed magnets may be positioned in a fixed, non-deformable array relative to each other. The floating actuator assembly may be integral with or may be coupled to a floating actuator element. The UID may further include a deformable actuator assembly coupled to the floating actuator assembly. The deformable actuator assembly may include three deformably positioned magnets. The deformable actuator assembly may be integral with or may be coupled to a deformable actuator element. The deformably positioned magnets may be disposed in a movable array relative to each other. The UID may further include a base assembly. The base assembly may include one or more circuit boards for mounting a first set of three three-axis magnetic sensors configured to sense magnetic fields generated corresponding to ones of the three fixed magnets in three orthogonal directions, and a second set of three multi-axis magnetic sensors configured to sense magnetic fields generated by ones of the deformably positioned magnets in three orthogonal directions. The UID may further include a flexible coupling assembly. The flexible coupling assembly may include a plurality of coil springs. The plurality of coil springs may be oriented substantially perpendicular to a longitudinal axis through the base assembly. The flexible coupling assembly may be configured to floatably couple the deformable actuator assembly to the base assembly. The UID may further include a boot dampening element. The boot may be disposed about the floating actuator assembly and the base assembly to dampen movement of the floating actuator assembly and/or deformable actuator assembly relative to the base assembly.

The UID may further include, for example, a housing or mounting base element. The housing may be configured to position the floating actuator assembly and/or the deformable actuator assembly in a substantially vertical orientation relative to a mounting surface. Alternately, the housing may be configured to position the floating actuator assembly and/or the deformable actuator assembly in a substantially horizontal orientation relative to a mounting surface. Alternately, the mounting base may be configured to position the floating actuator assembly and/or the deformable actuator assembly at an offset from a horizontal orientation relative to a mounting surface of between approximately five degrees and approximately 30 degrees. Alternately, the mounting base may be configured to position the floating actuator assembly and/or the deformable actuator assembly in an adjustable position relative to a mounting surface.

In some embodiments, electromagnets may be used in place of or in additional to permanent magnets. Electromagnets may be formed in a cross-shaped configuration to include two orthogonal dipoles. In some embodiments, a single cross-configured electromagnet and a single three-axis high sensitivity magnetic sensor may be used to provide a highly compact magnetic UID. The two dipoles may be selectively switched to generate a magnetic field for sensing in an electromagnet embodiment.

Terminology

As used herein the term "permanent magnet" refers to any object that is magnetized and creates its own persistent magnetic field. Suitable ferromagnetic materials for a permanent magnet include iron, nickel, cobalt, rare earth metals and their alloys, e.g. Alnico and Neodymium. Permanent magnets can also be made of powderized ferromagnetic material held together with an organic binder or by other materials known or developed in the art.

Electromagnets refer to magnets that may generate magnetic fields from an associated driving current. Electromagnets may comprise suitable materials, such as chip inductors or other components, along with a coil or other element for carrying current to generate magnetic fields. Electromagnets may be configured in pairs, such as in cross-shaped configuration, to generate magnetic fields that may be sensed in any direction.

The term "released state" as used herein describes a state in which no operator-initiated forces are acting upon a magnetically-sensed actuator besides those which are inherently an aspect of the structure of the device or system itself and/or are naturally occurring, such as gravity or other naturally occurring or environmentally occurring forces.

The term "electronic computing system" as used herein refers to any system that may be controlled by a user interface device such as the magnetically sensed UID embodiments described herein. Examples of an electronic computing system include, but are not limited to: personal computers, notebook computers, video game systems, robotic devices, tablet devices, graphical art systems such as computer aided design systems, monitoring and control systems, remote systems, instrumentation or control systems, and/or other similar or equivalent computer or processor-based systems or devices.

The terms "displace" and "displacement," when used herein in reference to user interface device elements such as actuators and magnets, refer to various manual movements thereof from a neutral or released state position relative to one or more fixed magnetic sensors, including, but not limited to, lateral movements along the X and Y axes, vertical movements along the Z axis, tilting, rotation, and permutations and combinations thereof. The same definition refers to movements of magnetic sensors in a converse or reversed arrangement where the magnetic sensors are coupled to an actuator and move adjacent to fixed corresponding magnets or electromagnets or other similar or equivalent elements.

As used herein, the term "sense," and "sensing," in conjunction with sensors or sensing elements, refers to detecting and measuring parameters such as magnetic field magnitudes and/or directions and providing a corresponding analog or digital output signal. In some embodiments, additional sensors may be included to sense other parameters such as temperature, pressure, switching actions, accelerations, and/or other physical, electrical, chemical, or optical parameters.

The word "exemplary" is used herein to mean "serving as an example, instance, or illustration." Any aspect and/or embodiment described herein as "exemplary" is not necessarily to be construed as preferred or advantageous over other aspects and/or embodiments.

Magnetic Sensing of Actuator Movements and Displacements

As noted previously, in various aspects, the present disclosure relates to apparatus, devices, and systems for magnetically sensing user interactions with a user interface device (UID). The sensing is typically done in a configuration where one or more actuator assemblies including one or more magnets, which may include or be coupled with corresponding actuator elements (for receiving user interactions), are displaced or deformed relative to one or more fixed magnetic sensors as a result of the user interactions. Details of exemplary apparatus and methods for performing such magnetic sensing in magnetically sensed UIDs are further described below.

Figure 59:
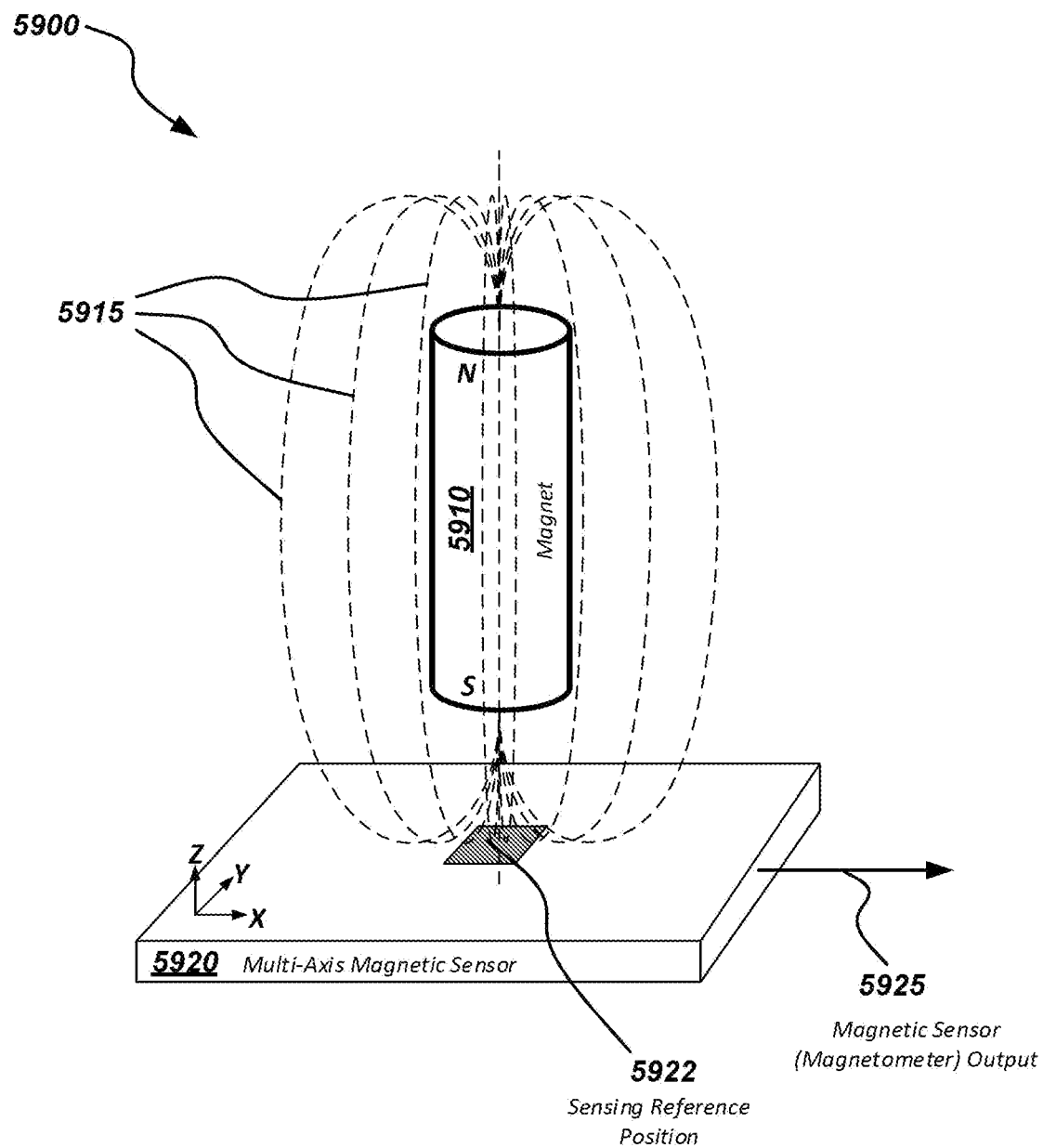
FIG. 59 illustrates details of a magnetic sensing apparatus embodiment using a magnet and a multi-axis magnetic sensor.

For example, FIG. 59 illustrates certain details of a magnetic sensing apparatus 5900 for use in a UID, the assembly including a magnet 5910 and an associated multi-axis magnet sensor 5920. Magnet 5910 may be a permanent magnet that generates a dipole magnetic field as illustrated by magnetic field lines 5915, which may be sensed by multi-axis magnetic sensor 5920. In a typical embodiment, magnetic sensor 5920 is an integrated circuit sensor device capable of sensing magnetic fields in three directions (e.g., X, Y, and Z directions as shown in FIG. 59). Sensor 5920 may have a reference sensing position 5922, such as a point or small area or volume on or within an integrated circuit device, where the multi-directional magnetic fields generated by magnet 5910 are spatially sensed. In some embodiments, an electromagnet may be used in addition to or in place of the permanent magnet as shown. In addition, a permanent magnet array, such as a pair of permanent magnets in a cross-shaped configuration, may also be used to generate magnetic fields for sensing in three directions.

Magnetic sensor 5920 includes an analog or digital sensor output for providing a magnetic sensor output signal 5925, which may then be provided to analog or digital signal conditioning or signal processing circuits, with corresponding outputs then provided to a processing element for use in determining position, motion, displacement or deformation information related to user movements of the actuator element. In some implementations, the magnetic sensor may be integral with the signal conditioning circuit, signal processing circuits, and/or processing element, whereas in other implementations separate discrete components may be used.

In the exemplary embodiment shown, magnet 5910 is a permanent magnet in a cylindrically-shaped configuration; however, in other embodiments, magnets of different shapes and/or sizes may be used. In an exemplary embodiment, the magnet may be in a standalone configuration, without additional magnetic field shaping elements; however, in some embodiments, magnetic field shaping elements, such as pole pieces, may be used to shape the magnetic field generated by the magnet to control the sensor response or output, isolate magnetic fields, etc.

Figure 60:
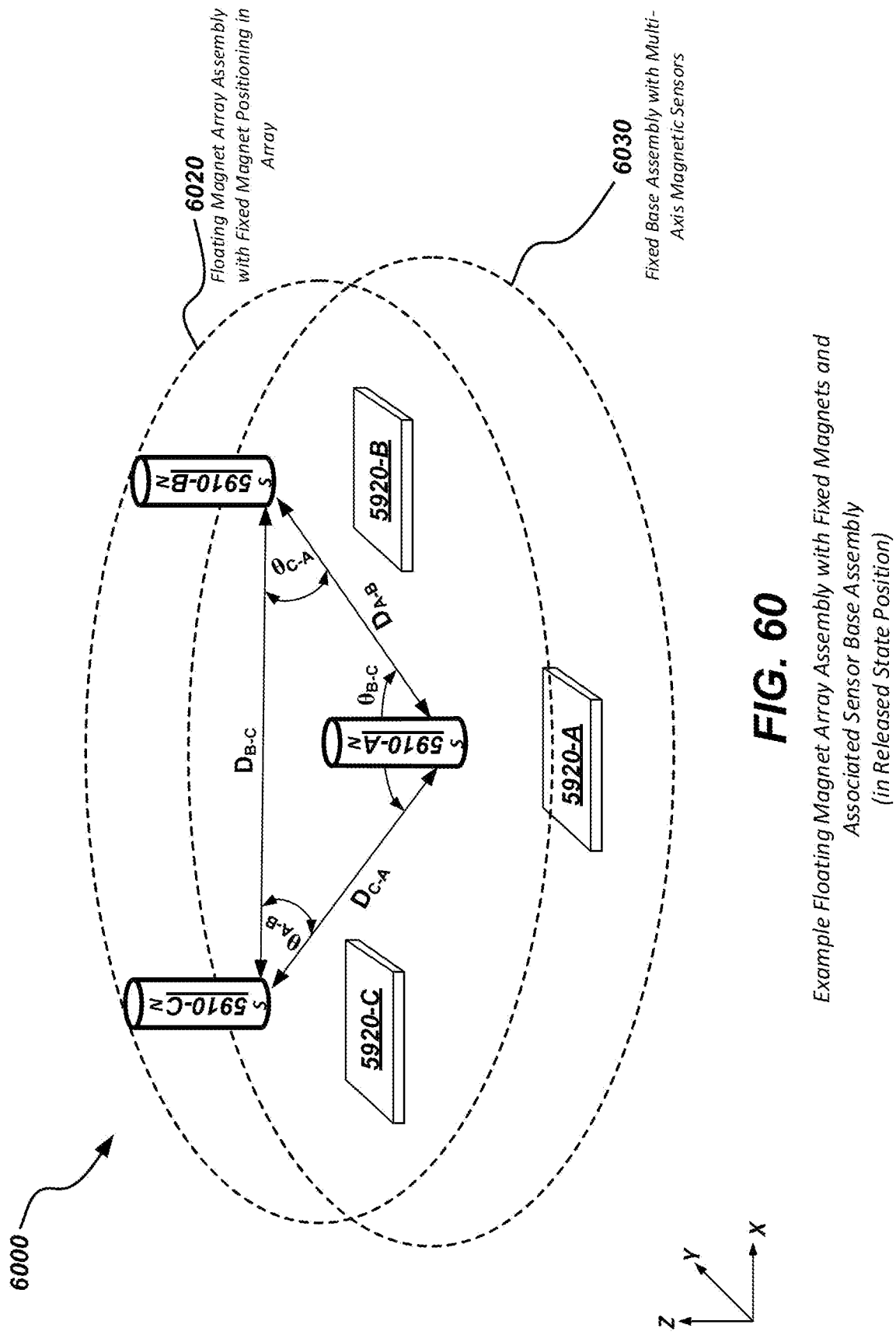
FIG. 60 illustrates details of a floating magnetic array assembly embodiment and a corresponding base assembly.

Turning to FIG. 60, certain details of an embodiment of a magnetic sensing apparatus 6000 for use in a magnetically sensed UID are illustrated. Sensing apparatus 6000 may use multiple magnets and sensing elements as shown in the configuration of FIG. 59. For example, apparatus 6000 may include a floating magnet array assembly or sub-assembly 6020 with fixed magnetic positioning (also denoted for brevity as a floating array assembly or floating array) and a corresponding base assembly 6010 with multi-axis magnetic sensors, which is fixed in position, whereas the floating array may be moved relative to the fixed base assembly through operator interactions. The floating magnet array assembly may be mounted to or coupled to additional elements, such as structural or support elements, to form a floating actuator assembly. Apparatus 6000 may be used in various embodiments of magnetically sensed user interface devices to provide sensing of movements applied by a user to an associated floating actuator assembly and coupled floating actuator element, such as displacement and rotational movements applied by a user.

Magnet array assembly 6020 may include a plurality of magnets, which may each be magnets such as magnets 5910 as shown in FIG. 59, along with corresponding multi-axis magnetic sensors, which may each be magnetic sensors 5920 as shown in FIG. 59. Magnet array assembly 6020 may further include mechanical, mounting, and/or structural elements (not shown in FIG. 60), such as molded plastic or rubber mounting elements, electronic circuit elements, mechanical coupling elements or structures to allow coupling of the floating array assembly 6020 to other elements, such as a deformable magnet array assembly with movable magnets (e.g., as described subsequently with respect to FIG. 65) and/or elements, for flexibly coupling the floating array 6020 to a sensor base assembly, such as fixed base assembly 6010.

The magnets in floating array assembly 6020 are configured to be substantially fixed and rigid in position relative to each other in both a released state and during a movement or deformation action, where they move in sync or in tandem. As a result, the various dimensions $D_{A-B}$, $D_{B-C}$, and $D_{C-A}$, as well as the angles $\theta_{A-B}$, $\theta_{B-C}$, and $\theta_{C-A}$, are substantially fixed relative to each other during user movements of a floating actuator element to which floating array assembly 6020 is coupled.

As shown in FIG. 60, fixed base assembly 6010 includes three multi-axis magnetic sensors 5920-A, 5920-B, and 5920-C, which are configured to sense the magnetic fields generated by associated magnets 5910-A, 5910-B, and 5910-C, such as is shown in FIG. 59. Fixed base assembly 6010 typically includes additional elements (not shown), such as one or more printed circuit boards, mechanical or structural elements, such as molded plastic or rubber elements, wiring, connectors, and/or cable elements, such as flex-connectors, and other components and structures, such as mounting bosses, screws, and the like. In an exemplary embodiment, sensors 5920 are mounted on a printed circuit board (such as described subsequently with respect to FIG.

74), which is then formed in or attached to a mechanical support element of the base assembly. In operation, as a user interacts with the floating actuator element (not shown) (and coupled floating magnet array assembly 6020) by displacing or rotating the actuator (e.g., up-down, left-right, rotational movements, etc.), the sensors 5920 sense magnetic fields associated with corresponding magnets 5910 to generate sensor output signals for use by a processing element to determine movements of the floating actuator element.

FIGS. 61-64 illustrate various movements of the floating array assembly 6020 with respect to the fixed base assembly 6010 in response to user actuation of a floating actuator element (not shown) coupled to the floating array assembly. For example, in movement 6100 as shown in FIG. 61, the array assembly 6020 is displaced downward about the Y-axis (i.e., displaced downward on the right side as shown), resulting in changes in measured magnetic field magnitudes and directions relative to a released state position (e.g., such as the positioning shown in FIG. 60). The processing element can receive output signals from the magnetic sensors corresponding to the sensed magnetic fields, and process the output signals to generate information associated with movements of the floating actuator, which may be provided to an electronic computing device or system. The movement shown in FIG. 61 may, for example, correspond with a right-side push applied to the floating actuator element by a user, and may result in generation of a corresponding UID output command by a coupled processing element.

FIG. 62 illustrates a rotational movement 6200 about the Z-axis or longitudinal axis. This rotation may be similarly sensed by processing outputs from sensors 5920 corresponding to rotation of the floating array assembly 6020 and magnets 5910 relative to fixed base 6010 and sensors 5920. This motion may correspond, for example, with a "twisting" action applied to the floating actuator by a user, and may result in generation of a corresponding UID output command by a coupled processing element.

Figure 63:
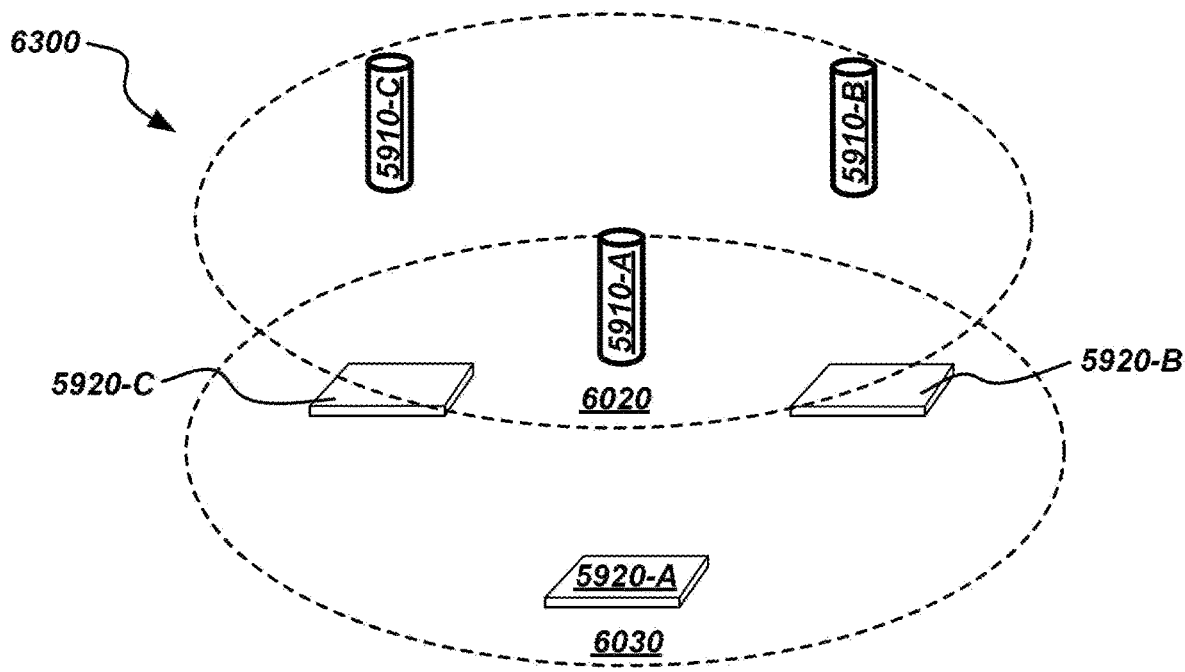
Figure 64:
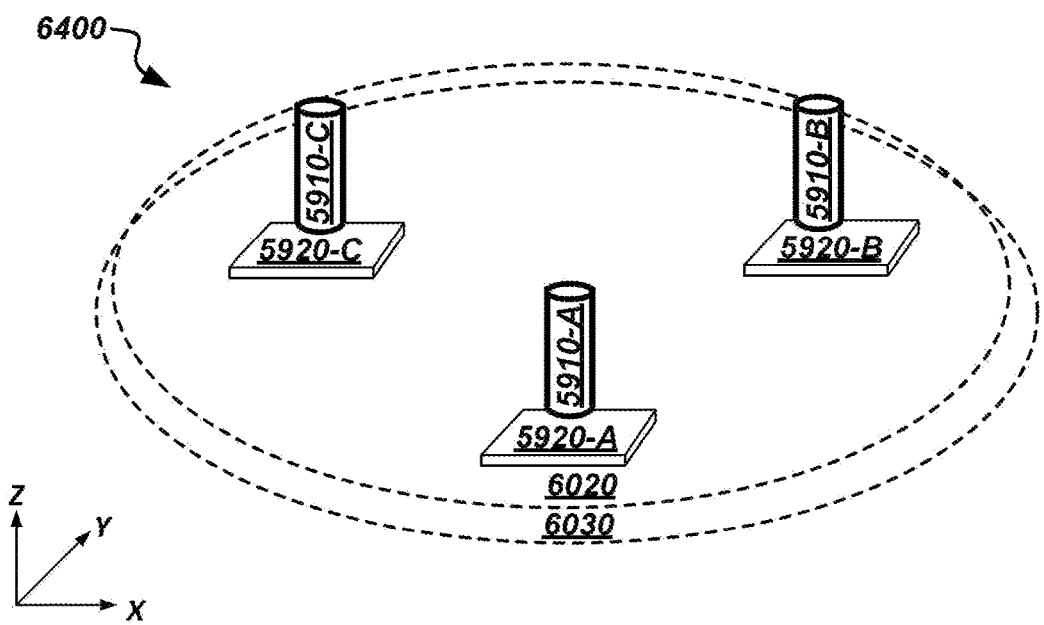

FIGS. 63 and 64 illustrate elevation 6300 and depression 6400 actions, respectively, which may be similarly sensed. These motions may correspond with a user raising or lowering the floating actuator element (relative to the fixed base assembly).

Figure 65:
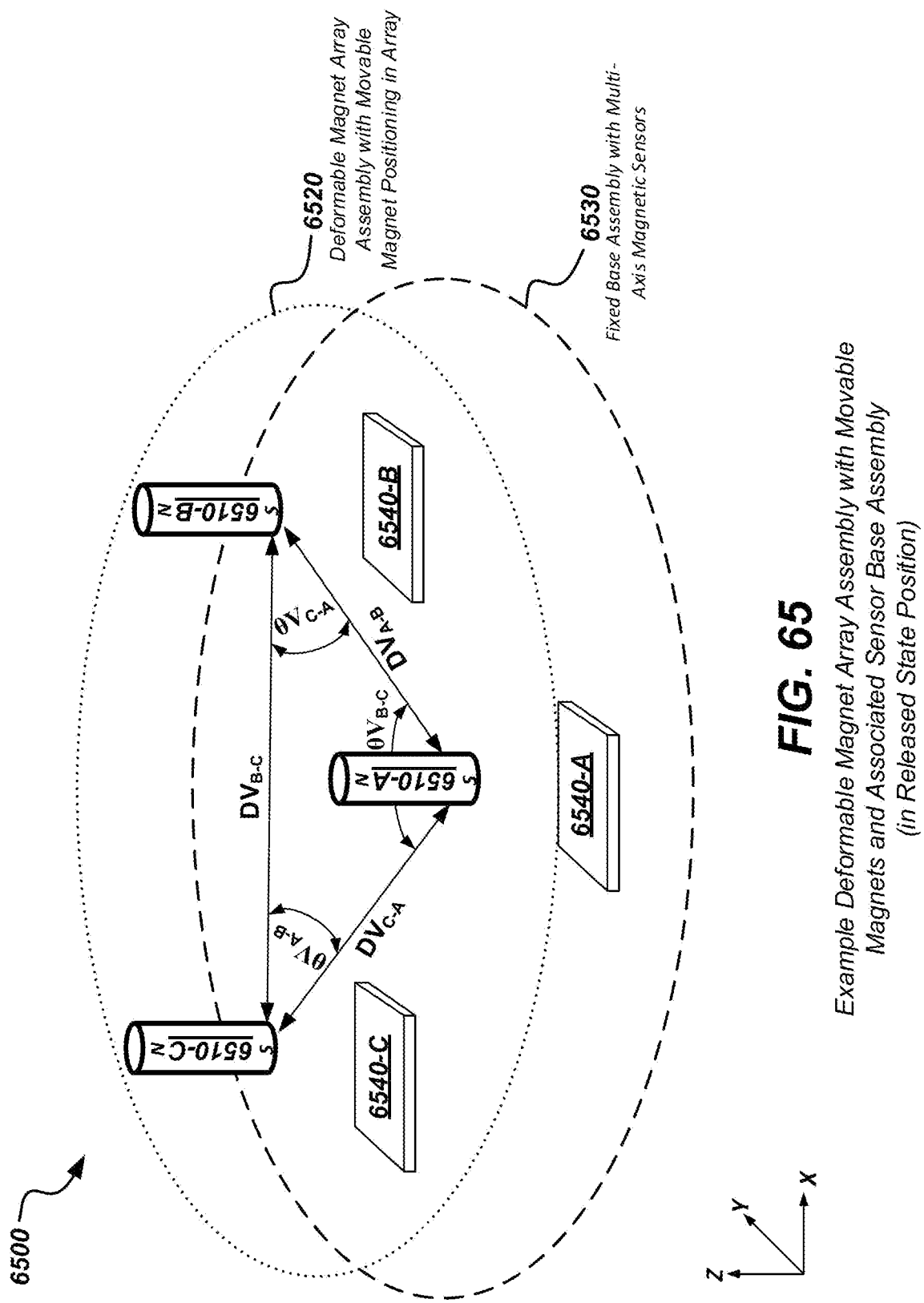
FIG. 65 illustrates details of a deformable magnetic array assembly embodiment and a corresponding base assembly.

In some embodiments, deformations of an actuator assembly or sub-assembly may also be sensed using a deformable magnet array assembly, such as is described subsequently. This may be done alone or in combination with magnetic sensing of a floating magnet array assembly, such as in conjunction with floating array assembly 6020 (which has fixed magnet positioning). A deformable magnet array assembly may be mounted or coupled to additional elements, such as structural or support elements, to form a deformable actuator assembly. An example of a deformable magnet array assembly 6500 is shown in FIG. 65. Apparatus 6500 may be used in various embodiments of magnetically sensed user interface devices to provide sensing of deformations applied by a user to an associated deformable actuator assembly and coupled deformable actuator element.

As shown in FIG. 65, apparatus 6500 may include a fixed base assembly 6530, along with a deformable magnetic array assembly 6520, with magnets 6510 disposed in a movable configuration relative to each other (as opposed to the fixed configuration of embodiment 6000). In this configuration, magnets 6510-A, 6510-B, and 6510-C are mounted in a deformable actuator assembly so as to be movable with respect to each other in response to user interaction (e.g., pushing, squeezing, etc.). This may be done by mounting the magnets in a movable mounting configuration directly in a deformable actuator element (not shown in FIG. 65), such as in actuator element 6830 as shown in the UID embodiments of FIGS. 70 and 71.

In this deformable array configuration, the various dimensions $DV_{A\text{-}B}$, $DV_{B\text{-}C}$, and $DV_{C\text{-}A}$, as well as the angles $\theta V_{A\text{-}B}$, $\theta V_{B\text{-}C}$, and $\theta V_{C\text{-}A}$ ("V" is added to denote variable distance) between the various magnets 6510A-C may change as the user interacts with the device by squeezing, pushing, etc. on an actuator element. Corresponding sensors 6540A-C in base assembly 6530 may then sense magnetic fields generated by associated magnets 6510A-C and provide output signals to a processing element (not shown), where deformation of the magnet positions (as well as corresponding deformations in a coupled deformable actuator element) may be determined. The sensing in this configuration differs from that in a floating array configuration with fixed magnet positions in that the magnets in the floating array move in sync with each other, whereas in the deformable array configuration the magnets, which may be loosely mechanically coupled or, in some cases, uncoupled, can move independently or partially independently of each other. In addition to displacement movements, in a deformable configuration a processor may determine, based on signals from the sensors 6540, squeeze actions such as relative deformation of a particular part of the array and/or both magnitude and direction of squeeze actions (e.g., vector deformation or vector squeeze).

Figure 66:
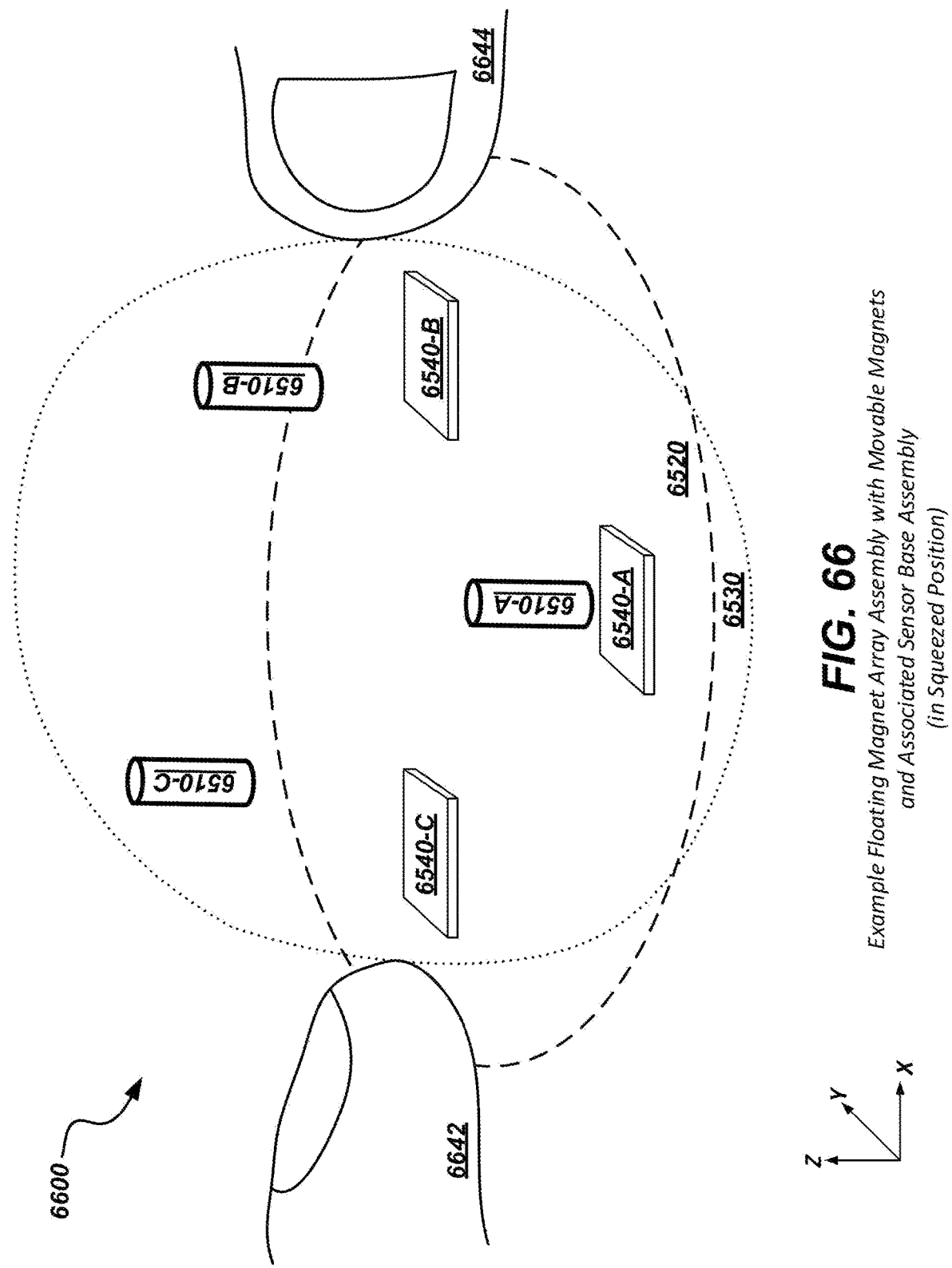
FIG. 66 illustrates details of a deformation associated with the embodiment of FIG. 65.

An example squeeze interaction with a deformable array assembly, such as array assembly 6520, with respect to magnetic sensors 6540 on base assembly 6530, is shown in FIG. 66. In this example, a user's finger 6642 and thumb 6644 squeeze a flexible boot or cover (shown for simplicity as dotted lines in FIG. 66), which may cover a deformable actuator element (not shown), resulting in changes in the relative positions of magnets 6510A-C with respect to a released-state position (e.g., such as the position shown in FIG. 65). Sensors 6540 of base assembly 6530 then sense the magnetic fields of the magnets 6510 in the deformed position and provide corresponding output signals to a processing element (not shown) for deformation signal processing and corresponding UID output generation.

As noted previously, in some UID embodiments, floating and deformable magnet arrays and actuator elements and assemblies, along with corresponding base assemblies and sensors, may be used to provide both movement sensing and deformation sensing. This may be done by combining the previously illustrated floating and deformable array assemblies into a single user interface device apparatus. An example embodiment of this configuration is shown in UID assembly 6700 of FIG. 67, where the deformable array assembly 6520 and base assembly 6530 are inverted or flipped with respect to the configuration of FIG. 66, and are combined with floating array assembly 6020 and fixed base assembly 6030 (additional mounting and mechanical, electrical, coupling, and other elements are omitted from FIG. 67 for clarity). In addition, base assemblies 6030 and 6530 may be combined in some implementations into a single or integral base assembly.

Figure 67:
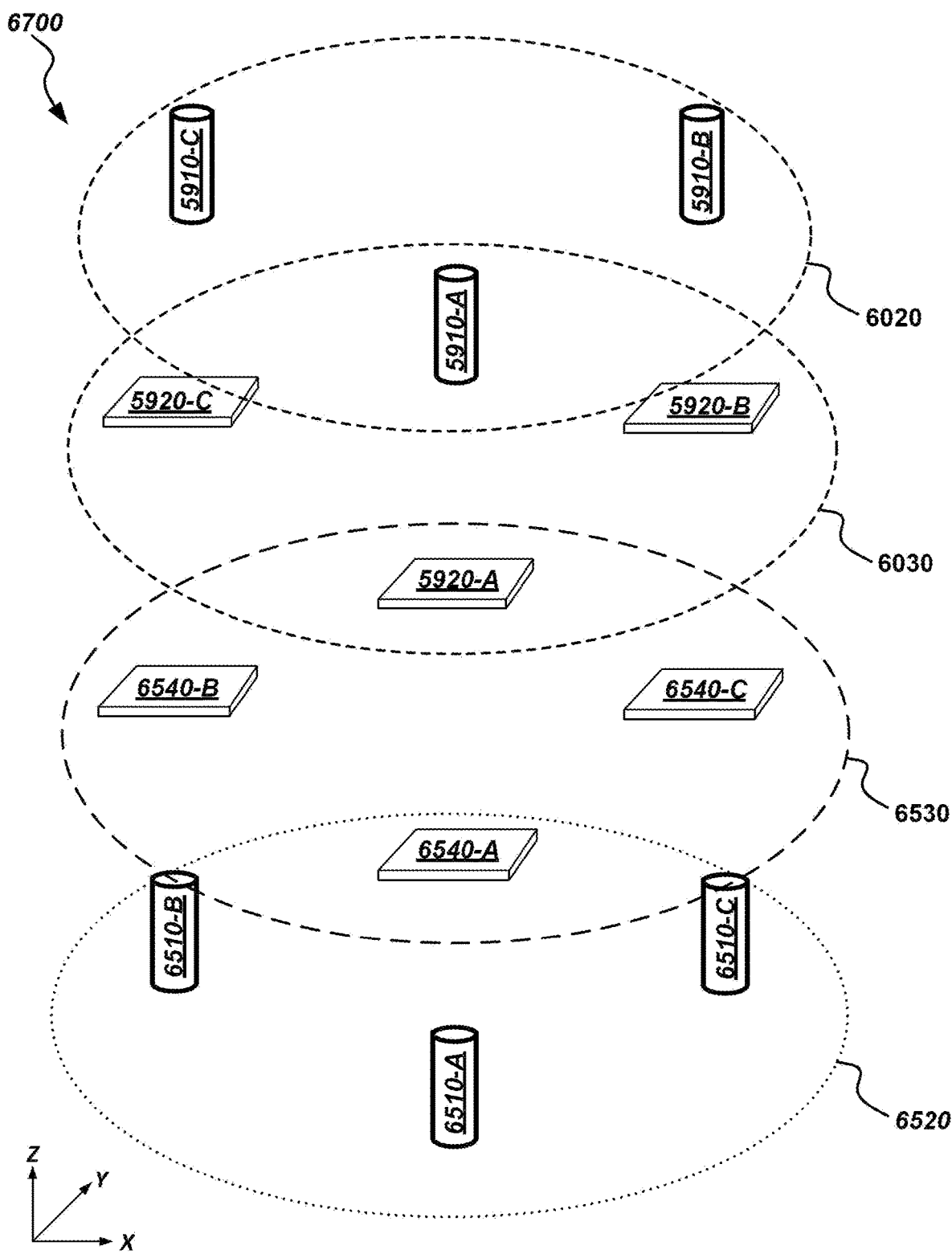
FIG. 67 illustrates details of a combined floating and deformable actuator assembly embodiment.
Figure 68:
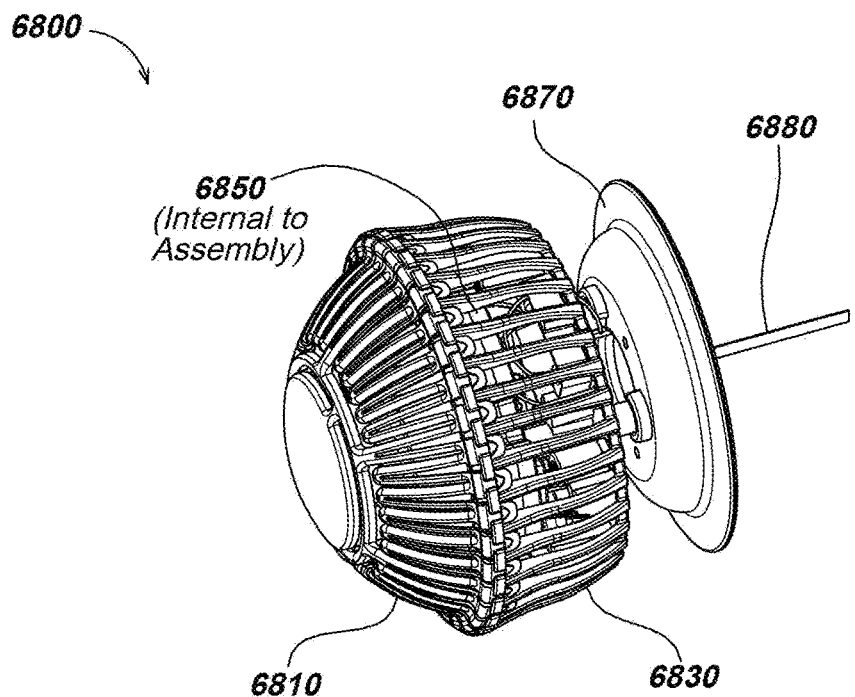
FIGS. 68 and 69 illustrate details of an embodiment of an actuator assembly as may be used in a magnetically sensed user interface device.
Figure 70:
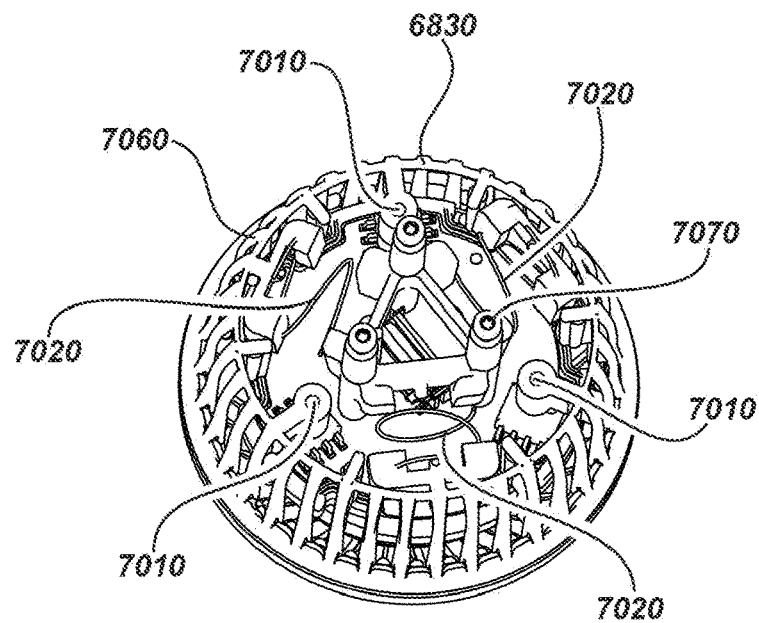
FIGS. 70 and 71 illustrates details of deformations of a deformable magnetic array and a spring-based flexibly coupling assembly.
Figure 71:
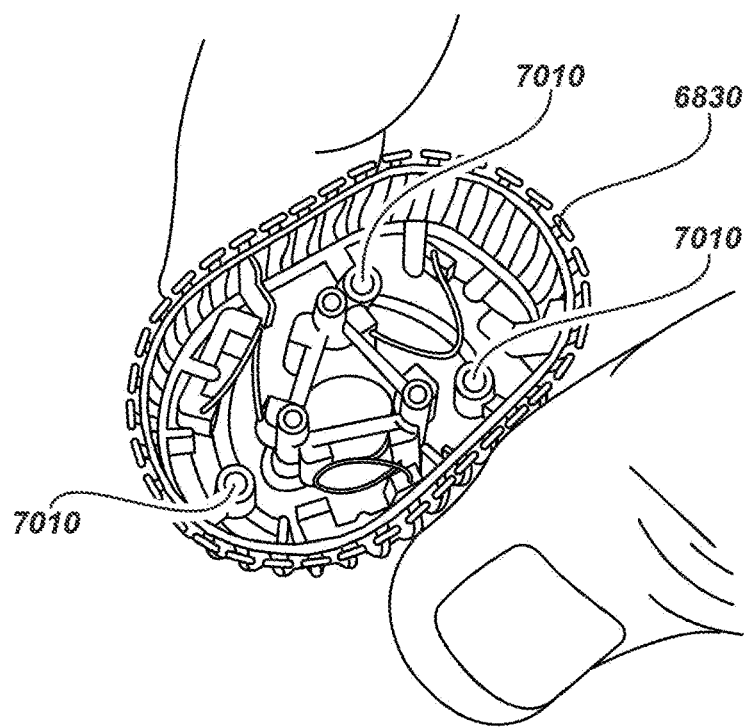

The floating and deformable arrays and actuator assemblies may be connected, such as at a mid-point of corresponding actuator elements (e.g., as shown in FIG. 68), and one or both may be floating with respect to the base assemblies, such as through use of springs or other flexible elements, such as shown in FIGS. 70 and 71. In an embodiment such as assembly 6700 of FIG. 67, the sensors may sense motion and/or deformation of floating and deformable actuator elements in X, Y, and/or Z dimensions. In addition, independent sensing of X, Y, and Z positions and corresponding deformations of deformable actuator elements may be used to provide X, Y, and/or Z deformation information.

It is noted that the various magnetic sensing UID examples shown in FIGS. 59-67 are illustrated with three magnets and three corresponding magnetic sensors; however, in alternate embodiments, more or fewer magnets and/or sensors may be used. In addition, the size, shape, number, and/or placement of the magnets, sensors, and/or other components may be varied or reversed. For example, in some embodiments, the magnets and sensors may be reversed so that the sensor is disposed on the floating and/or deformable assembly and the magnets are on the base assemblies. In some embodiments, electromagnets may be used in addition to or in place of permanent magnets, and additional electromagnet control circuits may be added and controlled by a processing element or other control element. Accordingly, various other configurations of magnets, sensors, and other elements may be used in alternate embodiments.

Example Embodiments

Figure 69:
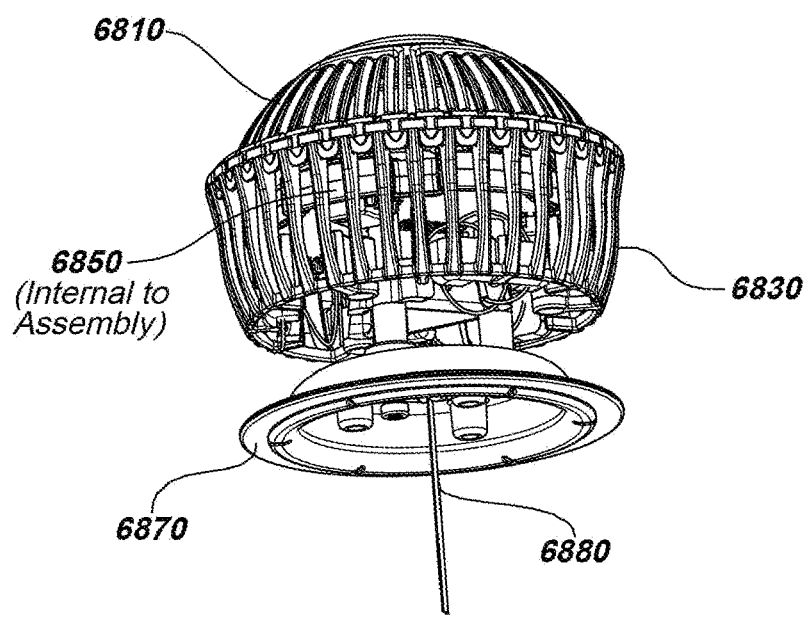

Some example embodiments of magnetically sensed user interface apparatus, assemblies, and devices implementing sensing configurations and methods as described with respect to FIGS. 59-67 are further described below. For example, FIGS. 68 and 69 illustrate details of an embodiment of a magnetically sensed user interface device apparatus 6800 including a floating actuator sub-assembly 6810, which may include a plurality of magnets in a fixed-magnet array configuration, such as floating magnet array 6020 of FIG. 60, along with a deformable actuator sub-assembly 6830, which may include a plurality of magnets in a deformable-magnet array configuration such as array assembly 6520 of FIG. 65. The floating and deformable actuator sub-assemblies may be coupled or connected to form an integral actuator assembly, which may include floating and deformable actuator elements. UID 6800 may also include a base assembly 6850 (inside of or enclosed by the actuator assemblies), which may be an integral base assembly including sensors for both floating and deformable magnetic sensing, such as a combination of base assemblies 6010 and 6530 as shown in FIG. 67.

The base assembly 6850 may be coupled to a housing mounting assembly 6870 for connecting the UID assembly 6800 to a housing, a base element, a case, an equipment panel or mounting boss, or to other mounting locations. A flexible cable or connector 6880 may be used to electrically couple the UID assembly 6800 to additional circuit elements in the housing, base element, etc. For example, a processing element may be included on a printed circuit board in the housing, base element, etc., along with other circuit components. Alternately, or in addition, a processing element may be mounted in the UID assembly 6800. Magnetic sensing UID assemblies such as assembly 6800 may be housed or covered in a boot or other flexible cover element, which may further provide dampening to actuator movements. The boot may be made from a flexible elastomeric material. Example configurations of UID assemblies, covers, and various associated housings are shown in, for example, FIGS. 15, 17, 18, 19, 32, 50, 51, and 75.

Figure 72:
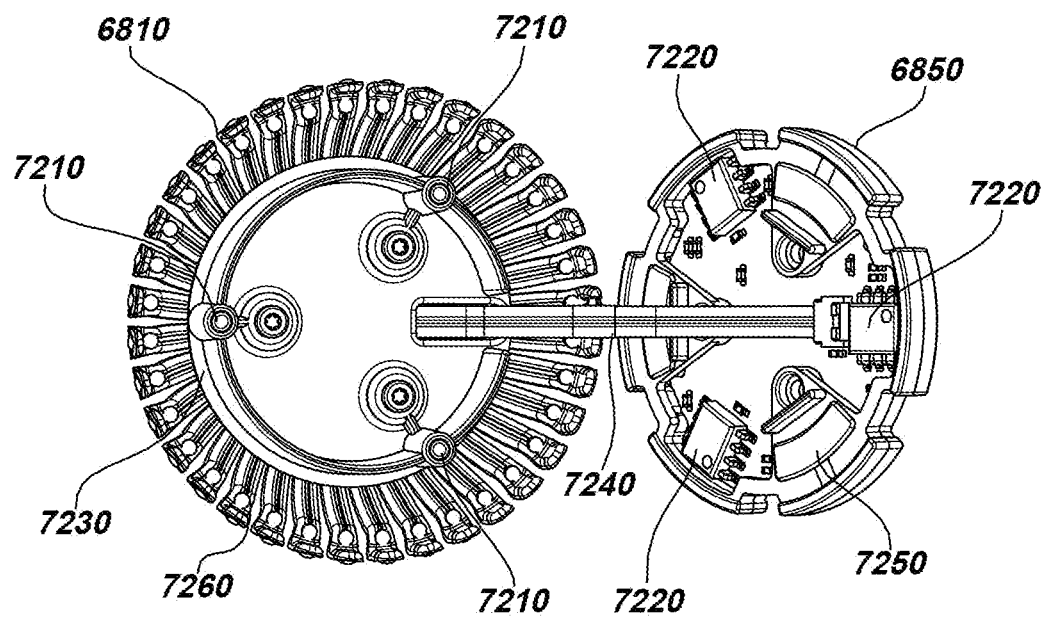
FIGS. 72-74 illustrate additional details of the embodiment of FIGS. 68 and 69.
Figure 73:
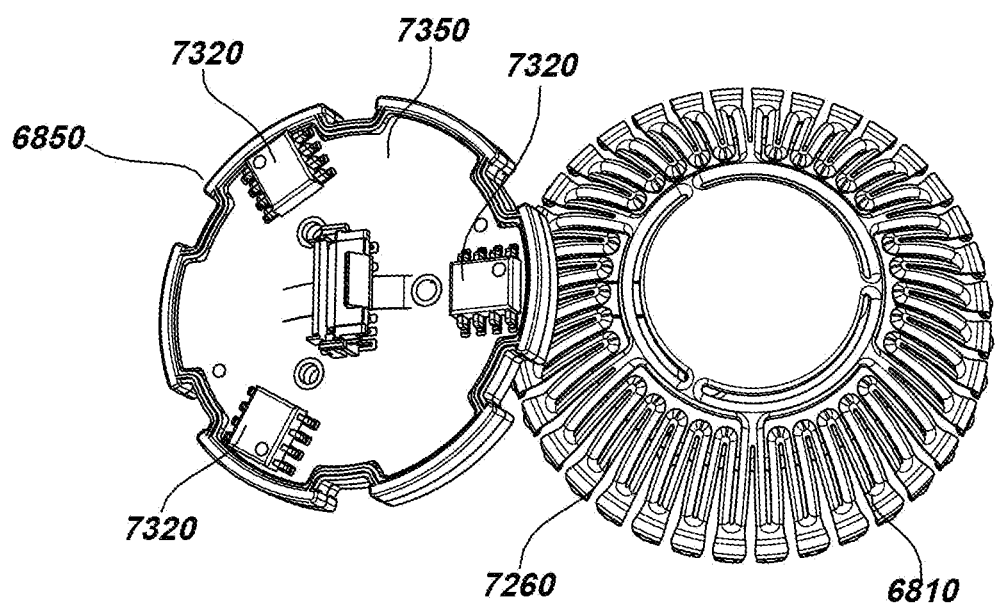

FIGS. 70 and 71 illustrate additional details of deformable actuator sub-assembly 6830. Deformable actuator sub-assembly 6830 may include a plurality of magnets 7010, which may correspond with magnets 6510 in deformable magnet array assembly 6520 of FIG. 65. The magnets may be mounted in a flexible deformable actuator element, such as the cylindrical cage-shaped deformable actuator element 7060 as shown. The magnets 7010 may be configured in a 3-magnet deformable array as mounted in the actuator element, which may correspond with array assembly 6520 of FIG. 65. The array may be floatably coupled, such as through the actuator element 7060, to a base element or housing mounting assembly 6870, which may include mounting structures, such as mounting bosses 7070, to connect to fixed base assemblies, such as base assembly 6850 (as shown in FIGS. 72 and 73). The base assembly 6850 may correspond with a combination of base assemblies 6010 and 6530 as shown in FIG. 67. The floatable coupling may be done using a spring-based flexible coupling assembly, such as a plurality of coil springs 7020 as shown FIGS. 70 and 71, which may be arranged perpendicular to a longitudinal axis of the UID assembly (e.g., an axis through the center of assembly 6850 going into and out of the drawing figures as shown). This coupling configuration may be used to allow for floating movement of the deformable actuator assembly 6830 and, when connected, floating actuator assembly 6810, in both X, Y, and Z directions.

FIG. 71 illustrates deformation of the magnets 7010 during a user squeeze action applied to deformable actuator sub-assembly 6830. In this squeeze action, the magnets move relative to each other in response to the squeeze, with the motions including X, Y, and Z movements. In response to these movements, the magnet positions and orientations can be sensed by the multi-axis magnetic sensors on base assembly 6850 (as shown in FIG. 73), based on the corresponding magnetic fields.

FIG. 72 illustrates additional details of floating actuator sub-assembly 6810. Actuator sub-assembly 6810 may include a plurality of magnets 7210, which may correspond with magnets 5910 as shown in FIG. 60. The magnets 7210 may be arranged in a substantially fixed, rigid orientation with respect to each other, corresponding to the configuration of FIG. 60. The magnets may be mounted in a rigid mounting assembly 7230, which may be coupled to a floating actuator element 7260, which may be in a flexible, dome-shaped cage configuration as shown to allow a user to squeeze the floating actuator element and induce a corresponding squeeze action into a coupled deformable actuator element, as well as generate movement of the fixed magnets 7210 (relative to sensors 7220). For example, as shown in FIGS. 68 and 69, with floating 6810 and deformable 6830 actuator assemblies connected as shown, a user-applied squeezing action on the floating actuator may result in deformation to the deformable actuator assembly 6830, thereby moving the magnets 7010 for sensing by sensors 7320, while a user rotation or push on the floating actuator assembly 6810 may also move assembly 7230 and magnets 7210 to sense displacement or rotation of the actuator.

As noted previously, base assemblies associated with the floating and deformable magnet arrays may be combined into an integral base assembly, such as base assembly 6850. Base assembly 6850 may have a floating sensor side 7250, which may include multi-axis magnetic sensors such as sensors 7220 for sensing movement of corresponding magnets 7210, as well as mechanical mounting elements, printed circuit boards, and the like. A flexible cable, such as cable 7240, may be used to electrically couple the floating actuator assembly 6810 and base assembly 6850. Additional elements (not shown) may be on or in the floating actuator assembly 6810, such as, for example, haptic feedback devices (not shown) such as vibrators, buzzers, motors, etc., switches, lights, and/or other electrical, optical, or mechanical components (not shown). These may be electrically and/or optically coupled to the base assembly 6850 via cable 7240, and/or via other connections (not shown).

Figure 74:
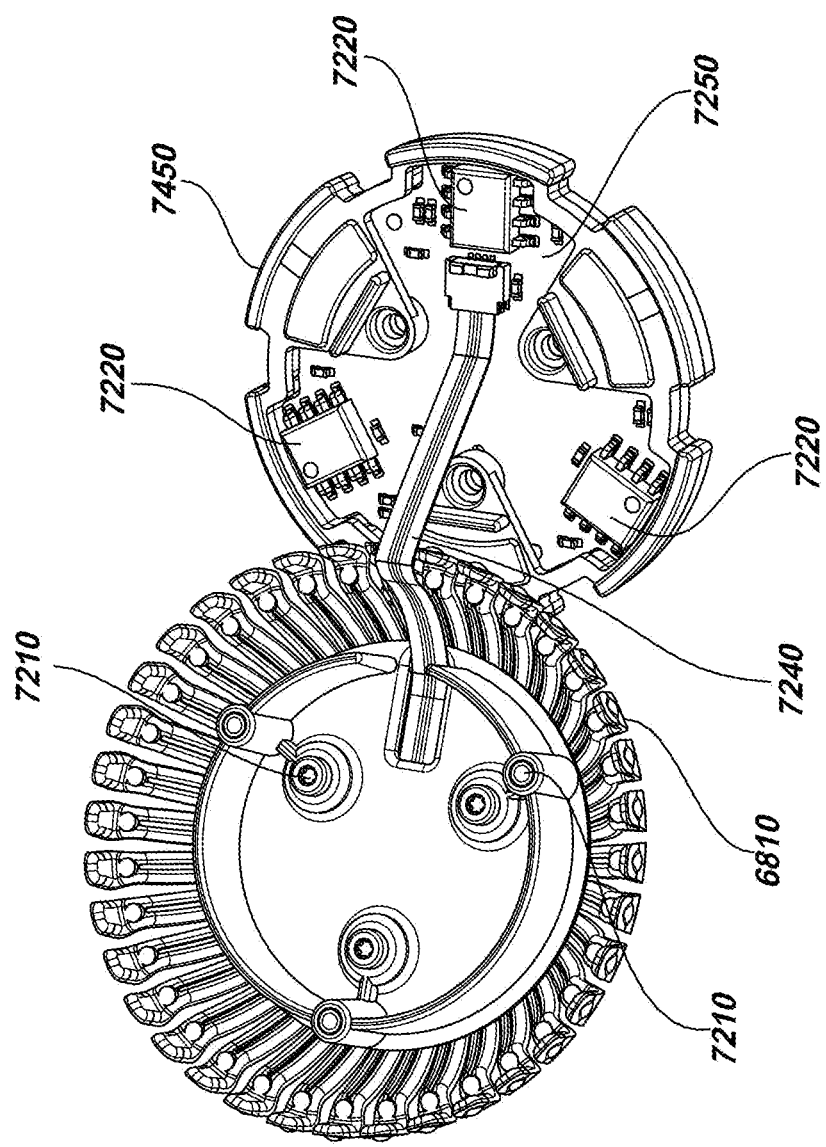

FIG. 73 illustrates additional details of side 7350 of base assembly 6850, including sensors 7320 which correspond with magnets 7210. Additional details of this side of base assembly 6850 are shown in FIG. 74, including an edge element 7450, which may be rubber or plastic overmolded to base assembly 6850, along with a printed circuit board, on which sensors 7220 may be mounted, such as shown in FIG. 74.

Figure 75:
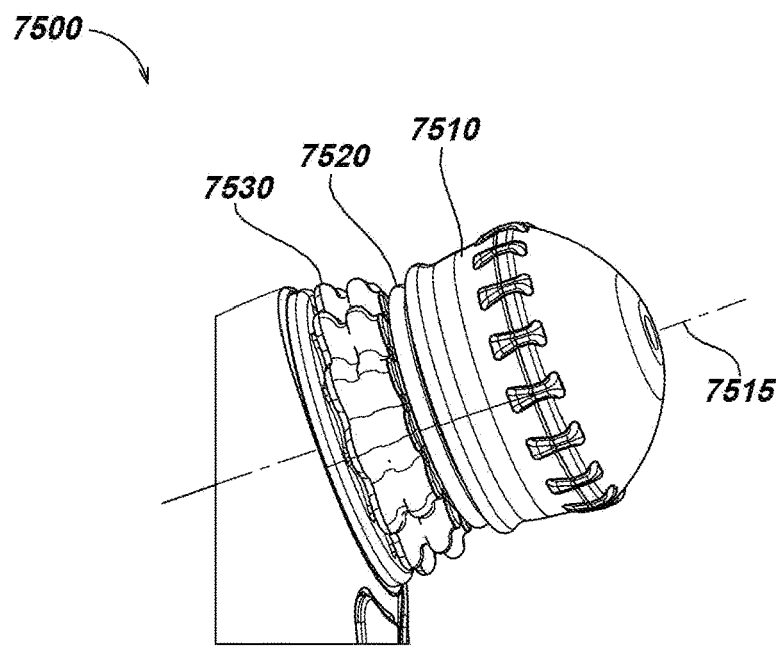
FIGS. 75 and 76 illustrate details of embodiments of actuator assembly boots or covers.
Figure 76:
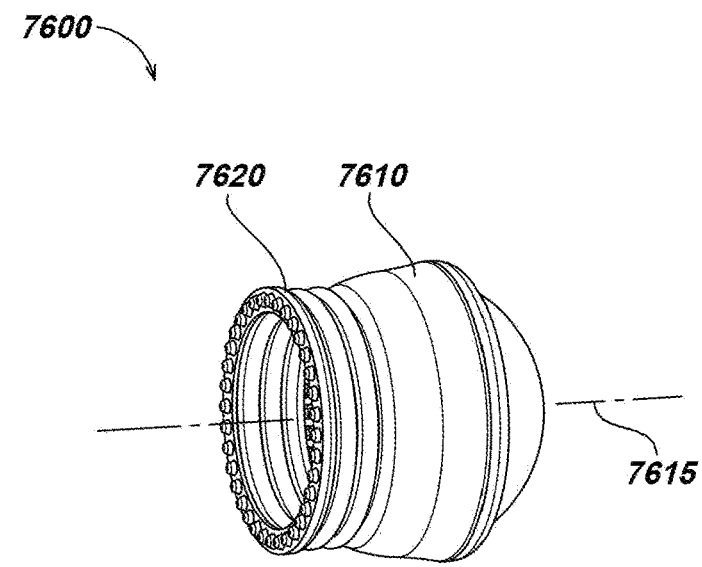

FIGS. 75 and 76 illustrate example embodiments of flexible boots or covers that may be used to enclose floating and/or deformable actuator assemblies such as those described previously. In some embodiments, the boots may be used to fully enclose the actuator assemblies for protection from ingress or water or other contaminants. Alternately, or in addition, the boots may be used to provide damping of movement of the actuator assemblies, such as subsequent to release of actuator elements by a user. Boots may be configured to allow movements of the enclosed actuator assemblies while controlling or restricting the movement direction and/or distance. For example, in boot embodiment 7500 as shown in FIG. 75, the boot may include one or more longitudinal flex rings 7520 to allow the actuator assembly to be pulled out or pushed in relative to a base assembly. In addition, to allow for rotational movements, boots may include rotational flex elements 7530, such as in the form of knobs or other structures to allow for rotation of the actuator assemblies about a longitudinal axis 7515 without binding. A user grip surface 7510 may include ribs or other structures to allow a user to controllably grip the actuator assemblies for various movement and deformation actions.

FIG. 76 illustrates another boot embodiment 7600 that may be used in some embodiments. This configuration includes longitudinal flex rings 7620, but does not include rotational flex elements.

Attention is now directed to FIG. 1, wherein details of another embodiment of a magnetically sensed user interface device 100 in accordance with various aspects are illustrated. FIGS. 2 through 6 illustrate various additional details of the embodiment illustrated in FIG. 1.

Figure 2:
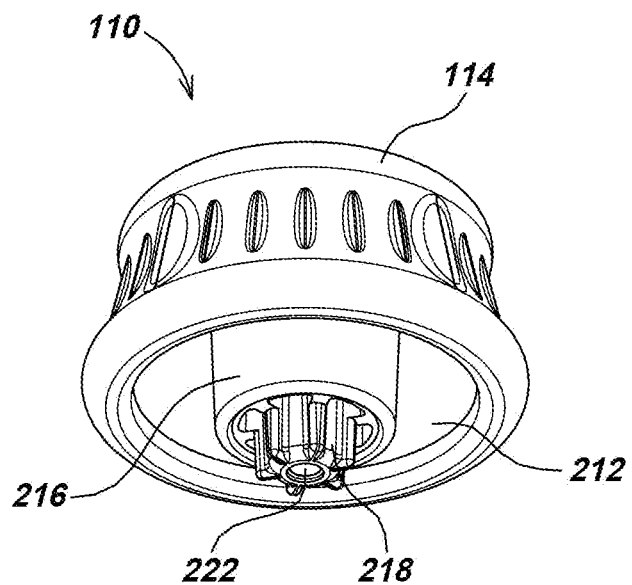
FIG. 2 is an enlarged isometric view of details of the knob actuator of the user interface device embodiment of FIG. 1 taken from the underside thereof.

As shown in FIG. 1, user interface device 100 may include an actuator element, which may be a knob actuator element 110 as shown, details of one configuration of which are further illustrated in FIG. 2. The knob actuator element 110 may be configured to allow a user to grip or otherwise contact the user interface device 100 and may further allow the user to receive tactile feedback from the user interface device 100. The knob actuator element 110 may be configured to float relative to a multi-axis magnetic sensor assembly, which may be mounted in a base assembly fixed relative to the floating actuator element.

In the embodiment shown, the top of the knob actuator element 110 may be formed with an actuator handgrip section 212 that may be largely cylindrical in shape. The actuator handgrip section 212 may be formed with a concave top and sides, which may be covered by an over-molded rubber cover 114 as shown. The actuator handgrip section 212 may be hollow internally with the exception of a middle actuator section 216 which may be cylindrical in shape and formed centered about the same central axis of the actuator handgrip section 212. The middle actuator section 216 may be of smaller diameter and formed to extend lower than the actuator handgrip section 212. An actuator keying post section 218, of smaller diameter than the middle actuator section 216, may be further formed to extend below the middle actuator section 216 and along the same central axis. An actuator screw hole 222 may be formed through the central axis of the actuator keying post section 218.

Interface device 100 may further include a dampening element, such as an elastomeric dampener 120, configured to dampen the tactile response of the device and/or to dampen motion of the actuator element upon release by a user. Elastomeric dampener 120 may be positioned below the knob actuator element 110. Example positioning of the elastomeric dampener 120 is further illustrated in FIG. 4 and FIG. 5.

The elastomeric dampener 120 may be formed with a dampener hole 422 formed about its center and a cylindrical dampener section 324 that may be shaped to fit inside the knob actuator element 110 in the hollow area between the actuator handgrip section 212 and the middle actuator section 216. The dampener hole 422 may be sized and positioned so that in assembly the actuator keying post section 218 of the knob actuator element 110 may be made to fit through the dampener hole 422. The elastomeric dampener 120 may be further formed with a disk-shaped dampener section 326 below the cylindrical dampener section 324. The disk-shaped dampener section 326 may be of greater circumference than the actuator handgrip section 212 of the knob actuator element 110.

Figure 4:
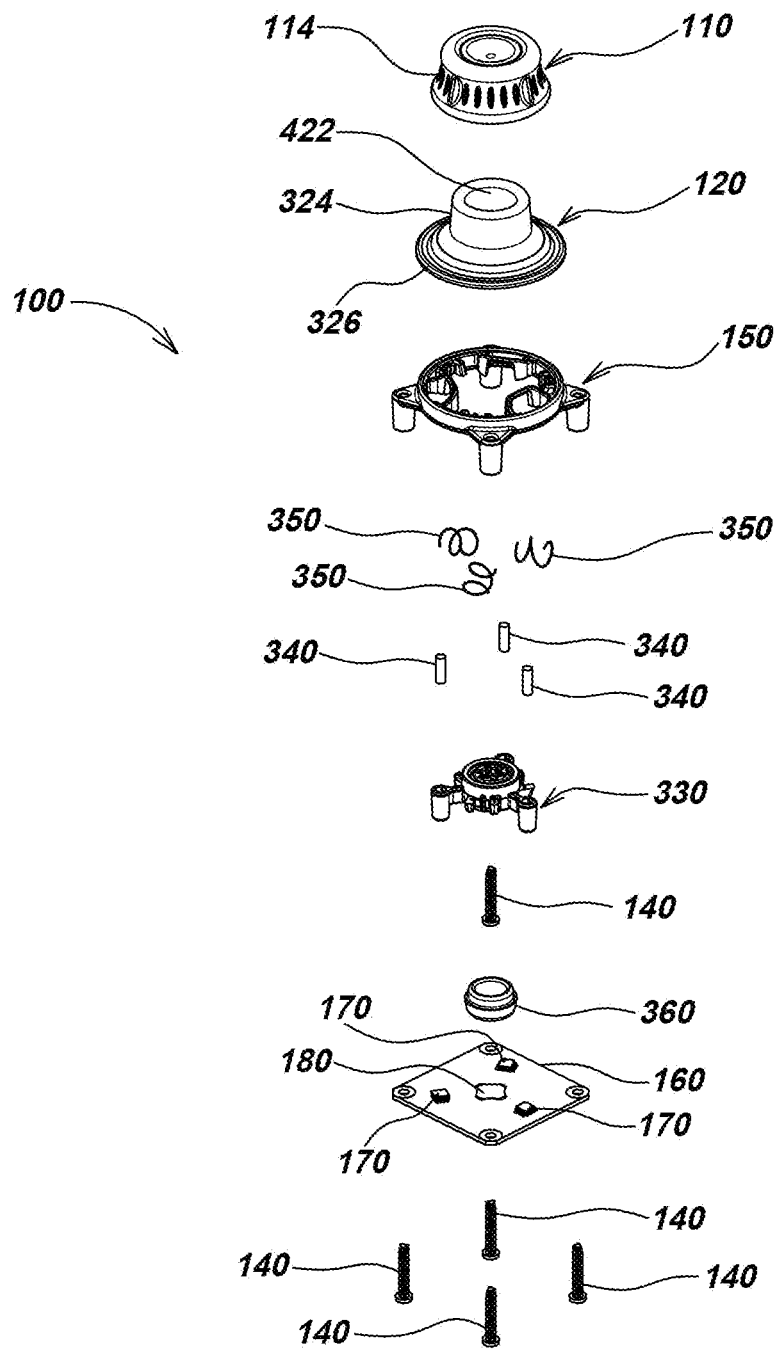
FIG. 4 is an exploded isometric view of details of the user interface device embodiment of FIG. 1 taken from the top thereof.
Figure 5:
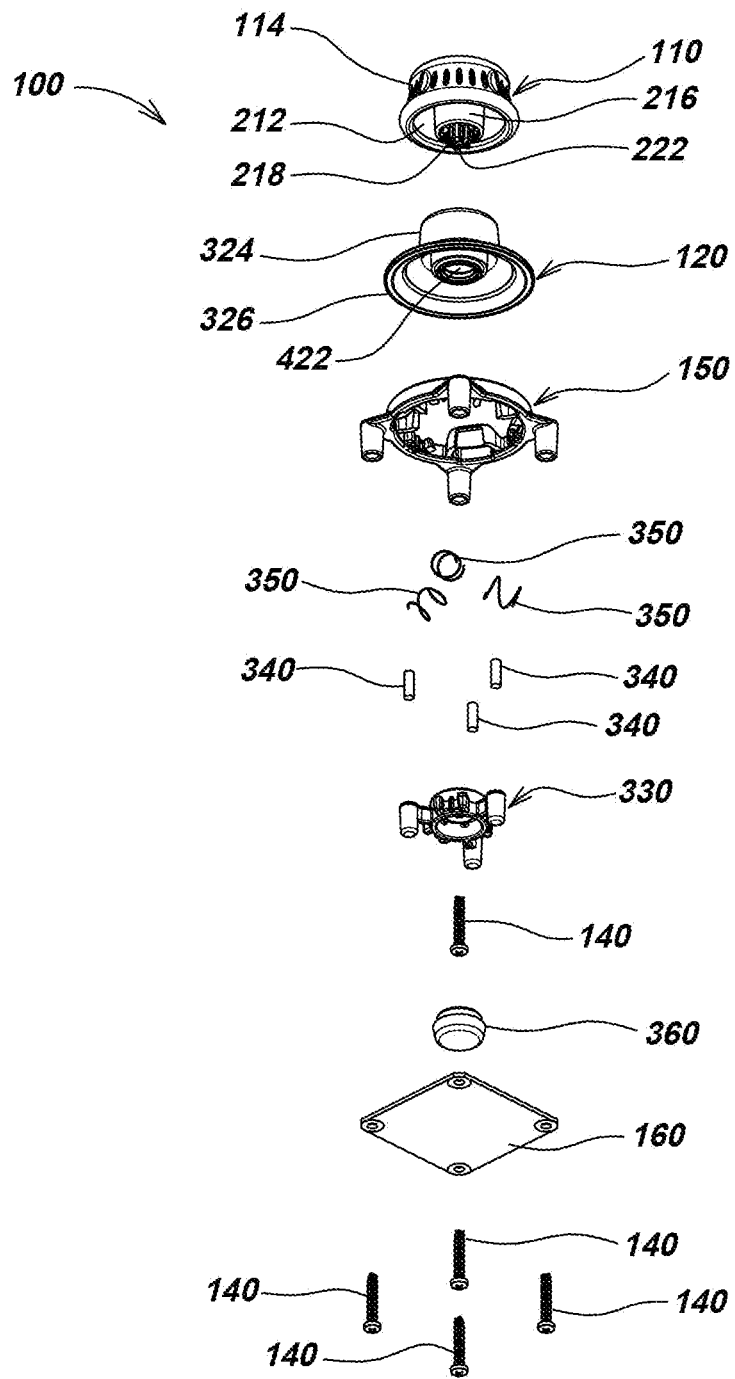
FIG. 5 is an exploded isometric view of details of the user interface device embodiment of FIG. 1 taken from the bottom thereof.
Figure 6:
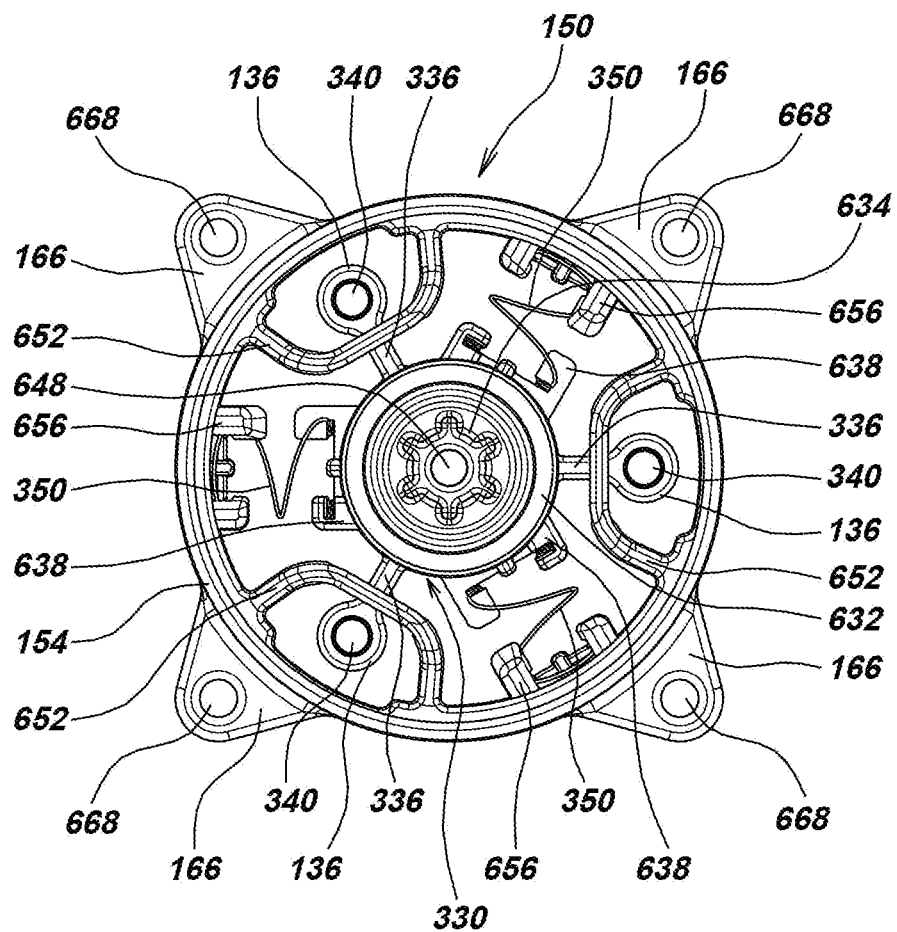
FIG. 6 is an enlarged plan view illustrating details of an embodiment of ring-shaped support, springs, magnets, and actuator core of the user interface device embodiment of FIG. 1.

Interface device 100 may further include a core element, such as a structural core element, such as actuator core 330 as shown, which may be positioned to mount centrally below the elastomeric dampener 120, such as shown in FIG. 4 and FIG. 5. The actuator core 330 may comprise a floating actuator assembly in conjunction with the knob actuator element 110. The actuator core 330 may be formed with a cylindrical core section 632 (as shown in FIG. 6) with a core keying section 634 (as shown in FIG. 6) formed centrally about its top surface. The actuator keying post section 218 of the knob actuator element 110 may be shaped to fit snugly within the core keying section 634 so that the actuator core 330 may be held to the knob actuator element 110 during displacements of the knob actuator element 110. The core element may be a component of a floating displacement element configured to provide an indication of displacement of the actuator element from a reference or released state position.

The actuator core 330 may be further formed with a series of arms, such as, in one exemplary embodiment, three arms 336 extending outward horizontally from the center axis of the cylindrical core section 632 as shown in FIG. 6. The arms 336 may be formed so that the arms are evenly spaced concentrically about the lower half of the cylindrical core section 632.

On the outer reach of each of the arms 336, a magnet mounting section 136 may be formed to hold one or more magnets 340, which may be permanent magnets. The actuator core may be floatably coupled to a base assembly using a flexible coupling assembly. For example, between each of the arms 336, a core spring mounting section 638 may be formed to each mount a coil spring 350. In one exemplary configuration (as shown), there are a total of three of the core spring mounting sections 638 and three of the springs 350 so that one end of each of the springs 350 may be secured in one of the core spring mounting sections 638. However, in other configurations different numbers of springs and/or other components may be used.

The springs 350 of the flexible coupling assembly may be configured to extend radially from the actuator core 330 at approximately one hundred and twenty degree intervals (in the case of a three spring configuration). In alternative embodiments, the springs 350 may vary in width, spacing and quantity to alter the tactile sensation for the user and/or to provide other functionality. For example, by varying the properties of the springs 350, more resistance to tilting displacements may be achieved. Various other tactile adjustments may be used in various implementations to tailor the device to a particular user and/or application.

Figure 11:
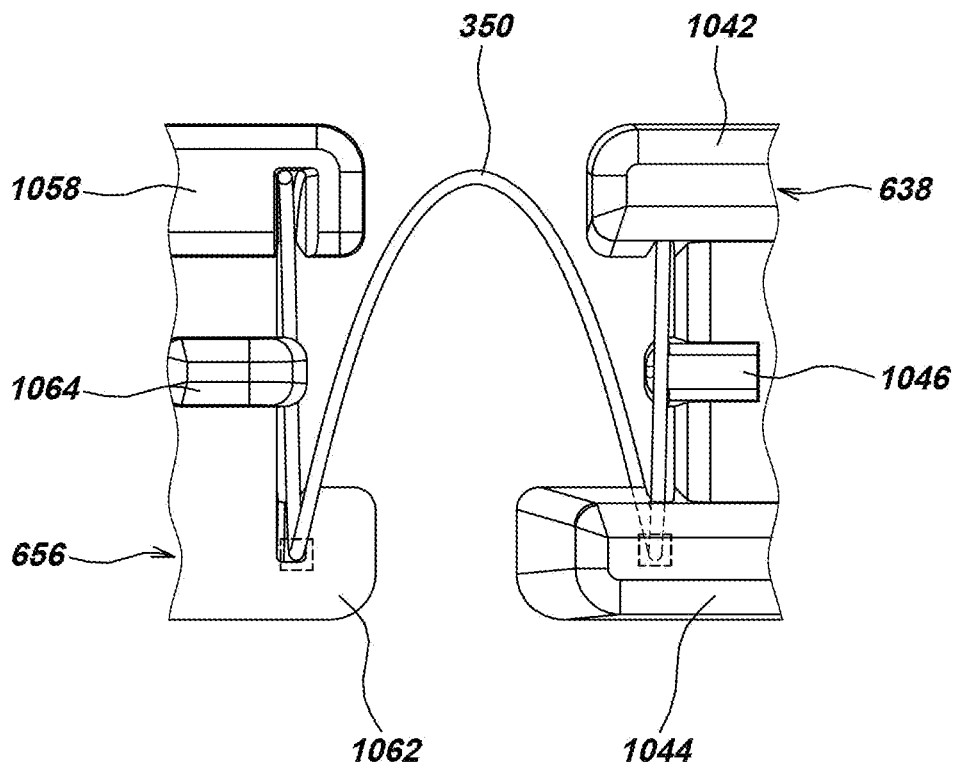
FIG. 11 is a detailed top view of an embodiment of a core spring mounting section, a spring, and a support spring mounting section prior to induction welding.

Referring to FIG. 11, which illustrates additional details of a spring configuration in accordance with one embodiment, each of the core spring mounting sections 638 may be further comprised of a core spring end support nub 1042, a core melt shoulder nub 1044, and a core center snap retaining nub 1046. The core spring mounting sections 638 may be sized and dimensioned such that, during assembly, the end coil about the end of each of the springs 350 may snap into place within the core spring end support nub 1042 and the core melt shoulder nub 1044, and may be held in place by the core center snap retaining nub 1046. The core spring mounting sections 638 may be further dimensioned so that the end coil of one or more of the springs 350 are flexed tightly in order to be snapped into place.

Figure 3:
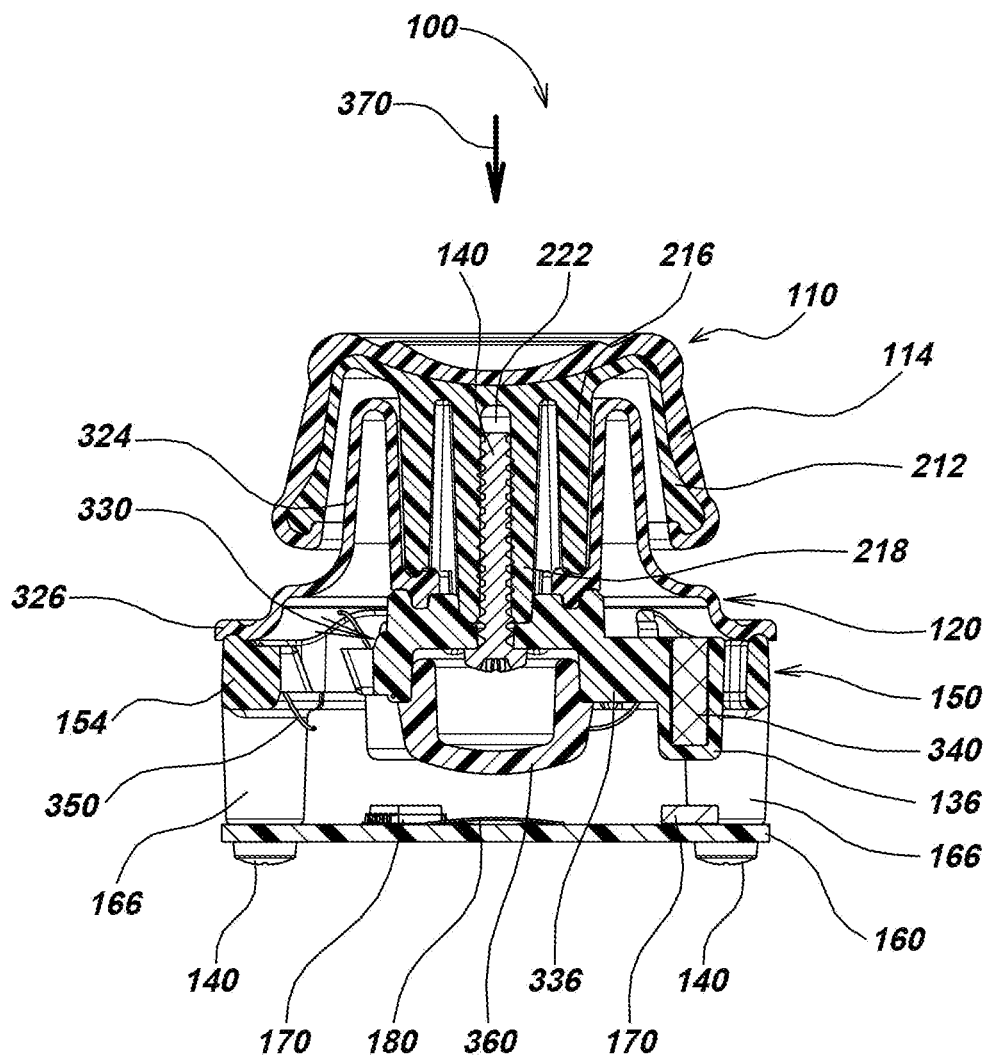
FIG. 3 is a vertical sectional view of details of the user interface device embodiment of FIG. 1 taken along line 3-3 of FIG. 1.

Referring back to FIG. 1 through FIG. 6, the cylindrical core section 632 may be largely hollow internally with a core screw hole 648 formed centrally along the top as shown in FIG. 6. In assembly, the core screw hole 648 may be made to align with the dampener hole 422 and the actuator screw hole 222 so that the actuator core 330, the elastomeric dampener 120, and the knob actuator element 110 may be secured together by a screw 140 as shown in FIG. 3 through FIG. 5. A switch press cap 360 may be mounted to the bottom of the actuator core 330. The top of the switch press cap 360 may be dimensioned to mount within the hollow area of the cylindrical core section 632. The bottom of the switch press cap 360 may be shaped as a downward facing dome.

A ring-shaped support 150, as illustrated in FIG. 6, may be concentrically positioned to circumscribe the actuator core 330 in such a way that the actuator core 330 may be permitted a range of displacement movements, such as tilting, side-to-side, front-to-back, up-and-down, and/or rotations and permutations of each of these directions within the ring-shaped support 150. The travel permitted to the actuator core 330 may be limited by a series of generally C-shaped limiting sections 652 formed along a ring section 154. The C-shaped limiting sections 652 may be formed concentrically about the inward facing side of the ring section 154 and evenly spaced from one another. In an exemplary embodiment having three springs (as described previously), there may be three of the limiting sections 652 so that one of the limiting sections 652 substantially encircles each one of the magnet mounting sections 136 of the actuator core 330. Other configurations may be used in different implementations having a different number of springs and/or spring configurations. Dimensioning of the C-shaped limiting sections 652 may be used to control the amount of travel permitted to the actuator core 330 and therefore the knob actuator element 110. Between each of the C-shaped limiting sections 652, a support spring mounting section 656 may be formed such that the end of each one of the springs 350 may be mounted to a corresponding one of the support spring mounting sections 656.

Referring to FIG. 11, each of the support spring mounting sections 656 may be further composed of a support spring end support nub 1058, a support melt shoulder nub 1062, and a support center snap retaining nub 1064. The support spring mounting sections 656 may be sized and dimensioned so that, during assembly, the end coil about the end of each of the springs 350 may snap into place within the support spring end support nub 1058 and the support melt shoulder nub 1062 and be held in place by the support center snap retaining nub 1064. The support spring mounting sections 656 may be further dimensioned so that the end coil of one of the springs 350 are flexed tightly in order to be snapped into place.

In operation, the flexible floating coupling assembly, such as the springs 350 and associated elements, may be configured to provide a restorative force so that when the knob actuator element 110 has been released from a displaced position, it may be returned to an appropriately centered released state position or neutral position. For example, a series of generally cylindrical support mounting posts 166 may be formed so that there is one in four places evenly spaced about the outer circumference of the ring section 154. However, other configurations of cylindrical support mounting posts 166 may be used in different implementations. The support mounting posts 166 may be positioned on the outward facing side of the ring section 154 forming four corners and extending vertically below the ring section 154. A support mounting post screw hole 668 may be formed through the center axis of each of the cylindrical support mounting posts 166.

A printed circuit board (PCB) 160, such as shown in FIG. 4, may be secured to the bottom of the cylindrical support mounting posts 166 by means of four of the screws 140. A series of magnetic sensors, such as, for example, three magnetic sensors 170 in the illustrated implementation, may be mounted to the PCB 160 so that one of each of the magnetic sensors 170 corresponds to one of the magnets 340 mounted within the magnet mounting sections 136 of the actuator core 330. However, in other configurations of actuator cores 330 and/or magnets 340, different numbers and/or configurations of magnetic sensors 170 may be used. The printed circuit board and/or magnetic sensors may be components of a sensing element, which may be configured to sense a displacement of the actuator relative to a reference or released state position, and provide sensor output signals to a coupled processing element.

A mechanical dome switch 180 may be mounted centrally on the PCB 160 so that when sufficient force is applied to the knob actuator element 110 along a downward direction 370, such as is shown in FIG. 3, the switch press cap 360 will press into the mechanical dome switch 180 providing the user tactile and/or audio feedback in the form of a click and/or snap. While the mechanical dome switch 180 may be used in conjunction with an electrical contact (not illustrated) in some implementations, pushbutton type control may also be provided to the user in various embodiments. In alternative embodiments, other configurations, such as multiple mechanical switches or other input devices (not illustrated) may also be used to provide several instances of this pushbutton type control.

In another aspect, the present invention relates to apparatus and processes for manufacturing user interface device assemblies such as those illustrated with respect to user interface device 100, user interface device apparatus 3220, user interface device apparatus 6800, or other user interface device embodiments described herein. In addition, aspects of the present invention relate to products and articles of manufacture of such a process. Attention is now directed to FIGS. 8 through 14 which illustrate various details of manufacturing aspects of the present invention. For example, during manufacture, there are various ways in which springs of flexible coupling assemblies, such as the springs 350, may be mounted into a device such as the user interface device 100. Example methods include mechanically mounting by threading ends around an inner core or into an outer ring, bonding with adhesive or using some other bonding agent, insert molding the springs 350 into plastic parts, heating the springs and allowing an adjoining thermoplastic material to flow around the heated ends of the springs 350, and/or other similar or equivalent methods as known or developed in the art.

Mechanically mounting the springs 350 by threading ends onto an inner core or an outer ring may require a very high degree of precise control over the shape and size of the ends. Because of difficulties in precisely winding the springs 350, the result is frequently an imprecise final shape and position of the springs 350 within the device itself. Bonding the springs 350 using adhesive or some other bonding agent, such as solder, may require longer cure or heating times and may be subject to misalignment from handling during manufacture. When the spring 350 is insert-molded into plastic components, it may be done so using complicated molds and associated shutoffs and can still result in misalignment of the springs 350.

Figure 12:
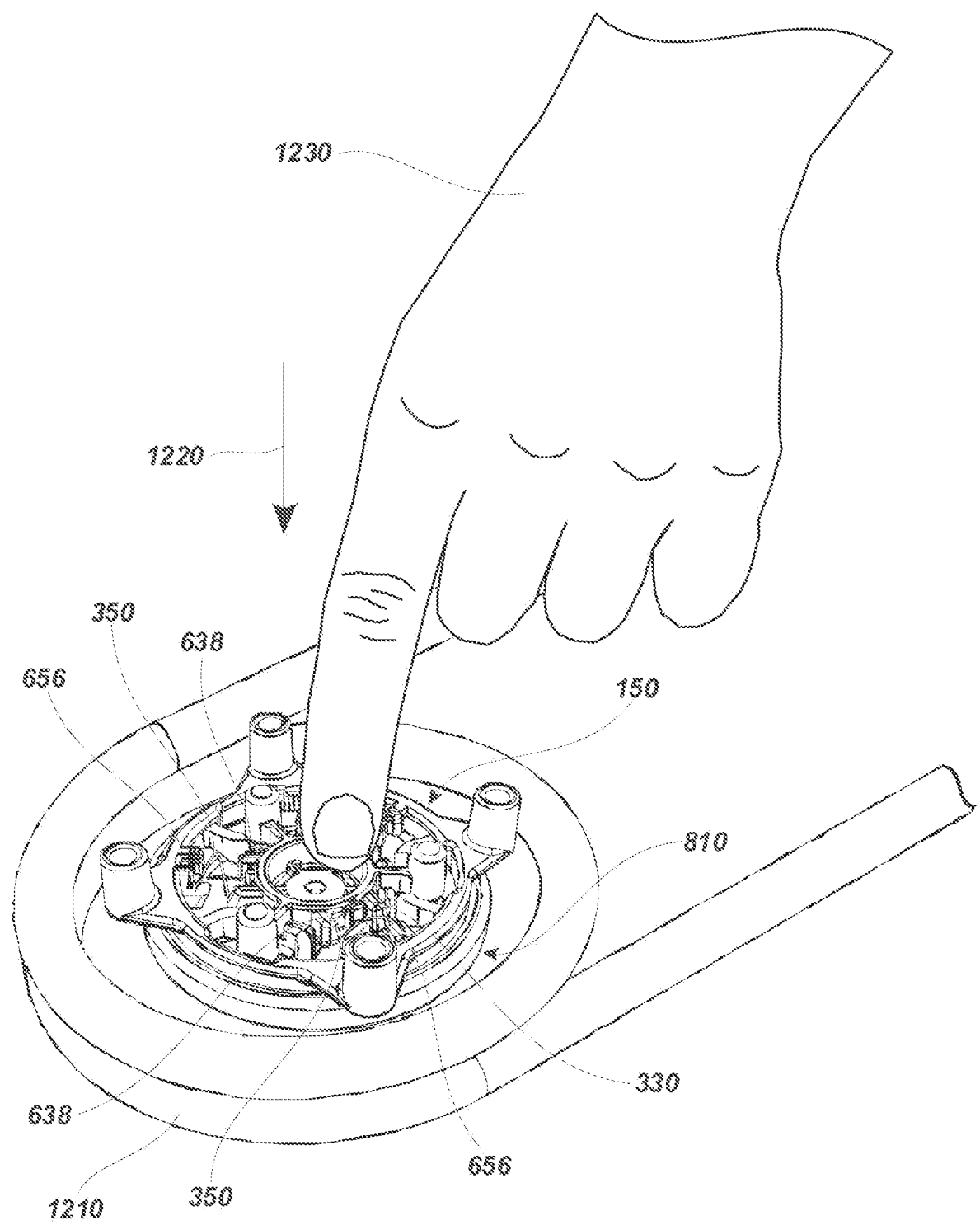
FIG. 12 is an isometric view of an embodiment of an actuator core, a ring support, and springs on an induction welding fixture in an induction coil.

A low stress, highly aligned means of installation and spring retention may be provided by heating the springs 350 and allowing an adjoining thermoplastic material to flow around the ends thereof. Using the method of magnetic induction to heat the spring 350 may be a particularly cost effective and quick method requiring no additional calibration to align the springs 350. An induction coil 1210, such as shown in FIG. 12, may be utilized to heat the ends of the springs 350 through means of magnetic induction. The springs 350 should be electrically conductive, ferromagnetic, or both when placed inside the induction coil 1210. Additional control in manufacture may be achieved while using the magnetic induction method if the springs 350 have open ends that do not close the circuit, thus avoiding a shorted turn effect.

When a magnetic field or an electric current is induced in the ends of the springs 350, the springs 350 become hot due to magnetic hysteresis or eddy current resistive heating. The thermoplastic material of the actuator core 330 and the ring-shaped support 150 melt and flow onto the ends of the springs 350 forming a mechanical coupling between the springs 350 and the actuator core 330 and the ring-shaped support 150. The magnetic induction method and associated heating by which the springs 350 may be mounted may also be used to cure certain adhesives or other bonding agents.

Figure 8:
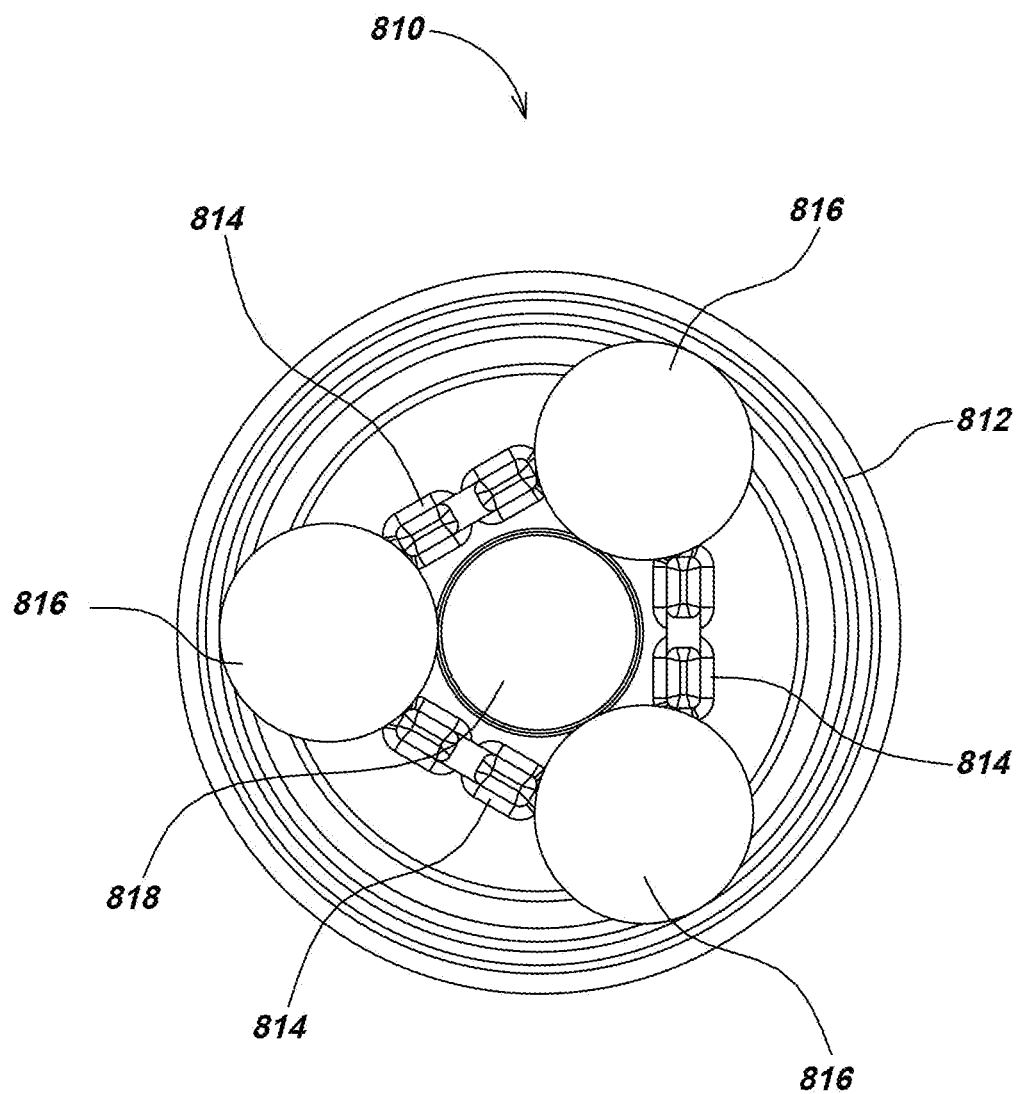
FIG. 8 is an enlarged plan view illustrating an embodiment of an inductive welding fixture.
Figure 9:
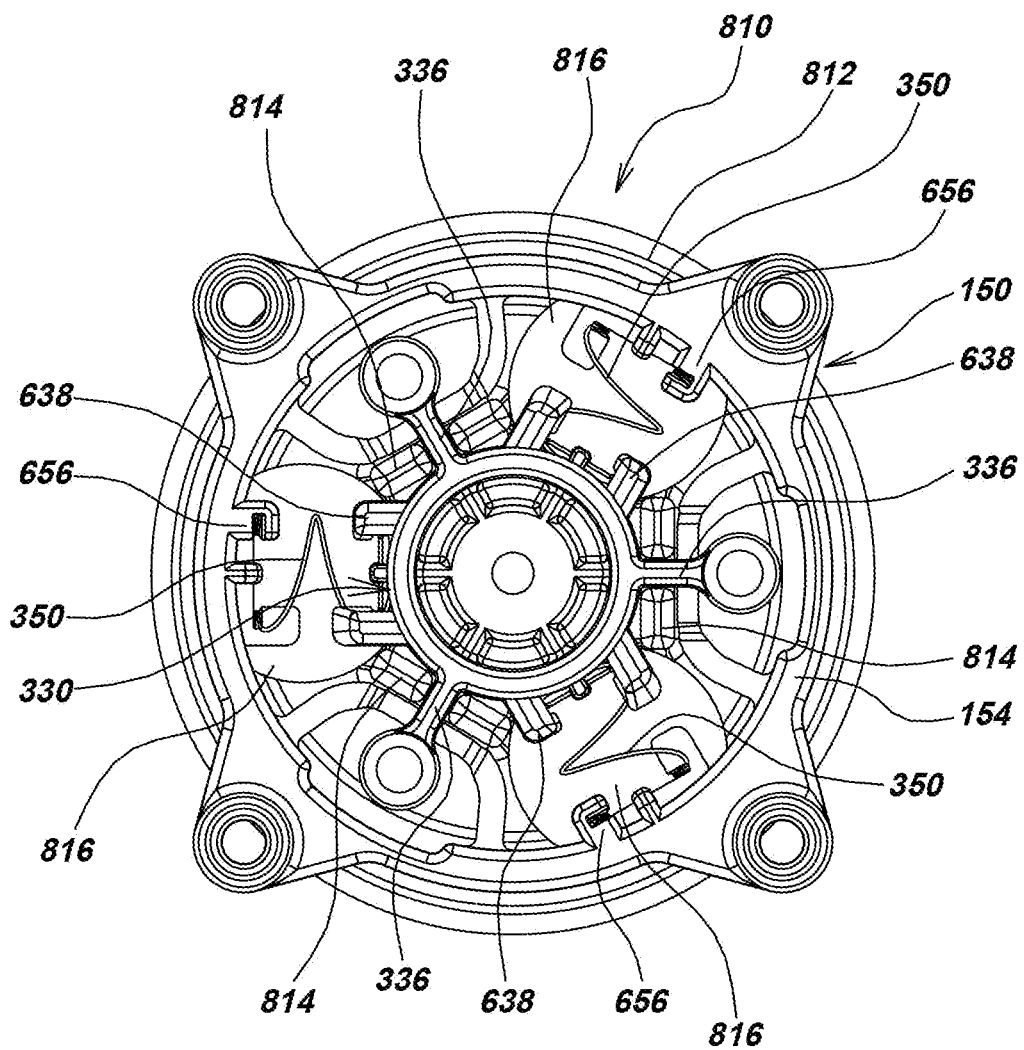
FIG. 9 is an enlarged plan view illustrating the inductive welding fixture of FIG. 8 with an embodiment of an actuator core, a ring support, and springs.

In manufacture of the user interface device 100, an induction welding fixture 810, such as shown in FIG. 8, may be used to provide a means to accurately align the actuator core 330 within the ring-shaped support 150 and ultimately the magnets 340 and the magnetic sensors 170. In an exemplary embodiment, the induction welding fixture 810 may be largely disk shaped with a retaining lip 812. The induction welding fixture 810 and the retaining lip 812 may be dimensioned so that the ring section 154 of the ring-shaped support 150 fits snuggly within the circumference of the retaining lip 812.

The induction welding fixture 810 may further include a series of three arm mounts 814. The arm mounts 814 may be shaped and dimensioned to hold the arms 336 of the actuator core 330 in place during the magnetic induction process. Between each of the arm mounts 814, a welding fixture hole 816 may be formed. The welding fixture holes 816 may be round and dimensioned to expose the springs 350. A center indention 818 may be formed on the center of the induction welding fixture 810 to aid in centering the actuator core 330.

Figure 10:
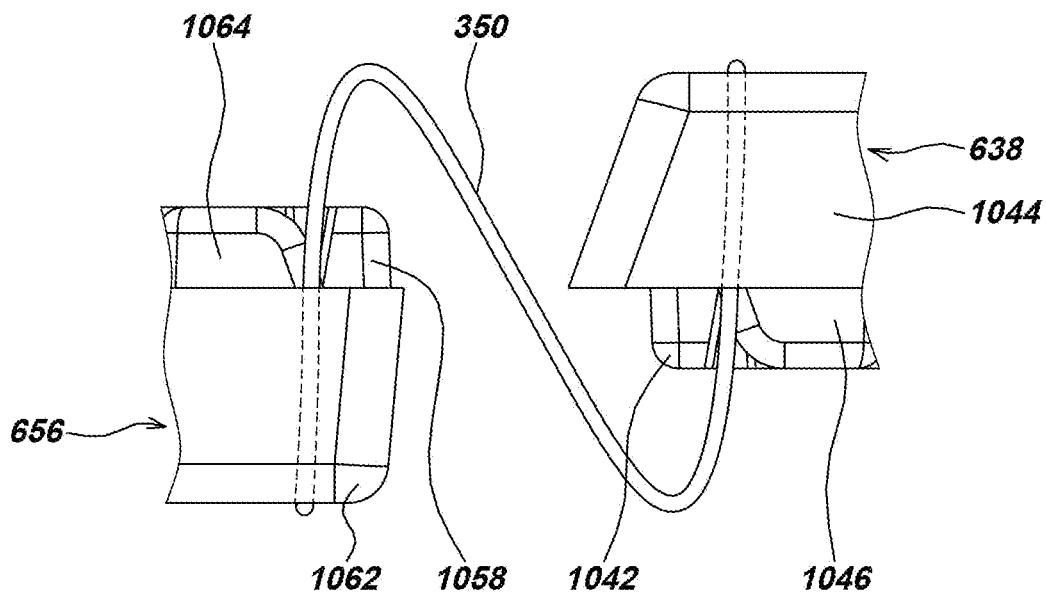
FIG. 10 is a detailed side view of an embodiment of a core spring mounting section, a spring, and a support spring mounting section prior to induction welding.

As illustrated in FIGS. 10 and 11, prior to using induction welding to affix the springs 350, the ends of each of the springs 350 may be snapped into place so that one end of each of the springs 350 may be mounted in the core spring mount section 638 of the actuator core 330 and the opposite ends of the springs 350 may have been mounted within the support spring mounting sections 656 of the ring-shaped support 150. Once the springs 350 are snapped into place and prior to induction welding, the springs 350 may be oriented horizontally in relation to a flat working surface (not illustrated) when the actuator core 330, the springs 350, and the ring-shaped support 150 may be assembled and laid flat on that working surface.

The actuator core 330, the springs 350, and the ring-shaped support 150, once assembled with the induction welding fixture secured beneath, may then be placed upside down within the induction coil 1210, such as is shown in FIG. 12. A downward force 1220 may then applied by hand assembly 1230 to the actuator core 330, forcing it to rest flat against the working surface.

Figure 13:
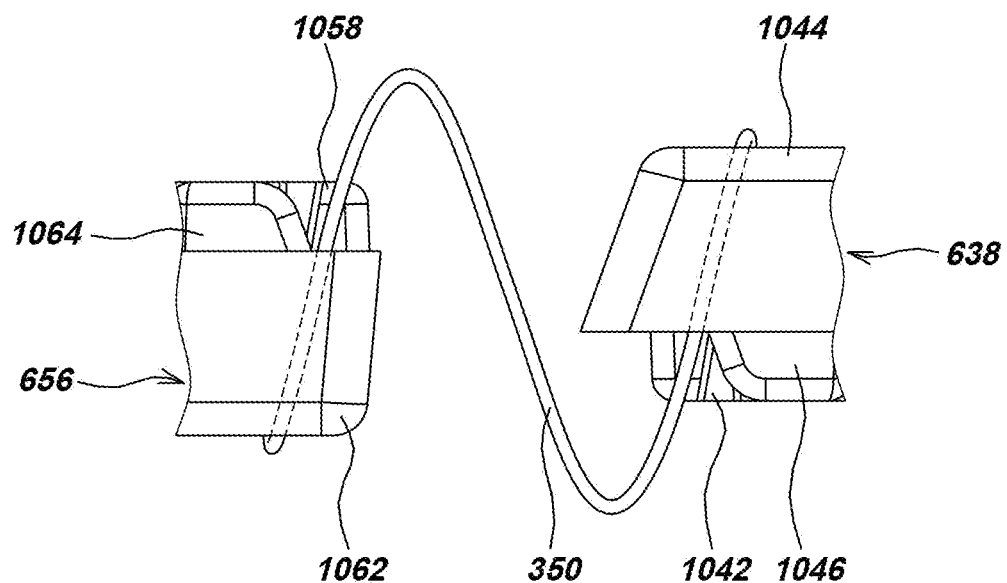
FIG. 13 is a detailed side view of an embodiment of a core spring mounting section, a spring, and a support spring mounting section after induction welding.
Figure 14:
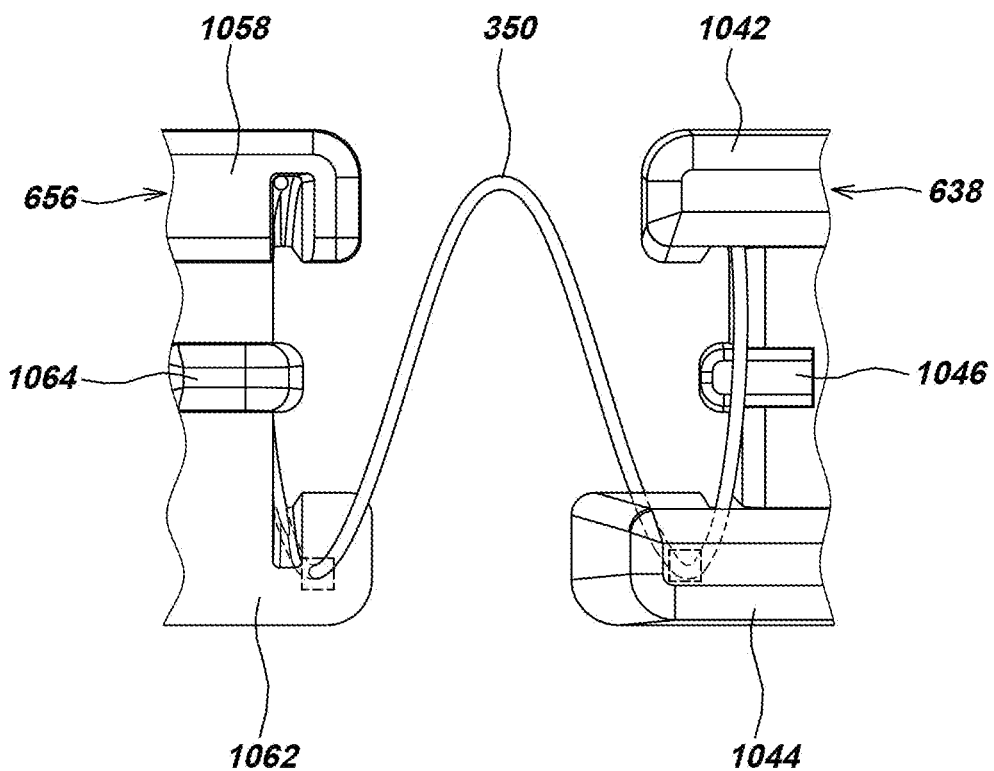
FIG. 14 is a detailed top view of an embodiment of a core spring mounting section, a spring, and a support spring mounting section after induction welding.

Unintentional lateral or twisting may be prevented during application of the downward force 1220 due to the induction welding fixture 810 allowing the spring 350 to be permanently and evenly affixed to the actuator core 330 and the ring-shaped support 150. The tension in the springs 350 from mounting them within the core spring mounting sections 638 and the support spring mounting sections 656 become relaxed, causing them to move forward and outward, as the heated ends of the springs 350 melt into the thermoplastic material (illustrated as dashes in FIGS. 13 and 14) of the core spring end support nub 1042 and the core melt shoulder nub 1044 about one of the springs 350 and the support spring end support nub 1058 and the support melt shoulder nub 1062 on the opposite end of the springs 350. By providing the downward force 1220 on the actuator core 330 during the magnetic induction process, the orientation of each of the springs 350 may be altered from its initial horizontal orientation so that each of the springs 350 are fixed to be angled upwards towards the actuator core 330 as illustrated in FIGS. 13 and 14. Fixing the springs 350 at an angle in this fashion may be used to create a way by which travel of the knob actuator 110 becomes stiffer in vertical displacements but freer in horizontal displacements.

Because the method of magnetic induction provides a low stress, highly aligned means of installation, a more precise centering of the magnets 340 about each of the corresponding ones of the magnetic sensors 170 may be presented that will maximize the available dynamic range of the user interface device 100 and thereby may improve its overall sensitivity and performance. Any known means may be used for positional fixturing during assembly.

Referring back to FIGS. 1-7, the user interface device 100 may include magnetic sensors, such as Hall-Effect or other magnetic sensing devices or magnetometers known or developed in the art to sense position or motion of the magnets. In the exemplary embodiment illustrated in FIGS. 1-7, a plurality of magnetic sensors, such as Hall-Effect devices, may be used for the magnetic sensors 170 in order to sense movement of the magnets 340. The user interface device 100 may use, for example, a plurality of three-axis magnetic sensors such as the integrated circuit (IC) Melexis MLX90333 or MLX90363 sensors or other similar or equivalent sensors or other devices.

In another aspect, the present invention relates to methods of generating and processing data associated with a user interface device, such as user interface device 100. In an exemplary embodiment, a method of processing signals from the magnetic sensors 170 includes a stage of generating a field model for each magnetic sensor 170 in which the signals from each magnetic sensor 170 correspond to a predetermined set of position data. The position data for each of the magnetic sensors 170 may be compared to determine a displacement of the knob actuator element 110 from its released state. An output signal or signals may be generated for transmission to an electronic computing system or other computer, control or other processor or logic-device based system (not illustrated) that represent the displacement of the knob actuator element 110. The signals may be generated in a predetermined format that can be interpreted by the electronic computing system.

The method of processing signals from the magnetic sensors 170 in order to more accurately detect the movement of the knob actuator element 110 may include the stages of generating a center calibration prism including a predetermined set of boundaries of the magnetic field components detected by each magnetic sensor 170 and repeatedly redefining the center calibration prism to auto-zero the released state position. Details regarding methods for processing signals from magnetic sensors may further be found in U.S. patent application Ser. No. 13/214,209, filed Jul. 11, 2011 entitled MAGNETIC SENSING USER INTERFACE DEVICE METHODS AND APPARATUS, the entire disclosure of which is hereby incorporated by reference.

Figure 7:
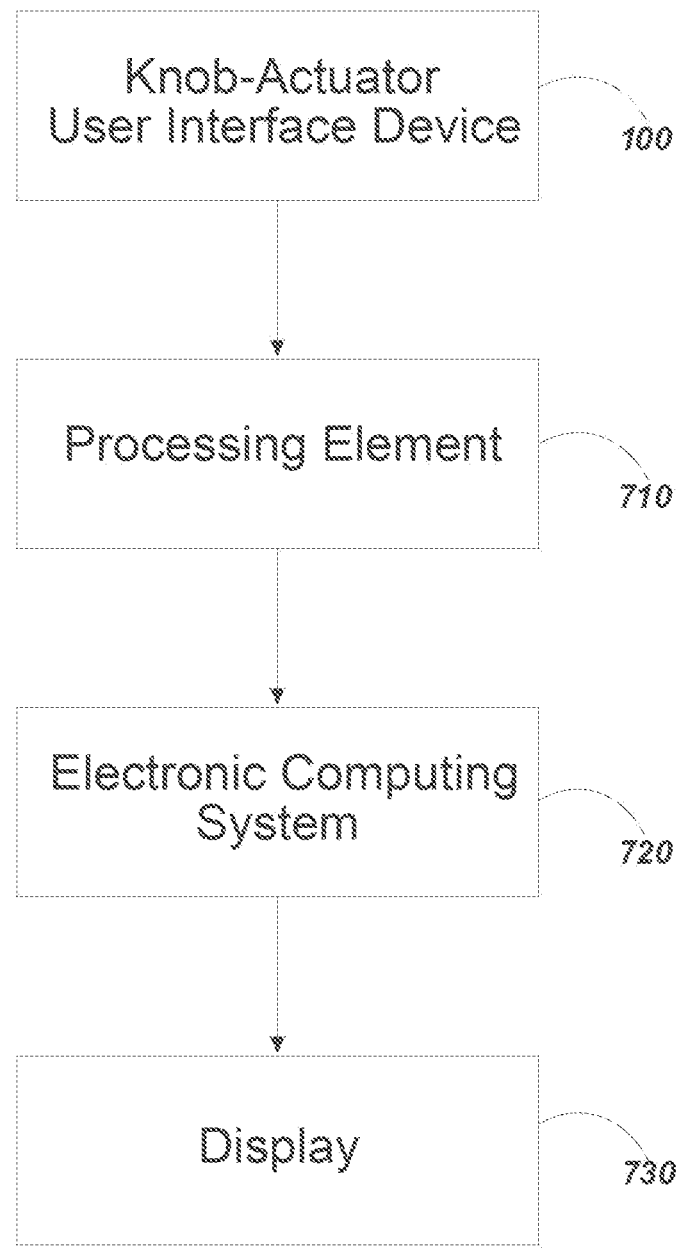
FIG. 7 is a block diagram illustrating details of an embodiment of sensor data processing for the knob-actuator user interface device embodiment of FIG. 1.

Referring again to FIGS. 1-7, the magnetic sensors 170 and the magnets 340 may be operatively positioned so that when the knob actuator element 110, and therefore the actuator core 330 and the magnets 340, are displaced from a released state, the magnetic sensors 170 generate signals in response to the displacement. Such signals generated by the magnetic sensors 170 in response to the displacements may be interpreted by a processing element 710, as shown in FIG. 7, to determine commands to an electronic computing system 720. For example, by tilting the knob actuator element 110 in one direction, the command to the electronic computing system 720 may be to rotate an object in virtual space in an analogous direction. The electronic computing system 720 may then command a display or other visual interface device 730 to show the rotation of the virtual object. The specific command or commands associated with each displacement of the knob actuator element 110 may be different and may be customizable for each particular application.

In an exemplary embodiment, the magnets 340 of the user interface device 100 may be relatively small and may be positioned close to a corresponding one of the magnetic sensors 170. As the magnets 340 are axially magnetized, a mounting distance between each of the magnets 340 and a corresponding one of the magnetic sensors 170 may be less than four magnet diameters when the user interface device 100 is in a released state.

In some embodiments, electromagnets may be used in place of or in additional to permanent magnets. Electromagnets may be formed in a cross-shaped configuration to include two orthogonal dipoles. In some embodiments, a single cross-configured electromagnet and a single three-axis high sensitivity magnetic sensor may be used to provide a highly compact magnetic UID. The two dipoles may be selectively switched to generate a magnetic field for sensing in an electromagnet embodiment.

If the magnets 340 are not round, the mounting distance may be measured at a right angle to the dipole axis. When increasingly larger magnets 340 are used, the magnetic sensors 170 may become more susceptible to measurement saturation of the magnetic field components. Consequently, as the magnetic sensor 170 becomes saturated with the magnetic fields, subtle movements of the knob actuator element 110 and the magnets 340 become less distinguishable by the processing element 710, lessening the degree of sensitivity to such movements. When the magnets 340 are positioned further from the magnetic sensors 170, the relative magnitude of each magnetic field will fall off approximately as the inverse power of three. Therefore, precise measurements of the magnitude and direction of the magnetic field components becomes increasingly more difficult to derive as the magnetic sensors 170 are positioned further from the magnets 340.

In various embodiments, the magnets 340 may be oriented in different ways. For example, in some embodiments, the magnets 340 may be mounted so that the north pole and south pole of each of the magnets 340 are pointing in the same direction as each other of the magnets 340. In alternative embodiments one of the magnets 340 may be oriented such that the magnetic pole facing the corresponding one of the magnetic sensors 170 may be contrary to the other ones of the magnets 340. If the polarity of the contrary one of the magnets 340 is controlled absolutely, it may be used to determine the orientation of the actuator core 330 that contains the magnets 340 and therefore determine the front and back sides of the knob-actuator user interface device 100. Processing algorithms and associated software (not illustrated) may also be used to automatically detect the polarity of the magnets 340 to make this determination of the orientation of the actuator core 330. The magnets 340 could alternatively be rotated, for example, forty-five or ninety degrees from the positions shown.

Once the knob actuator element 110 has been released, the user interface device 100 will re-enter or be restored to a released state. Prior to re-entering a released state, some oscillation of the springs 350 will typically naturally occur. As the oscillation of the springs 350 occurs, the knob actuator element 110, the actuator core 330, and the magnets 340 will typically also oscillate in relation to the magnetic sensors 170. The elastomeric dampener 120 may be used to lessen the degree of oscillation. Care should be exercised when selecting the specific materials used in the elastomeric dampener 120 as, in some applications, the oscillating of the magnets 340 over the magnetic sensors 170 may be used to indicate a new released state to the processing element 710. Furthermore, certain gestures used with the knob actuator element 110 may indicate specific commands to the electronic computing system 720. For instance, the oscillation caused by flicking a finger over the knob actuator element 110 may, for instance, indicate to the processing element 710 as a scrolling type movement within the electronic computing system 720.

In yet other applications, user interactions with the user interface device 100, such as tapping or double tapping on the knob actuator element 110, may indicate a click or double click type pushbutton control commonly associated with a computer mouse type device (not illustrated). Flicking of the knob actuator element 110 may indicate a scrolling action in the indicated direction. In such applications, a partial dampening of the oscillation may still be desirable. In applications where further dampening of the oscillation may be preferred, foam (not illustrated) or more robust dampening materials (not illustrated) may be used.

Figure 15:
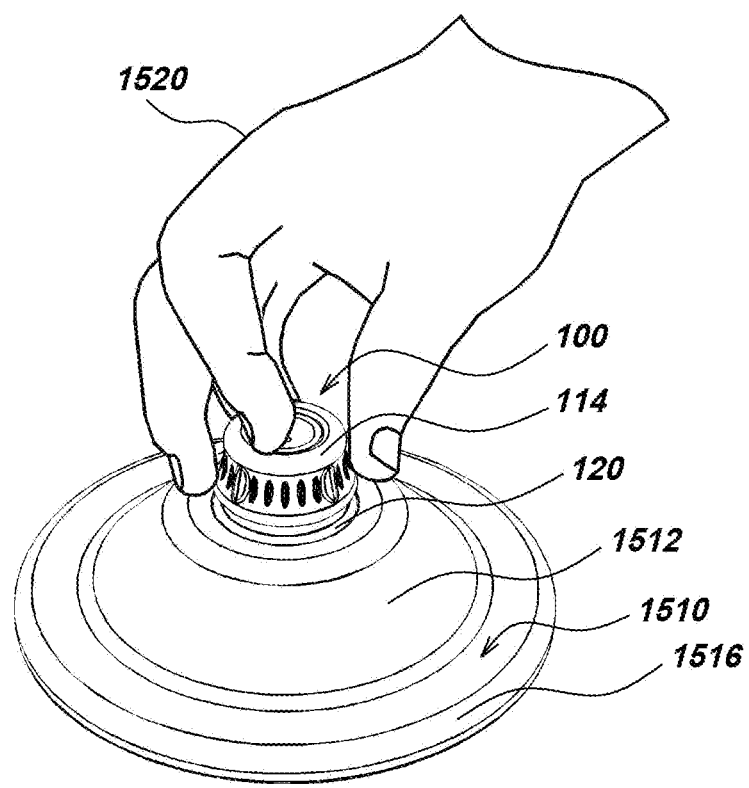
FIG. 15 is an isometric view of the hand of a user manipulating the knob-actuator user interface device of FIG. 1, which is shown for example purposes mounted in an embodiment of a device case.
Figure 16:
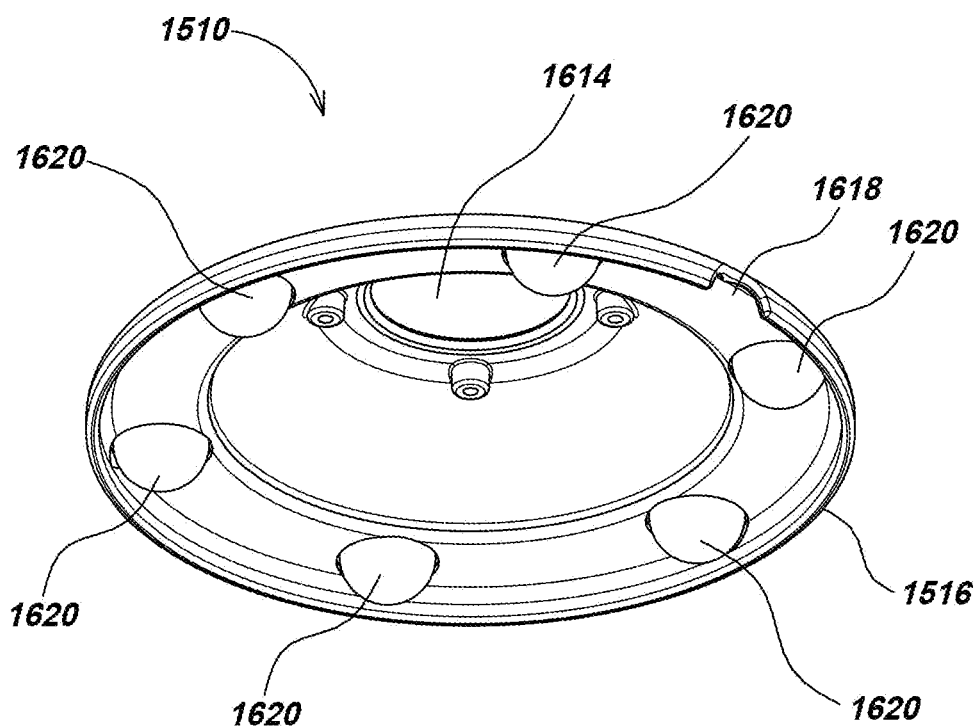
FIG. 16 is an isometric view of the device case taken from the underside thereof and without the knob-actuator user interface device mounted therein.

Referring to FIGS. 15-16, the screws 140 of FIG. 1 used to mount the PCB 160 to the ring-shaped support 150 are of sufficient length to pass through the support mounting post screw holes 668 and protrude from the top of the cylindrical support mounting posts 166. The extra length of the screws 140 permits the user interface device 100 to be mounted within a device case 1510. The device case 1510 may be composed of a conical case section 1512 that encompasses the actuator core 330, the ring-shaped support 150, and the PCB 160. A device case hole 1614 may be formed about the top of the device case 1510 allowing the middle actuator section 216 of the knob actuator element 110 to extend out from within the device case 1510. The elastomeric dampener 120 may be dimensioned to fill the gap between the middle actuator section 216 and the device case hole 1614 preventing foreign elements such as moisture from entering the user interface device 100. A device case brim section 1516 may be formed about the bottom of the conical case section 1512. The device case brim section 1516 provides a means by which a user's hand 1520 may allow the user to partially rest fingers on the device case brim section 1516, holding the user interface device 100 stationary in relation to the work surface during use. A wiring gap 1618 may be formed along the outer lip of the device case brim section 1516 allowing a means of functionally connecting the PCB 160 to the electronic computing system 720 by a wiring connector (not illustrated) such as a USB connector. In some embodiments, wireless means of transmitting data may be used when coupled with an appropriate power source. A series of elastomeric feet 1620 may be fixed underneath the device case brim section 1516 to further aid in keeping the user interface device 100 stationary in relation to the work surface.

Figure 17:
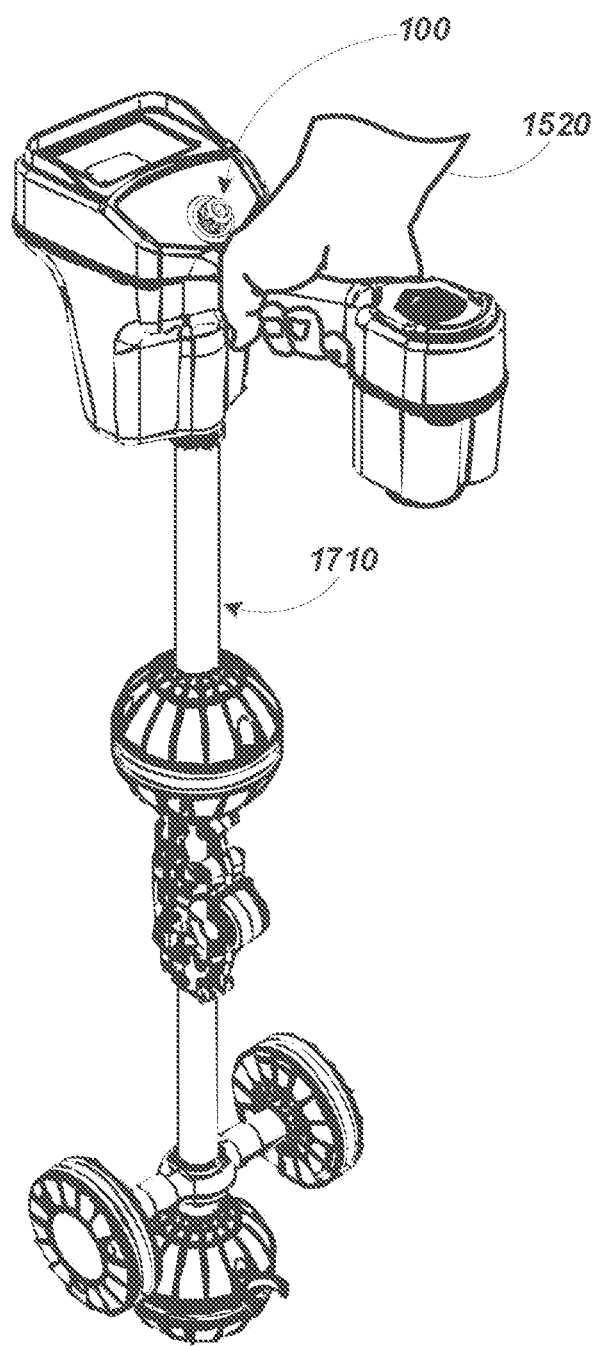
FIG. 17 is an isometric view of the knob-actuator user interface device embodiment of FIG. 1 which is show for example purposes mounted in an embodiment of a man portable buried utility locator.
Figure 18:
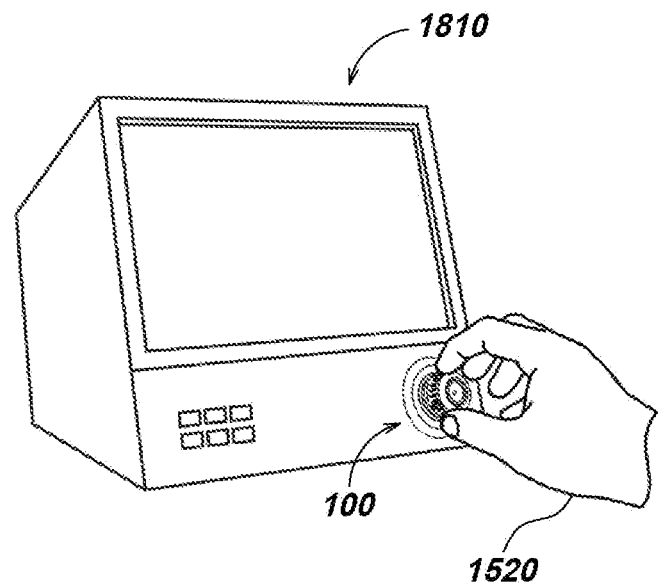
FIG. 18 is an isometric view of an embodiment of a knob-actuator user interface device which is shown for example purposes mounted in an embodiment of a camera control device.
Figure 19:
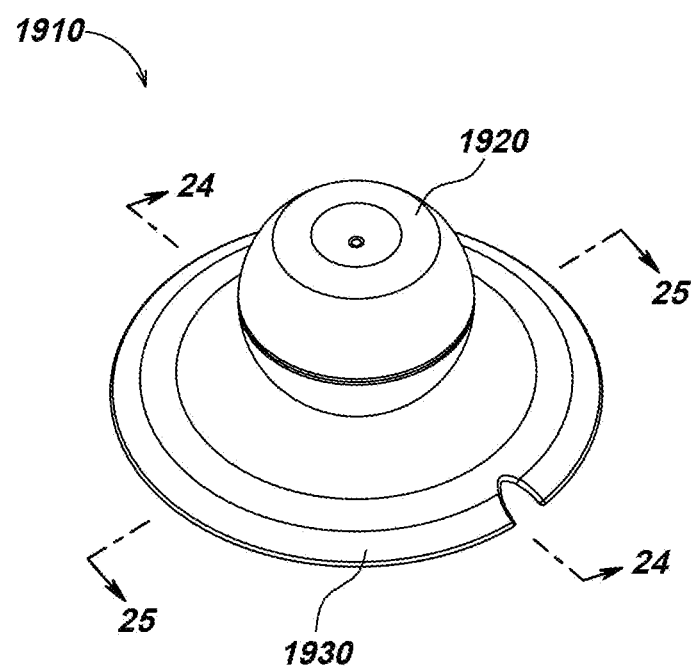
FIG. 19 is an isometric view of an alternative embodiment of a user interface device with a deformable actuator.

Referring to FIGS. 17 and 18, a user interface device 100 may be mounted directly into various other devices providing control to the user including, but not limited to, a man portable buried utility locator 1710, as shown in FIG. 17, a camera control device 1810, as shown in FIG. 18, or in other devices incorporating computer processing and/or control functionality. For example, a man portable buried locator may be of the types described in U.S. Pat. Nos. 7,009,399; 7,136,765; 7,332,901; 7,336,078; 7,443,154; 7,498,797; 7,498,816; 7,518,374; 7,619,516; 7,733,077; 7,741,848; 7,755,360; and 7,830,149, the entire contents of which are hereby incorporated by reference herein in their entirety.

By including one of the user interface devices 100 in a portable buried utility locator 1710, as commonly used in locating and tracing buried utilities, the user's hand 1520 may be used to select or change menus without the use of the opposite hand (not illustrated). The camera control device 1810, as commonly used with pipe inspection systems, will allow the user control over the camera control device 1810.

In some embodiments, a user interface device may include a deformable or squeezable element, which may be used for providing additional signaling and/or control functionality. For example, in an exemplary embodiment, a user interface device includes a deformable actuator element, a deformation element coupled to the deformable actuator element to provide an indication of deformation of the deformable actuator element from a non-deformed position, a displacement element coupled to the deformable actuator element to provide an indication of displacement of the deformable actuator element from a released state position, and a sensing element positioned in proximity to the deformation element and displacement element. The sensing element may be configured for generating a first signal representative of a displacement of the deformable actuator element from the released state position in one or more dimensions, and a second signal representative of a deformation caused by a squeezing force applied to the deformable actuator.

Examples of embodiments of such a deformable user interface device are illustrated in FIGS. 19-31, which illustrate an alternative embodiment of a user interface device 1910 having a deformable or squeezable actuator element 1920. The deformable actuator element 1920 may be configured to be deformed during use, such as by a squeezing force applied by a user, such as from the user's hand, with the deformation used in providing a deformation signal associated with the applied squeezing force. In addition, the deformable actuator element 1920 may be configured to allow movement and displacement, which may be used to generate a displacement signal corresponding with the movement and/or displacement, which may be rotational, translation, and/or other positional movement.

In an exemplary embodiment, both the deformation and displacement signals may be provided to another component, device, or system, such as an electronic computing system. The first and second signals may be combined, multiplexed, provided in parallel, provided sequentially, and/or otherwise aggregated or combined to provide an output signal including output data to the other component, device, or system based on both applied force, resulting in deformation, as well as displacement, resulting in rotation, translation, and/or other positional movement.

Figure 20:
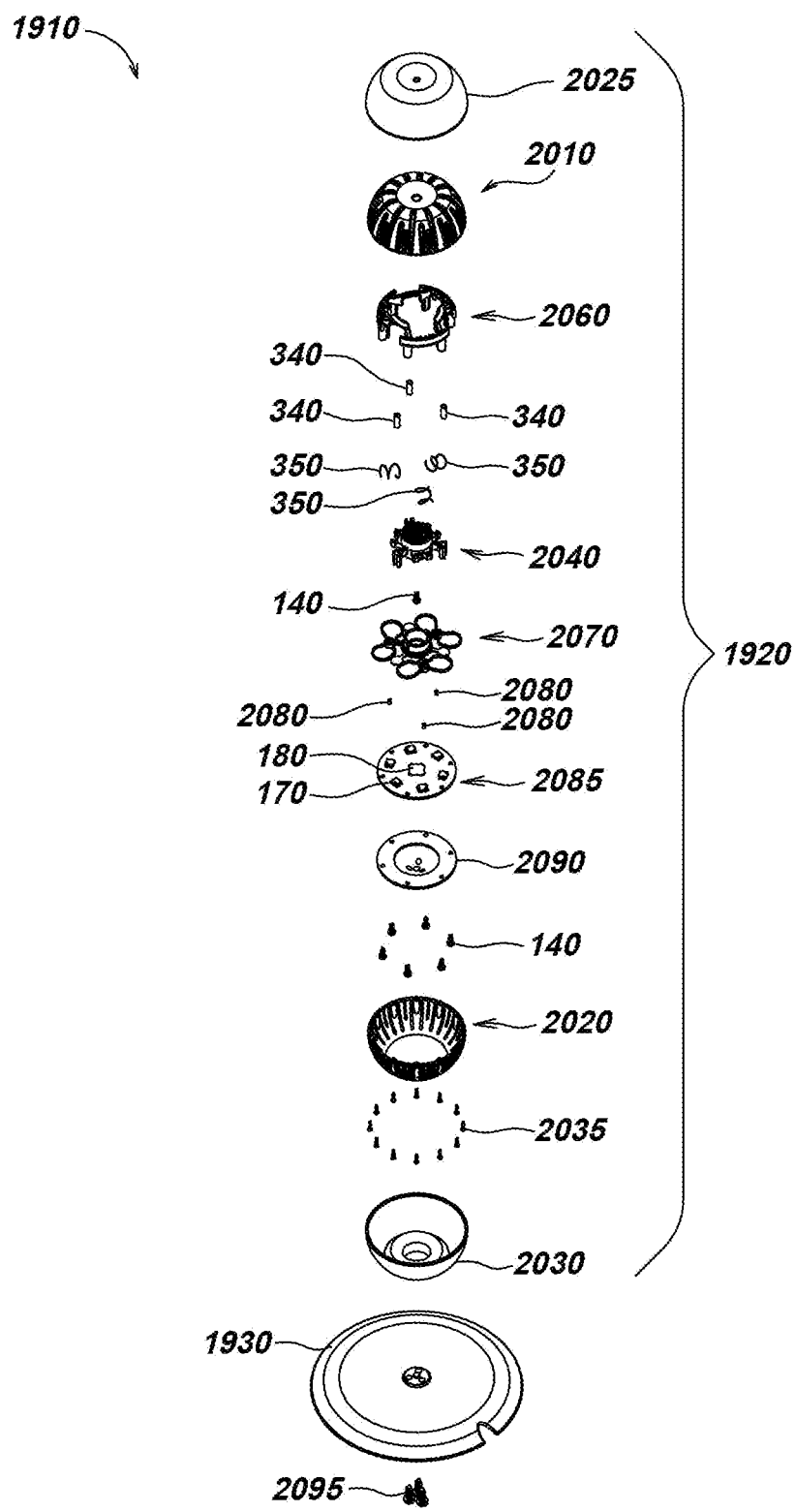
FIG. 20 is an exploded isometric view of the user interface device embodiment of FIG. 19 taken from the top thereof.
Figure 21:
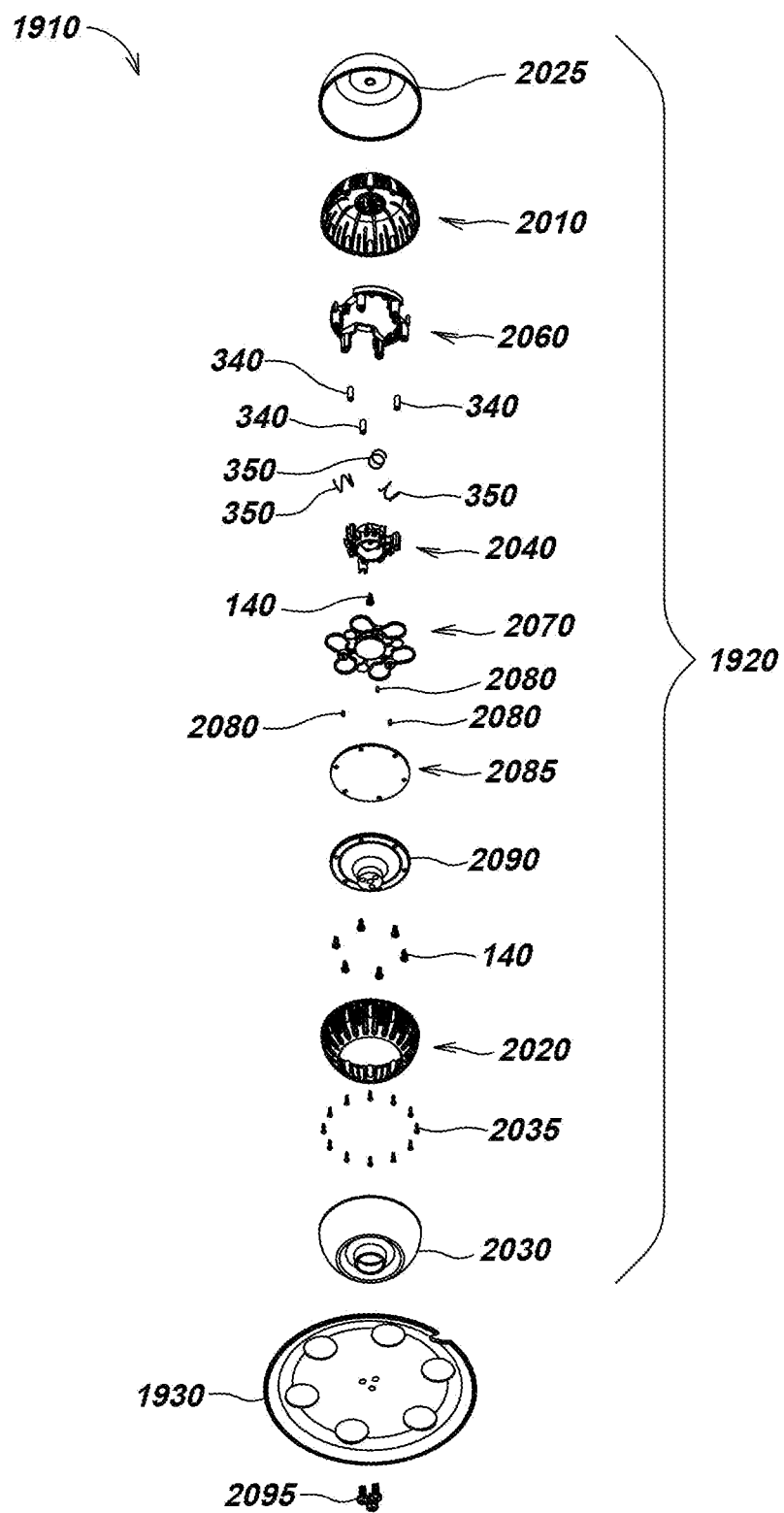
FIG. 21 is an exploded isometric view of the user interface device embodiment of FIG. 19 taken from the bottom thereof.
Figure 22:
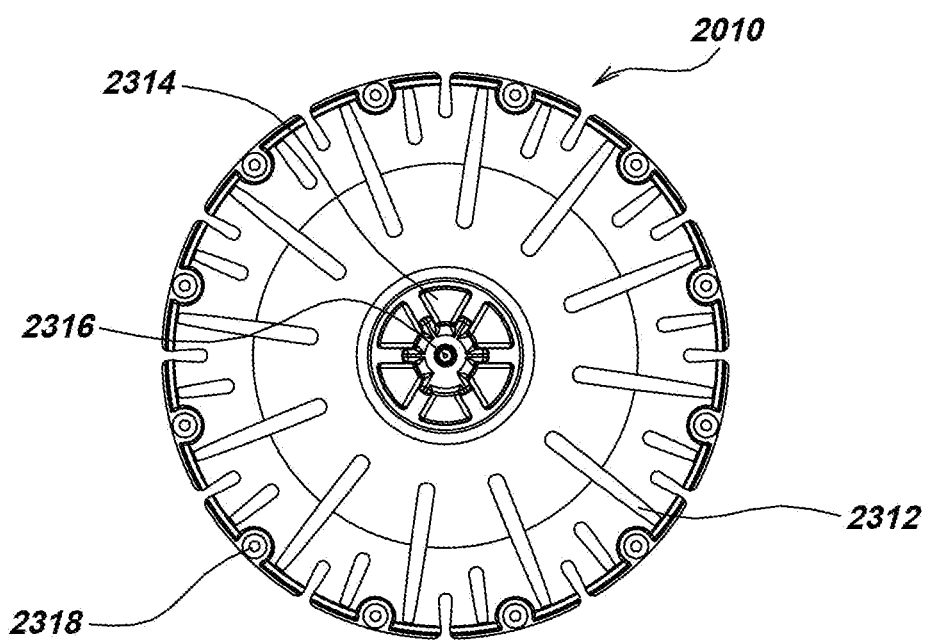
FIG. 22 is a detailed bottom view of an embodiment of a top actuator half.

Turning to FIGS. 20-22, in one embodiment, the deformable actuator element 1920 may be largely spherical in shape with a flattened top and may be further composed of a top actuator half 2010 and a bottom actuator half 2020 which are covered by a top half rubber over-mold 2025 and a bottom half rubber over-mold 2030 respectively. The top actuator half 2010 may be largely dome shaped with a series of top grooves 2312 (FIG. 23), allowing the top actuator half 2010 to become flexible and be squeezed and hence deformed by a user.

Figure 23:
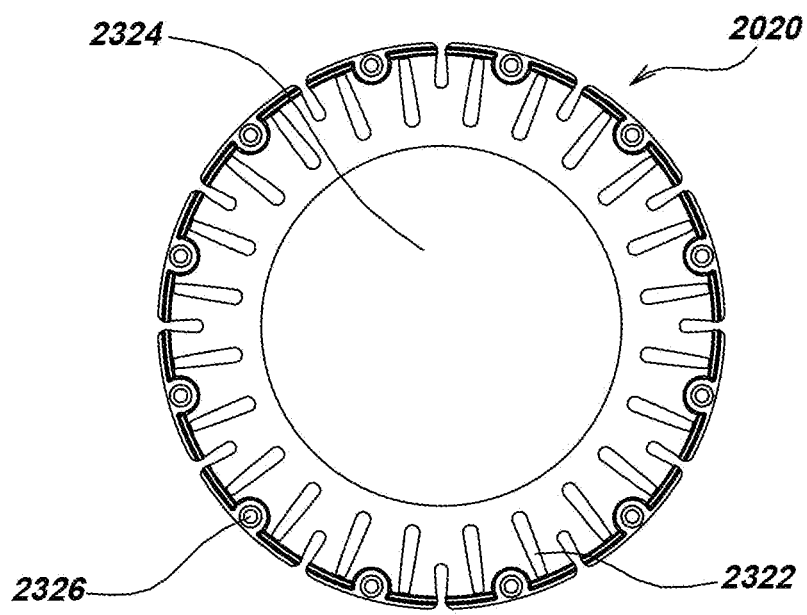
FIG. 23 is a detailed top view of an embodiment of a bottom actuator half.
Figure 24:
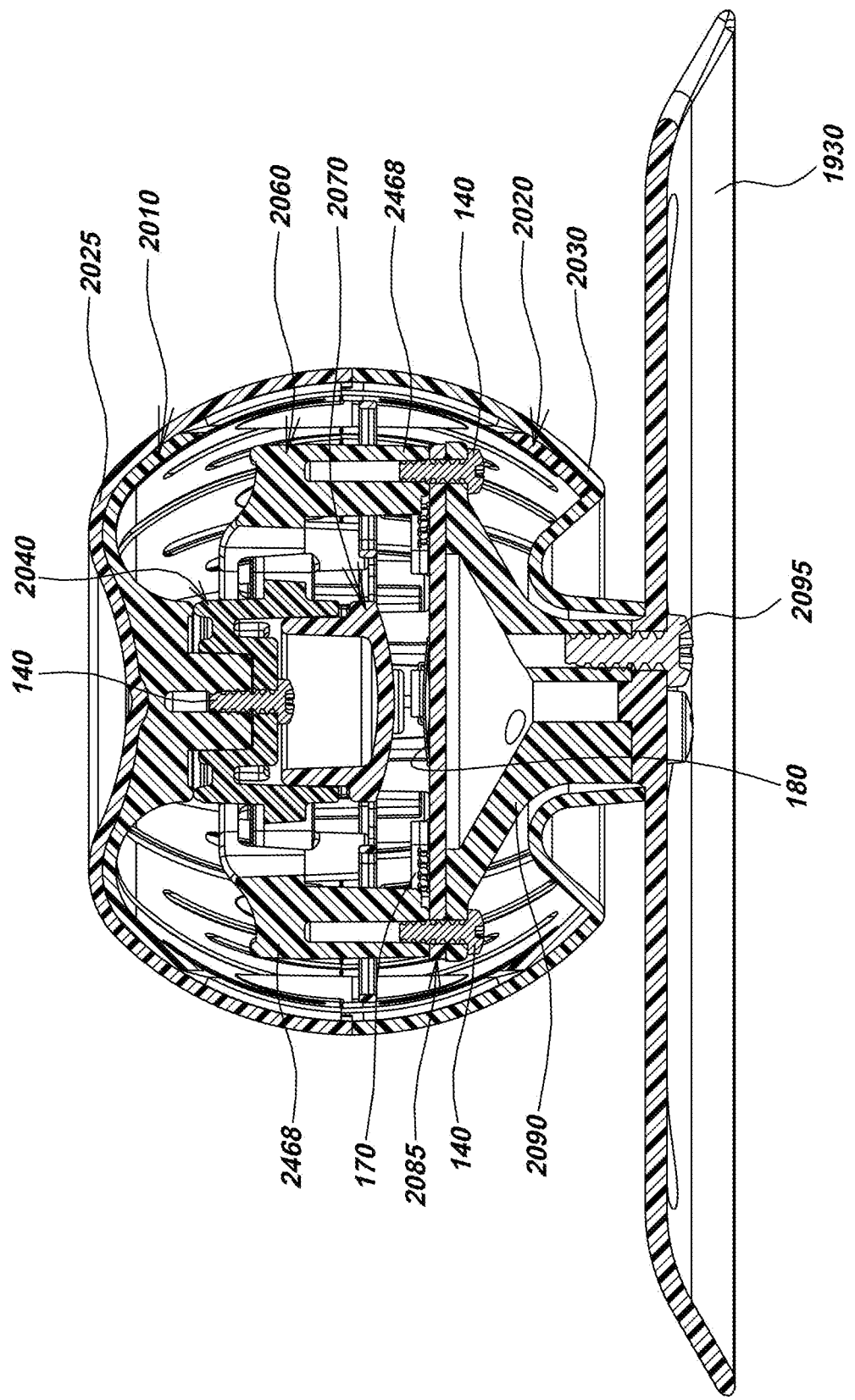
FIG. 24 is a vertical sectional view of the user interface device embodiment of FIG. 19 taken along line 24-24 of FIG. 19.
Figure 25:
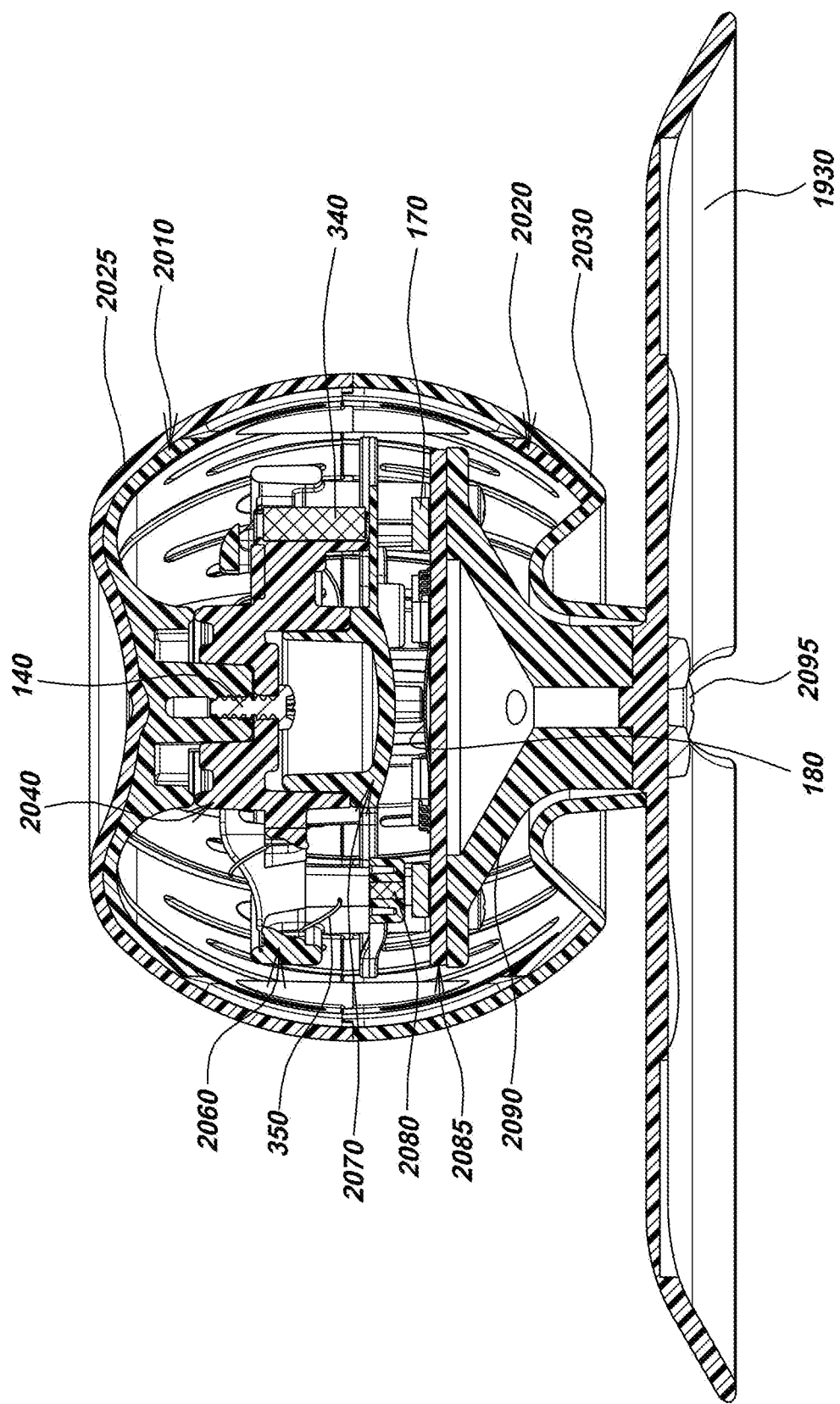
FIG. 25 is a vertical sectional view of the user interface device embodiment of FIG. 19 taken along line 25-25 of FIG. 19.
Figure 26:
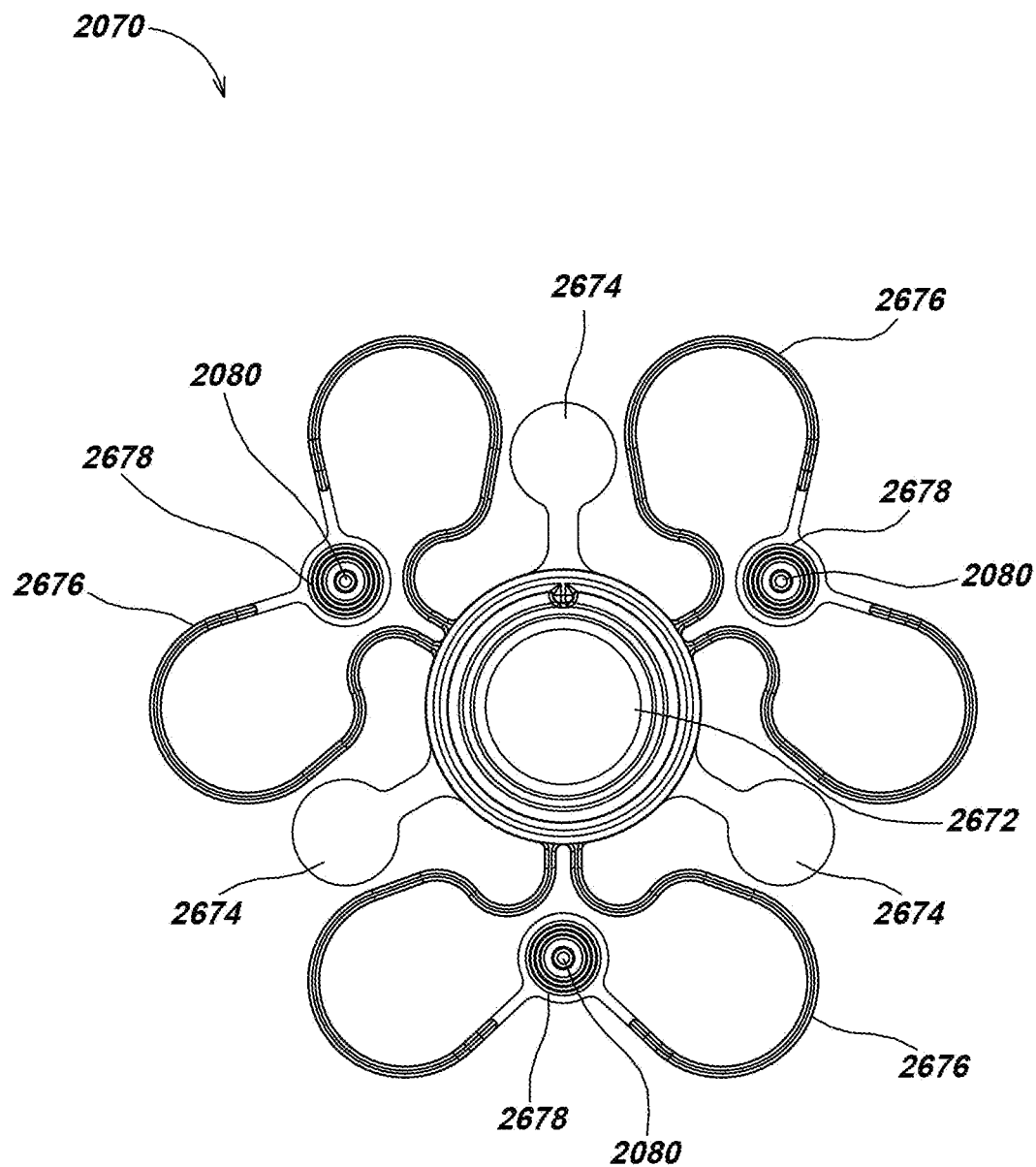
FIG. 26 is an enlarged top view of an embodiment of a press-float.

Continuing to FIG. 23, by covering the outer surface of top actuator half 2010 in FIG. 20 with the top half rubber over-mold 2025 providing additional grip may be provided to a user. Within the top of the dome of the top actuator half 2010, an actuator keying element 2314, which may be uniquely patterned, and a top actuator top screw hole 2316 may be formed. A series of top actuator side screw holes 2318 may also be formed around the inside of the edge of the top actuator half 2010 and used to connect the top actuator half 2010 to the bottom actuator half 2020 by means of a series of small screws 2035.

The bottom actuator half 2020 may be formed largely as an upside down dome with a series of bottom grooves 2322, allowing the bottom actuator half 2020 to also become pliant and be squeezed by a user. A circular opening 2324 may be formed about the bottom of the bottom actuator 2020, and there may be a series of bottom actuator side screw holes 2326 that align with the top actuator side screw holes 2318 in assembly. The bottom half rubber over-mold 2030 that covers the outer surface of the bottom actuator half 2020 may also be designed to fit within the circular opening 2324 to aid in dampening unwanted movements of the deformable actuator element 1920.

Figure 27:
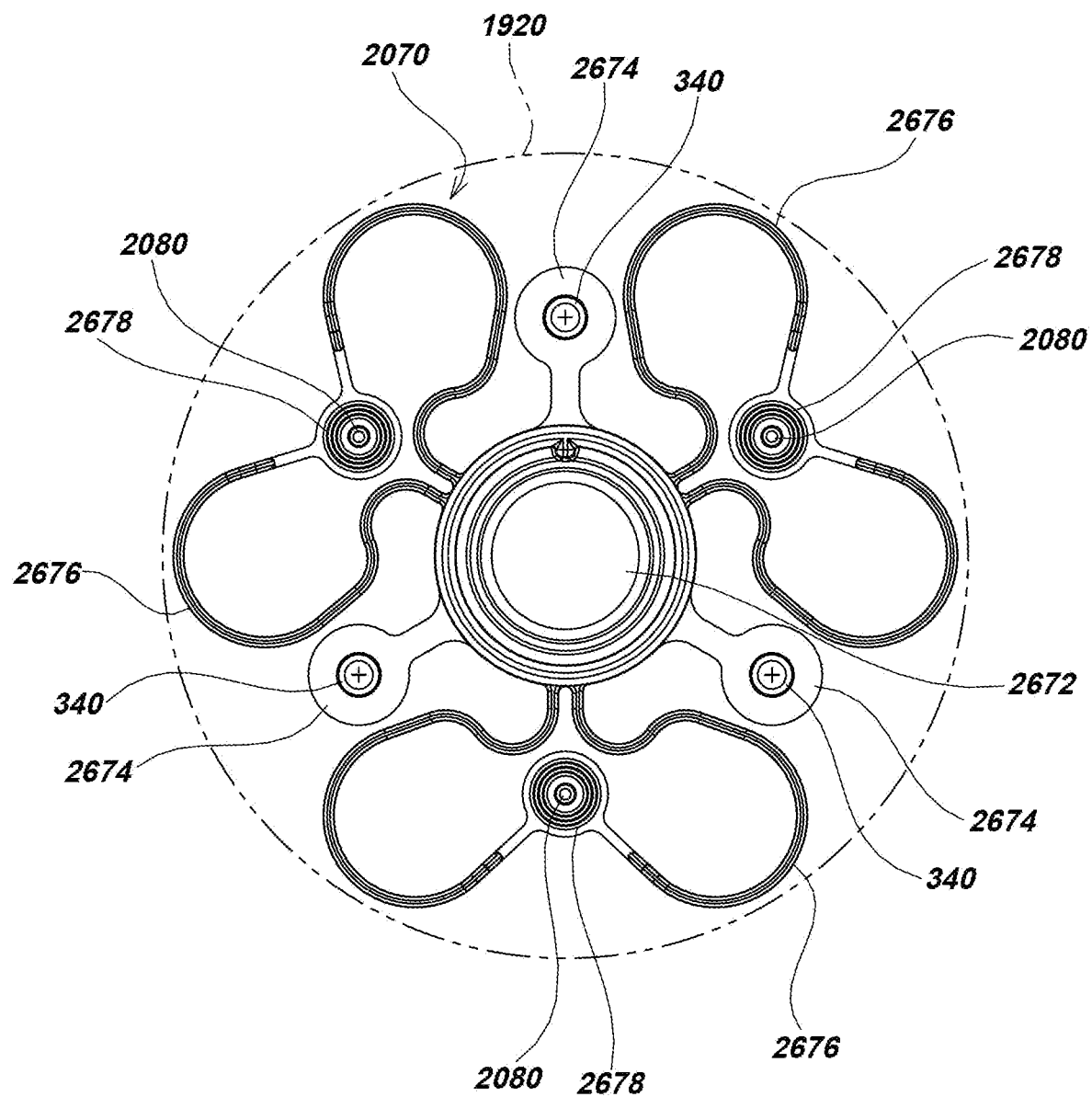
FIG. 27 is a detailed top view of an embodiment of a press-float demonstrating the spatial relationship to the magnets and a deformable actuator when in a released state.
Figure 28:
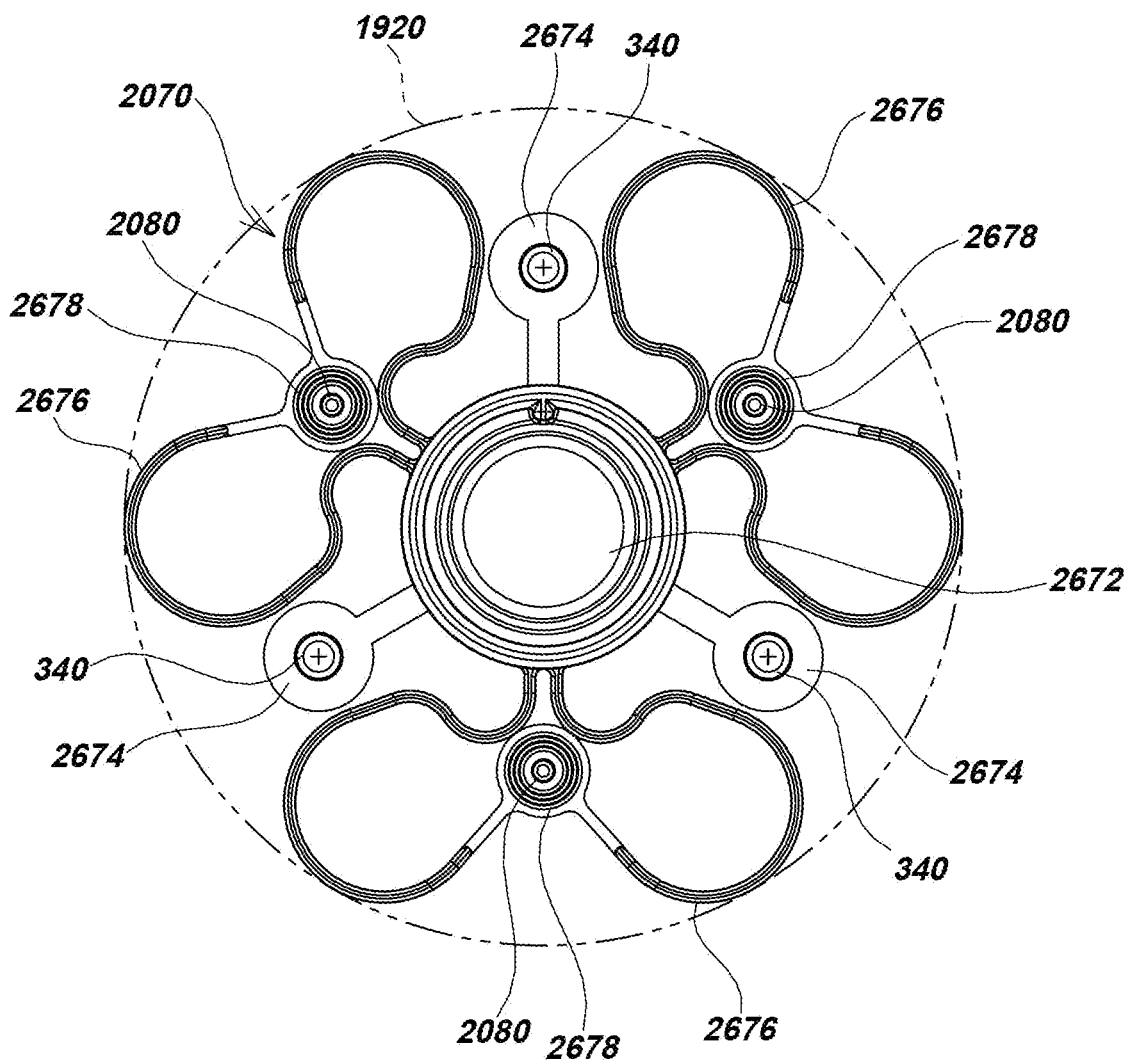
FIG. 28 is a detailed top view of an embodiment of a press-float demonstrating the spatial relationship to the magnets and a deformable actuator when a squeeze force is applied.
Figure 29:
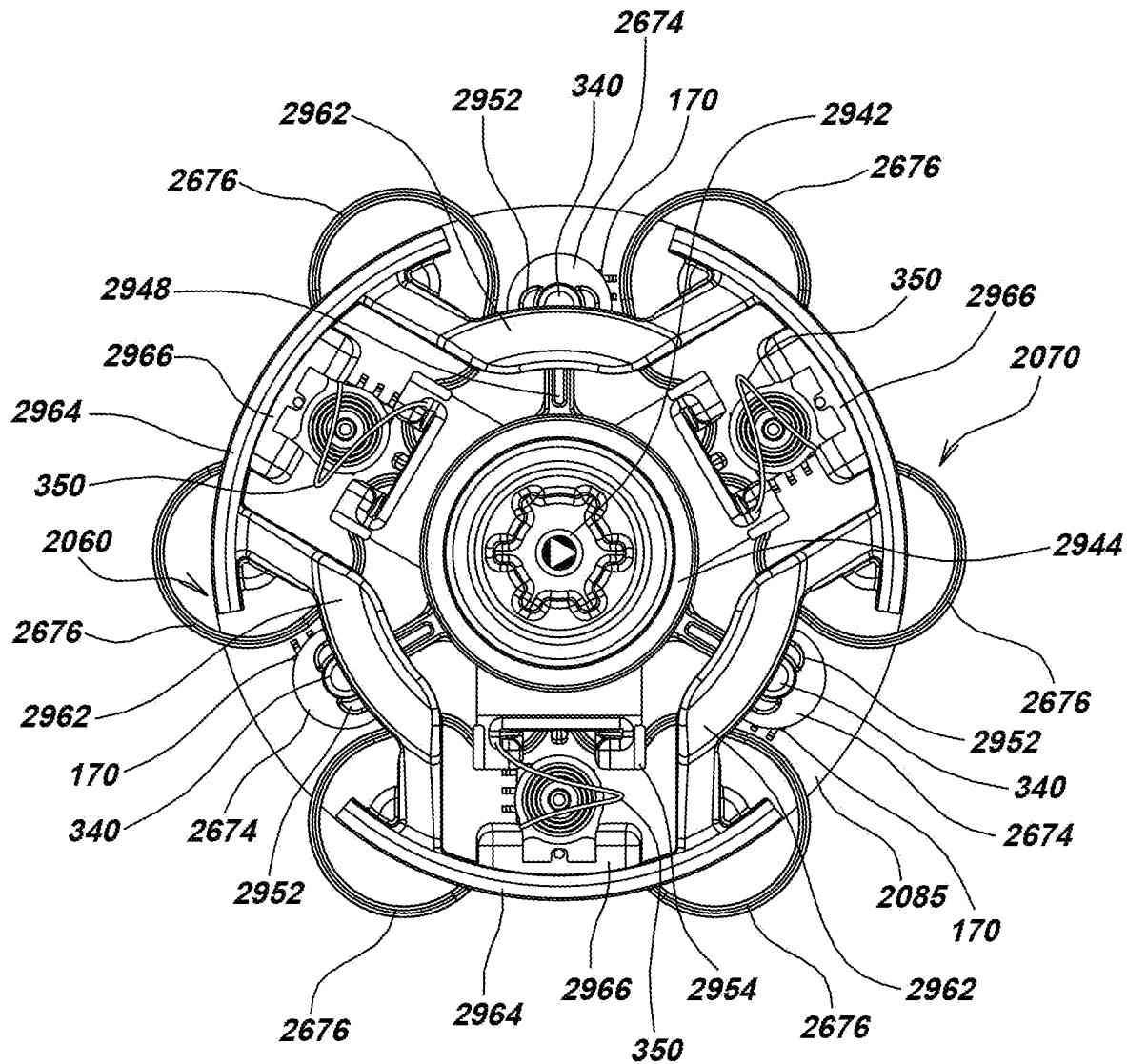
FIG. 29 is an enlarged top view of an embodiment of a core-join, a ring-join, a press-float, and a PCB.

Referring to FIGS. 20-31, the top actuator half 2010 may connect to a core-join element 2040, as shown in FIG. 20, by using the actuator keying element 2314 which fits within a core-join top keying element 2942, as illustrated in FIG. 29, on top of a cylindrical core-join body 2944. The actuator keying element 2314 and the core-join top keying element 2942 create a way by which the core-join element 2040 secures to the top actuator half 2010 during certain displacements, such as rotations, of the deformable actuator element 1920.

A core-join screw hole 3046 may be formed through the central vertical axis of the cylindrical core-join body 2944 that aligns with the top actuator top screw hole 2316. The core-join screw hole 3046 and the top actuator top screw hole 2316 create a way by which the core-join element 2040 may be secured to the top actuator half 2010 by the screw 140. A series of three core-join arms 2948 may extend outward concentrically from the cylindrical core-join body 2944 that are evenly spaced from one another. Each of the core-join arms 2948 may be designed with a core-join magnet mount 2952 to hold one of the magnets 340. Between each of the core-join arms 2948, a core-join spring mount 2954 may be formed. The core-join spring mount 2954 may be shaped and function in retaining the end of one of the springs 350 in the same fashion as the core spring mounting sections 638, as shown in FIG. 6, of the user interface device 100.

In some embodiments, a series of cushioning elements, such as elastomeric bumpers (not illustrated) may be mounted to the surface of the core-join arms 2948 and the core-join spring mounts 2954 to cushion the components from scraping during displacements of the deformable actuator element 1920. A bottom core-join keying feature 3056 may be formed within a hollow section in the bottom of the cylindrical core-join body 2944.

Figure 30:
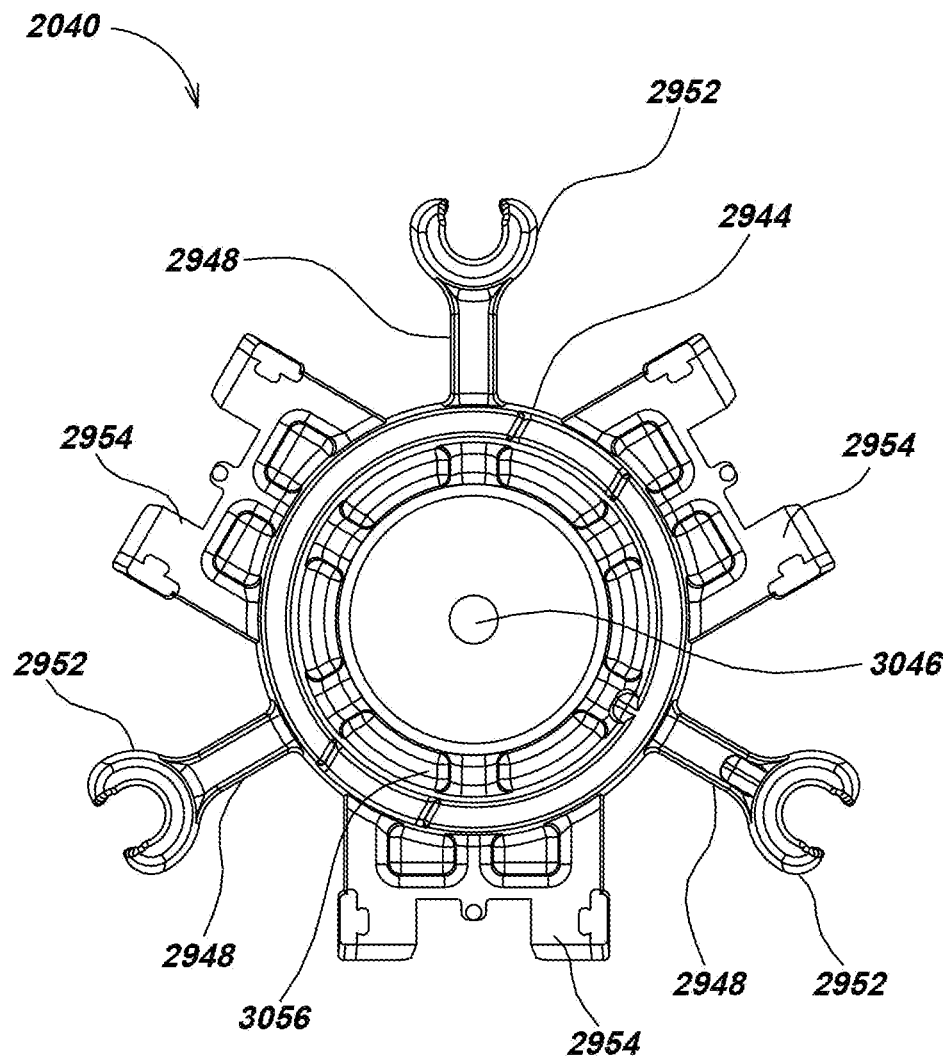
FIG. 30 is a bottom view of a core-join element.
Figure 31:
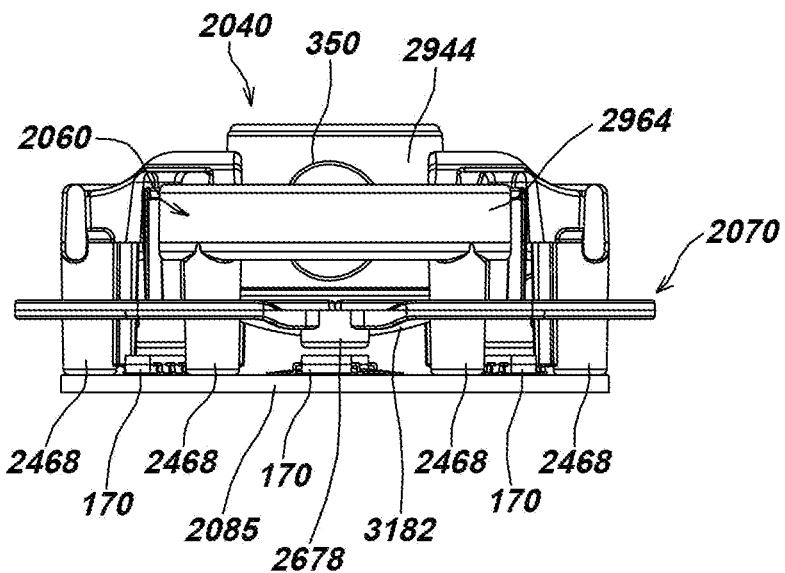
FIG. 31 is an enlarged side view of an embodiment of a core-join, a ring-join, a press-float, and a PCB.

A ring-join element 2060, as illustrated in FIGS. 29-31, may be concentrically positioned to circumscribe the core-join element 2040 in such a way that the core-join element 2040 may be permitted limited movement in tilting, side-to-side, front-to-back, up-and-down and rotations and permutations of each of these directions within the ring-join element 2060. The travel permitted to the core-join element 2040 may be limited by a series of generally C-shaped ring-join limiting sections 2962 formed along an outer ring-join section 2964. The ring-join limiting sections 2962 may be formed concentrically about the inward facing side of the outer ring-join sections 2964 and evenly spaced from one another.

In an exemplary embodiment, there may be a total of three of the ring-join limiting sections 2962 configured so that one of the ring-join limiting sections 2962 substantially encircles each one of the core-join magnet mounts 2952. Dimensioning of the ring-join limiting sections 2962 will control the amount of travel permitted to the core-join element 2040 and therefore the deformable actuator element 1920. Between each of the ring-join limiting sections 2962, a ring-join spring mount 2966 may be formed such that the end of each one of the springs 350 may be mounted to a corresponding one of the ring-join spring mounts 2966. The ring-join spring mount 2966 may be shaped and functions in retaining the end of one of the springs 350 in the same fashion as the support spring mounting sections 656, as shown in FIG. 6, of the user interface device 100. A series of ring-join mounting legs 2468 may be formed so that one of the ring-join mounting legs 2468 extends from below each corner of the outer ring-join sections 2964.

In addition, user interface device 1910 may include a deformation element for use in sensing applied squeezing or other deformation forces, such as through user squeezing, resulting in corresponding deformation of the deformable actuator. In one embodiment, the deformation sensing element may include a press-float element 2070, such as illustrated in further detail in FIGS. 26-28, which may be configured with a cylindrical press-float body 2672 dimensioned to snap into place within the hollow section of the cylindrical core-join body 2944 and shaped to secure to the bottom core-join keying feature 3056. By securing the cylindrical press-float body 2672 to the bottom core-join keying feature 3056, the press-float element 2070 may be secured to the core-join element 2040, and thereby the top actuator half 2010 during certain displacements, such as rotations, of the deformable actuator element 1920.

A series of three magnet mount rests 2674 may extend concentrically from the cylindrical press-float body 2672, one along the same direction as each of the core-join arms 2948 so that the bottom of each one of the core-join magnet mounts 2952 rests on the top surface of one of the magnet mount rests 2674. Between each of the magnet mount rests 2674 may be formed a press-float arm structure 2676. Each of the press-float arm structures 2676 may be formed by two separate arms that branch outward and loop back to connect in a central location at a press-float magnet holder 2678. In assembly, each arm of the press-float arm structures 2676 may loop around one of the ring-join mounting legs 2468. The press-float arm structures 2676 may be composed of sufficiently pliant material such that they may bend and flex when force is applied by a user.

Each of the press-float magnet holders 2678 may be designed to accommodate a small magnet 2080. The series of press-float arm structures 2676 creates a way by which, during normal lateral, up and down, and rotation displacements of the deformable actuator element 1920 the small magnets 2080 and the magnets 340 may be displaced in similar directions and orientations. The press-float 2070 may be further formed with a press-float switch press 3182 shaped as an upside down dome on the bottom of the cylindrical press-float body 2672.

In FIGS. 27 and 28, the spatial relationship of the press-float element 2070, and thus the press-float arm structure 2676 and the press-float magnet holder 2678 containing the small magnets 2080, relative to the magnets 340, which may be part of the displacement element, and the sides of the deformable actuator element 1920 (shown as dotted lines in FIGS. 27 and 28) change when a squeeze type force is applied to the deformable actuator element 1920. For example, when the deformable actuator element 1920 is squeezed, the sides of the deformable actuator element 1920 may contact the press-float arm structures 2676 causing displacements of each of the small magnets 2080 relative to the other ones of the small magnets 2080 and to the magnets 340. Sufficient space should also be provided between the press-float arm structures 2676 and the deformable actuator element 1920 so when a user grips the deformable actuator element 1920 unintentional displacements of the small magnets 2080 similar to that caused be a squeezing force may be avoided.

Each of the small magnets 2080 and the magnets 340 may correspond to one of the magnetic sensors 170 on a PCB 2085. In the user interface device 1910, a total of six of the magnetic sensors 170 may be used. The magnetic sensors 170, the small magnets 2080, and the magnets 340 may be operatively positioned so that when the deformable actuator element 1920, and therefore the core-join element 2040, the magnets 340, the press-float element 2070, and the small magnets 2080, are displaced from a released state, the magnetic sensors 170 generate signals in response to the displacement. Such signals generated by the magnetic sensors 170 in response to the displacements may be interpreted by the processing element 710, as shown in FIG. 7, to determine commands to the electronic computing system 720 (and/or to other coupled processor and/or control systems). The small magnets 2080, in particular, may be positioned close to the corresponding ones of the magnetic sensors 170 to increase sensitivity to displacements of the deformable actuator 1920. When a squeeze type force is applied to the deformable actuator element 1920, the small magnets 2080 will move relative to the magnets 340. This type of displacement will generate signals to the processing element 710 that may be used to determine a specific command at the electronic computing system 720, such as the selection of a menu item in virtual space.

In some embodiments, a quick squeeze and release may be used to indicate a command similar to a click of a mouse commonly used with computers. Two quick squeezes may be used to indicate a double click or the action of squeezing and holding the deformable actuator 1920 may indicate a command similar to the click and drag also commonly used with computers. In other embodiments, these various displacements and squeezes may be customizable for each application of the user interface device 1910.

One of the mechanical dome switches 180 may be mounted centrally on the PCB 2085 so that when a sufficient downward force is applied to the deformable actuator element 1920, the press-float switch press 3182 will press into the mechanical dome switch 180 providing the user tactile feedback in the form of a click. In embodiments where mechanical dome switch 180 is used in conjunction with an electrical contact (not illustrated), pushbutton type control may also be provided to the user. In alternative embodiments, multiple mechanical switches (not illustrated) may also be used to provide several instances of this pushbutton type control.

A PCB mounting platform 2090 may be positioned below the PCB 2085. The PCB mounting platform 2090 may be formed with a narrow stem that fits through the circular opening 2324 of the bottom actuator half 2020 and widens to support the PCB 2085. By means of the screws 140, the PCB mounting platform 2090 secures to the bottom of the PCB 2085 and to the ring-join mounting legs 2468. A base support 1930 may be secured again by a set of large screws 2095 to the bottom of the PCB mounting platform 2090 in order to aid in holding the base support 1930, the PCB mounting platform 2090, the PCB 2085 with the magnetic sensors 170, and the ring-join element 2060 stationary in relation to a work surface (not illustrated). Access for a cable (not shown) may be provided in the PCB mounting platform 2090 to connect the user interface device 1910 to a computing device.

Figure 32:
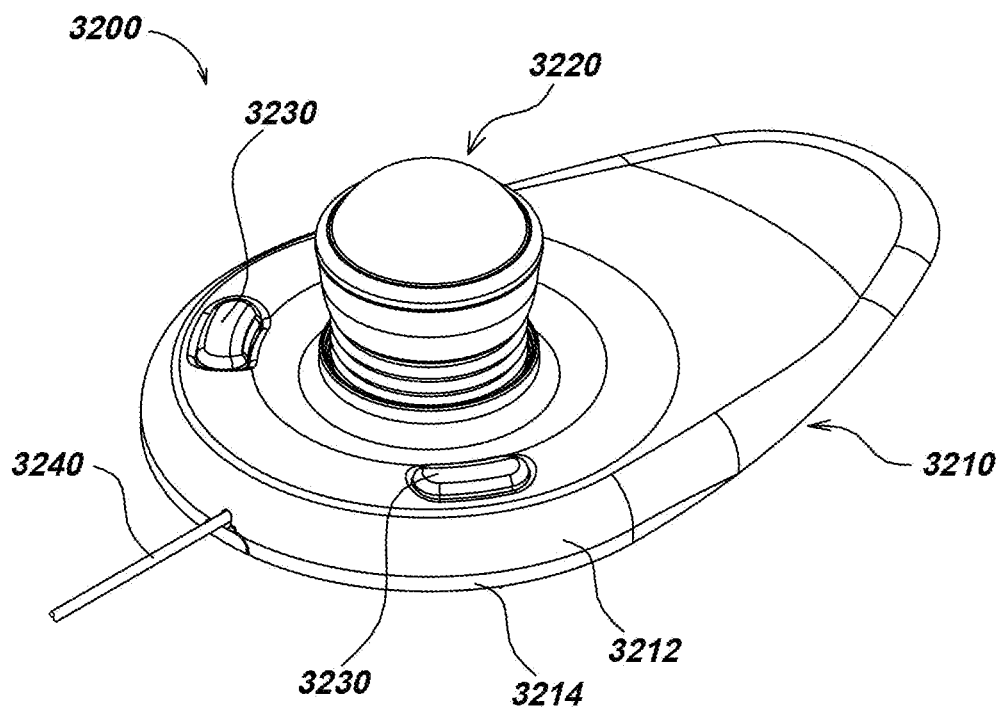
FIG. 32 is an isometric view of an embodiment of a deformable actuator user interface device.

Attention is now directed to FIG. 32, wherein various details of another embodiment of a user interface device 3200 are illustrated. The user interface device embodiment 3200 may include a base or housing element, such as base element 3210, with an actuator assembly, such as actuator assembly 3220, coupled thereto. The actuator assembly 3220 may correspond with floating and deformable actuator assemblies as shown in FIGS. 68-74.

The user interface device 3200 may further include one or more switches, such as switches or buttons 3230, and/or other elements such as tactical or haptic feedback elements (not shown), as well as LEDs or other lighting elements (not shown), and/or other related components. Actuator assembly 3220 may be configured to allow a user to grip or otherwise contact the user interface device 3200, and apply displacement movements and/or deformation actions to movable and/or deformable actuator elements of the user interface device 3200. The user interface device 3200 may be further configured to provide the user with tactile feedback from the user interface device 3200 (e.g., with a haptic or vibration element not shown), as well as provide other functions, such as switching inputs, via switches or buttons 3230, as well as providing other functions as described previously or subsequently herein.

The base or housing mounting element 3210 may be comprised of multiple elements, such as a base top half 3212 and a base bottom half 3214 as shown. A series of one or more buttons or switches, such as buttons 3230, may be incorporated on or into the base element. The series of buttons 3230 may be connected to circuitry (not illustrated), such as circuitry in a processing element, to provide pushbutton control functions to the user. For example, the buttons may be connected to a processor or other programmable device of the processing element, which may generate an output signal in response to user activation of the button or switch.

A connecting wire 3240 (or other wired or wireless connection elements, such as wired or wireless transmitter and receiver elements, not shown) may be further included to connect the user interface device 3200 with an electronic computing system, such as to send output signals or commands related to motion of the actuator assembly, buttons or switches, or other actions such as described previously herein.

Figure 33:
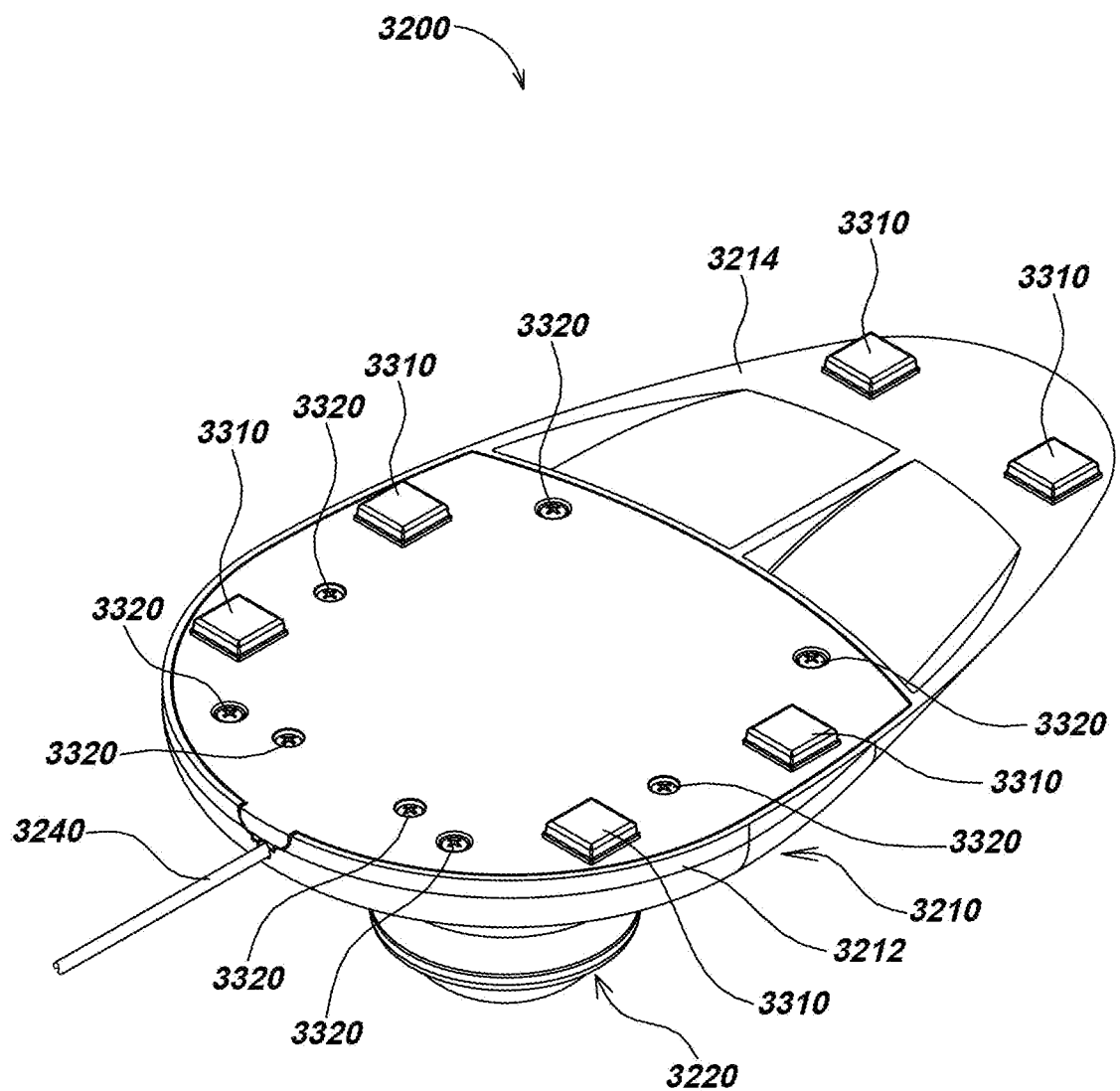
FIG. 33 is an isometric view of the embodiment of FIG. 32 seen from the bottom.

FIG. 33 illustrates an underside configuration of the user interface device embodiment 3200. A series of feet, such as elastomeric feet 3310, may be included to aid in keeping the user interface device 3200 still in relation to an operating surface (such as a desk, table, or other work surface) when in use. A series of screws 3320 or other attachment mechanisms may be used to secure the base top half 3212 and the base bottom half 3214 together, concealing internal circuitry (not illustrated) as well as other elements, such as spring suspended or supported elements such as magnets, sensors, accelerometers, gyroscopes, pressure, barometric, temperate, and/or other sensors, and/or other elements such as described previously herein.

An actuator assembly, such as exemplary actuator assembly 3220, may include both floating and deformable actuator elements and sub-assemblies. For example, FIG. 34 further illustrates additional details of the actuator assembly embodiment 3220. In operation, a movable floating array assembly of the actuator assembly may be physically moved by a user, thereby causing displacements which may include lateral movements, up and down movements, tilts, rotations, displacements, translations, yaws, and/or permutations and combinations thereof (relative to a neutral or released state). Floating actuator sensing components, such as one or more magnets and one or more magnetic sensors, may be configured to generate one or more sensor output signals corresponding to the motion of the movable element. For example, the magnets may be permanent magnets or electromagnets and the magnetic sensors may be multi-axis magnetic sensors, such as three-axis magnetic sensors. The sensor output signals may be provided to a processing element, where the signals may be further processed to generate UID output signals to be provided to an electronic computing system, such as described previously herein. For example, the output signals may include data corresponding to particular positions or motions of the floating actuator element and/or may be mapped commands or control data usable for specific input functions usable by the electronic computing system.

Alternatively, or in addition, an actuator assembly may include a deformable apparatus, such as a deformable actuator and deformable array sub-assembly. In an exemplary embodiment, the movable element and the deformable element may be integrated or may be partially integrated, such as, for example, is shown in FIG. 67-69. In operation, the deformable element may be deformed (relative to a non-deformed state) by a user deformation action, such as a squeeze, push, or other gripping or deformation action. Deformable actuator sensor components may include one or more magnets and one or more magnetic sensors configured to generate one or more deformation signals corresponding to the deformation of the deformable actuator element. For example, the magnets may be permanent magnets or electromagnets and the magnetic sensors may be multi-axis magnetic sensors, such as three-axis magnetic sensors. Sensor output signals may be provided to a processing element to be used to further generate output signals to be provided to an electronic computing system, such as to perform command, control, data, or other functions. For example, in one implementation, deformations may be sensed and output signals provided corresponding to related actions applied to a virtual object displayed on the electronic computing system, such as grabbing and/or picking up the virtual object in a CAD system, video game system, process control system, or other interactive system or application.

In an exemplary embodiment, the movable and deformable elements may be at least partially integral. For example, in this integral configuration, the movable element may also be deformable so that when a user squeezes the movable element, parts of the actuator assembly will deform in response (relative to a non-deformed state), such as shown in FIGS. 68 and 69. Conversely, when the user releases the movable element, the deformed parts of the actuator assembly will return to a non-deformed state. By combining deformation sensing with displacement motion sensing (such as described previously herein), additional, synergistic user interaction functionality may be provided in various embodiments of user interface devices.

Figure 35:
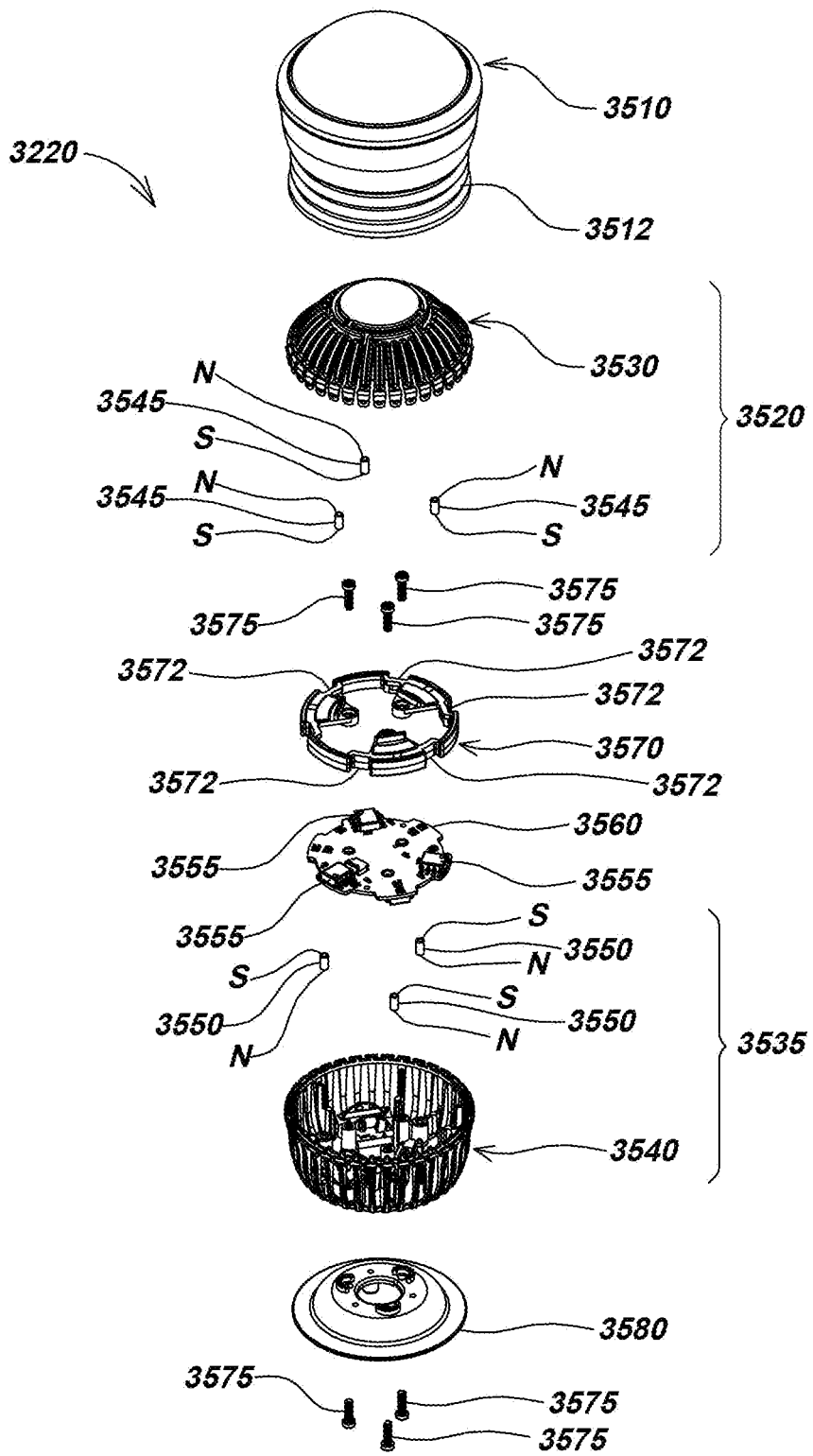
FIG. 35 is an exploded isometric view of an actuator element embodiment taken from the top thereof.
Figure 36:
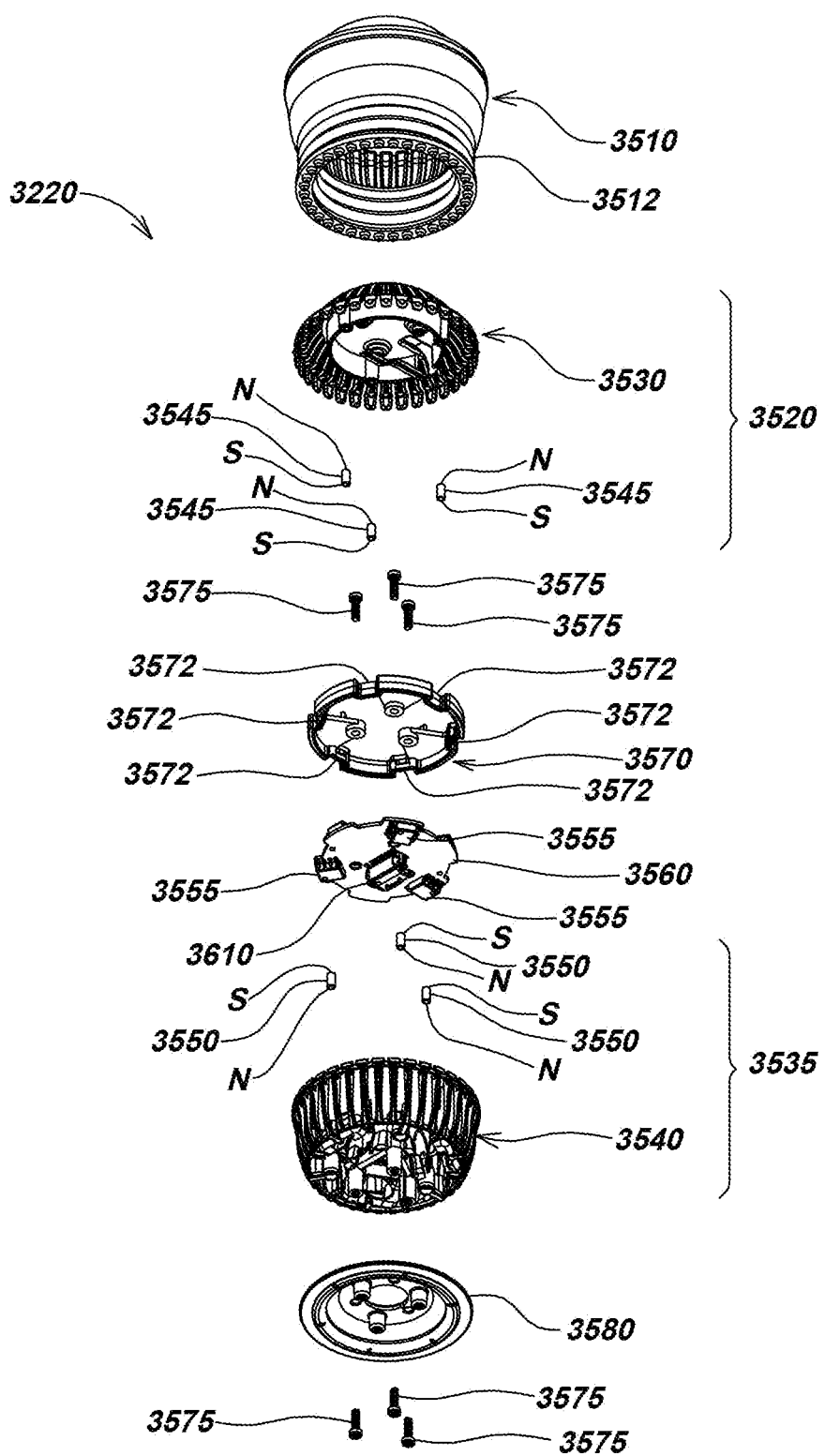
FIG. 36 is an exploded isometric view of an actuator element embodiment taken from the bottom thereof.
Figure 37:
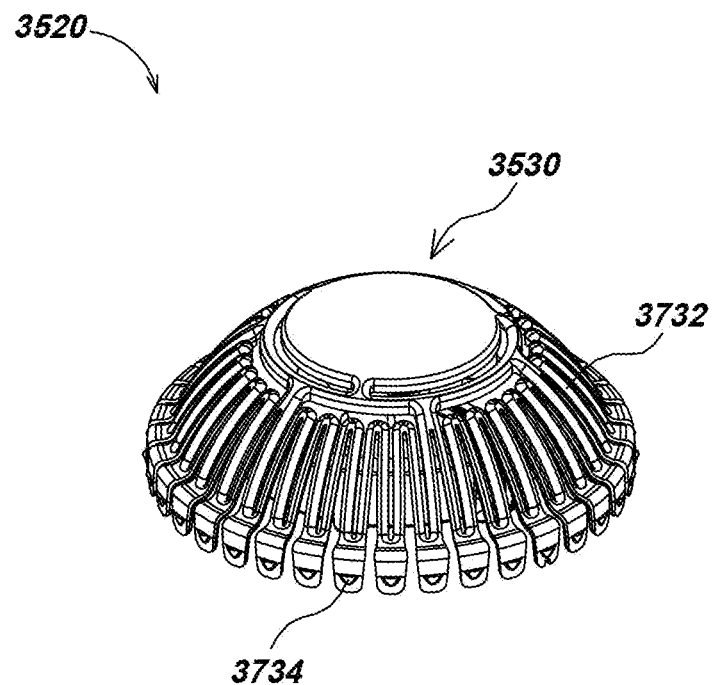
FIG. 37 is a detailed isometric view of an upper or floating actuator assembly embodiment.
Figure 38:
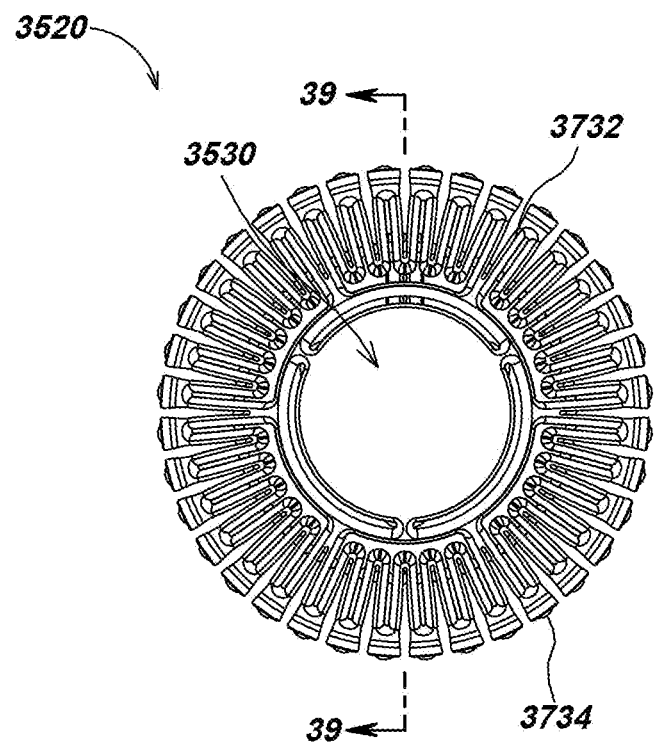
FIG. 38 is a top view of an upper actuator assembly embodiment.
Figure 39:
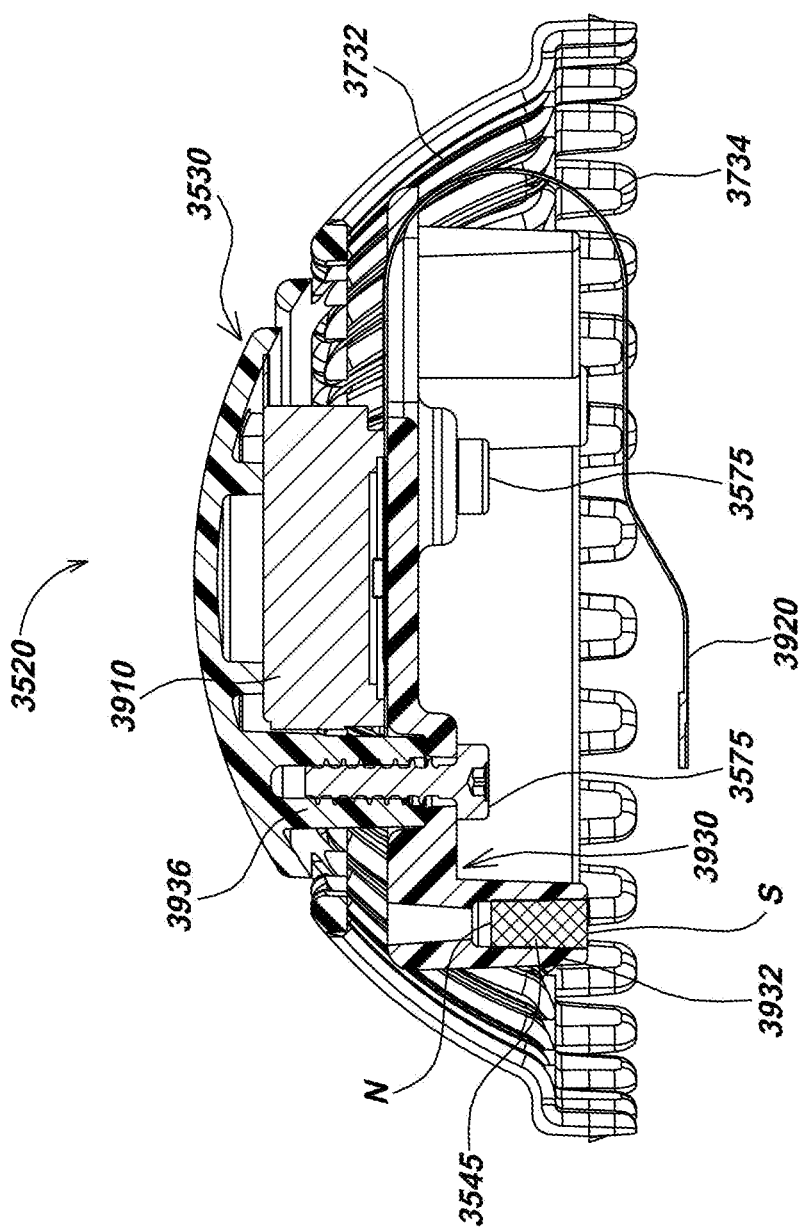
FIG. 39 is a sectional view of the top actuator assembly embodiment of FIG. 38 along line 39-39.
Figure 40:
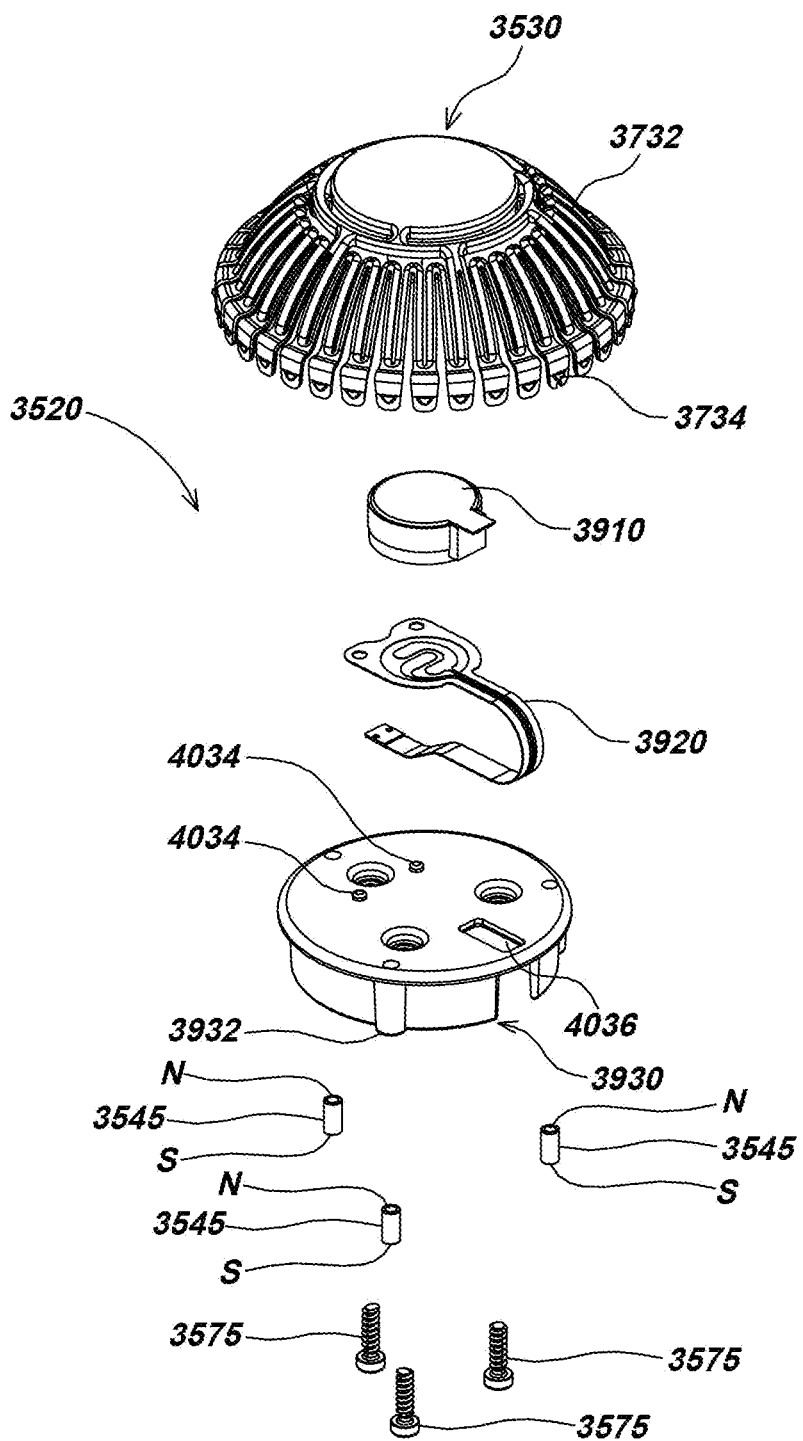
FIG. 40 is an exploded isometric view of the upper actuator assembly embodiment of FIG. 38 from the top thereof.
Figure 41:
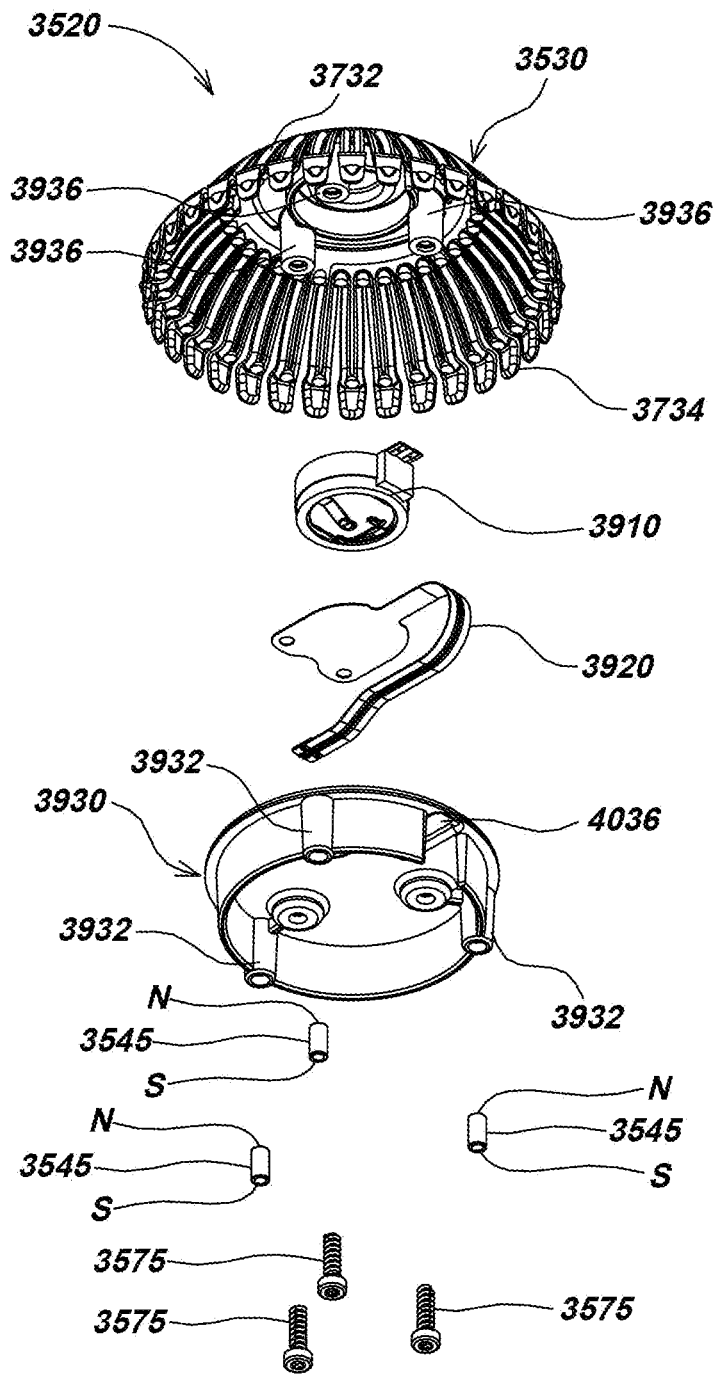
FIG. 41 is an exploded isometric view the upper actuator assembly embodiment of FIG. 37 from the bottom thereof.
Figure 42:
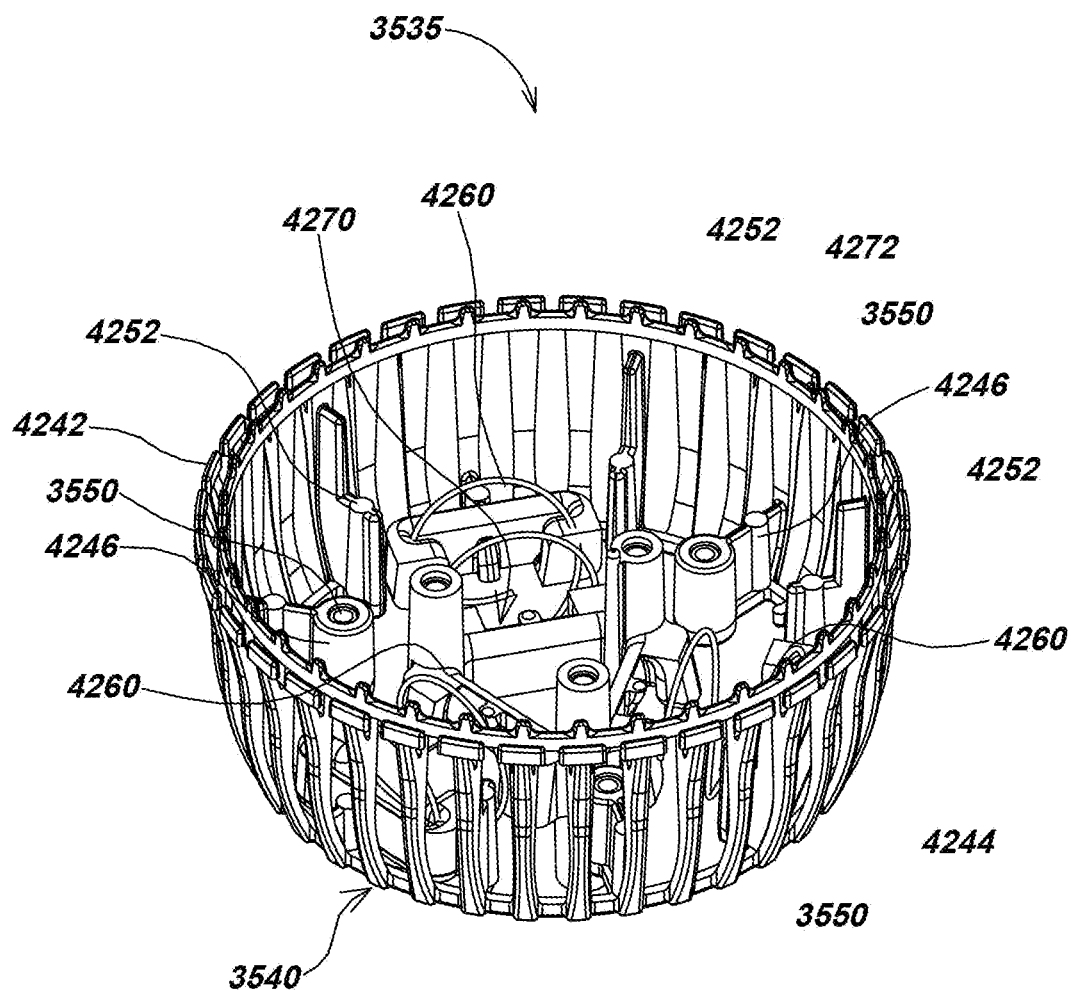
FIG. 42 is a detailed isometric view of a lower or deformable actuator assembly embodiment.
Figure 43:
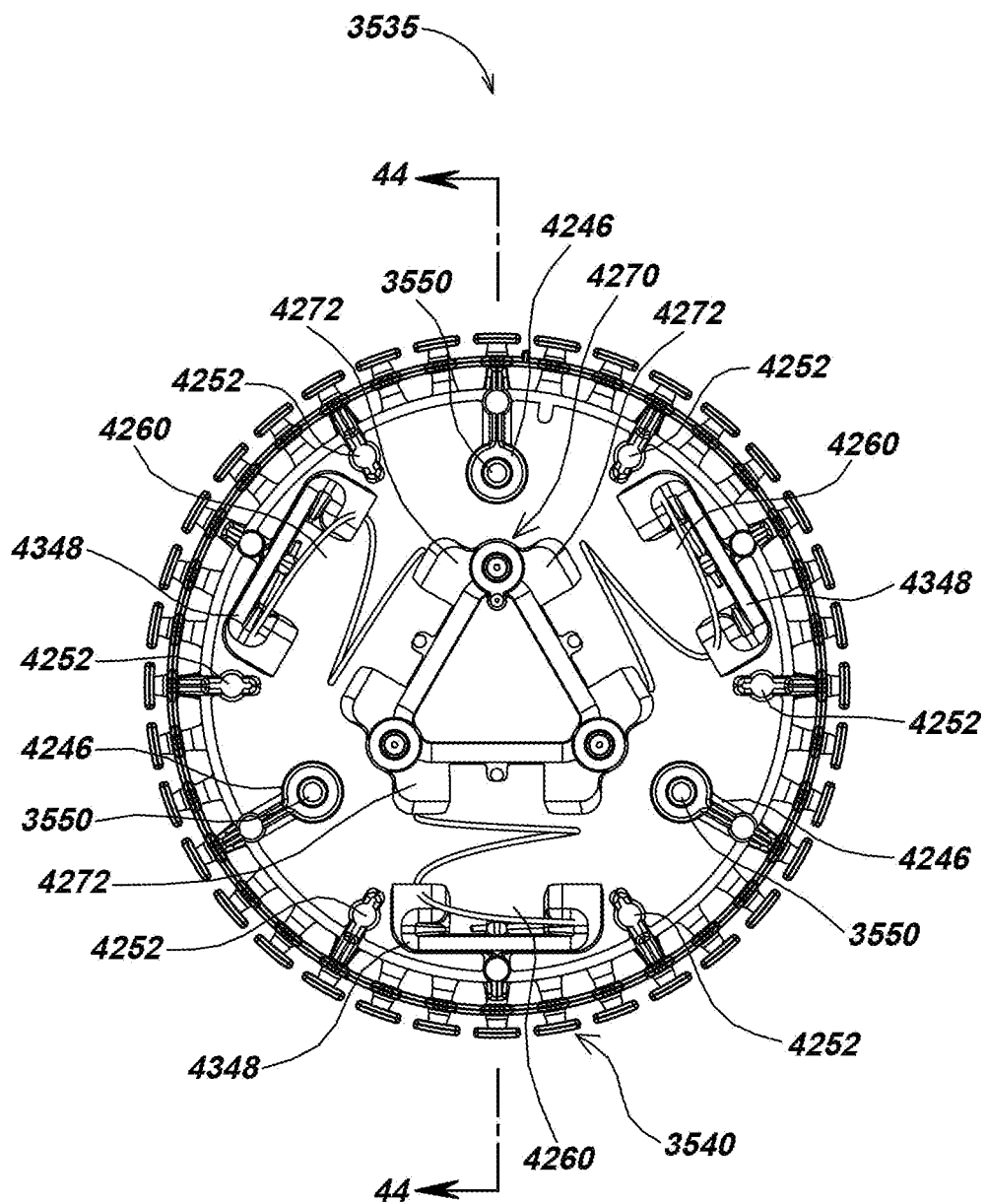
FIG. 43 is a top view of a lower actuator assembly embodiment.
Figure 44:
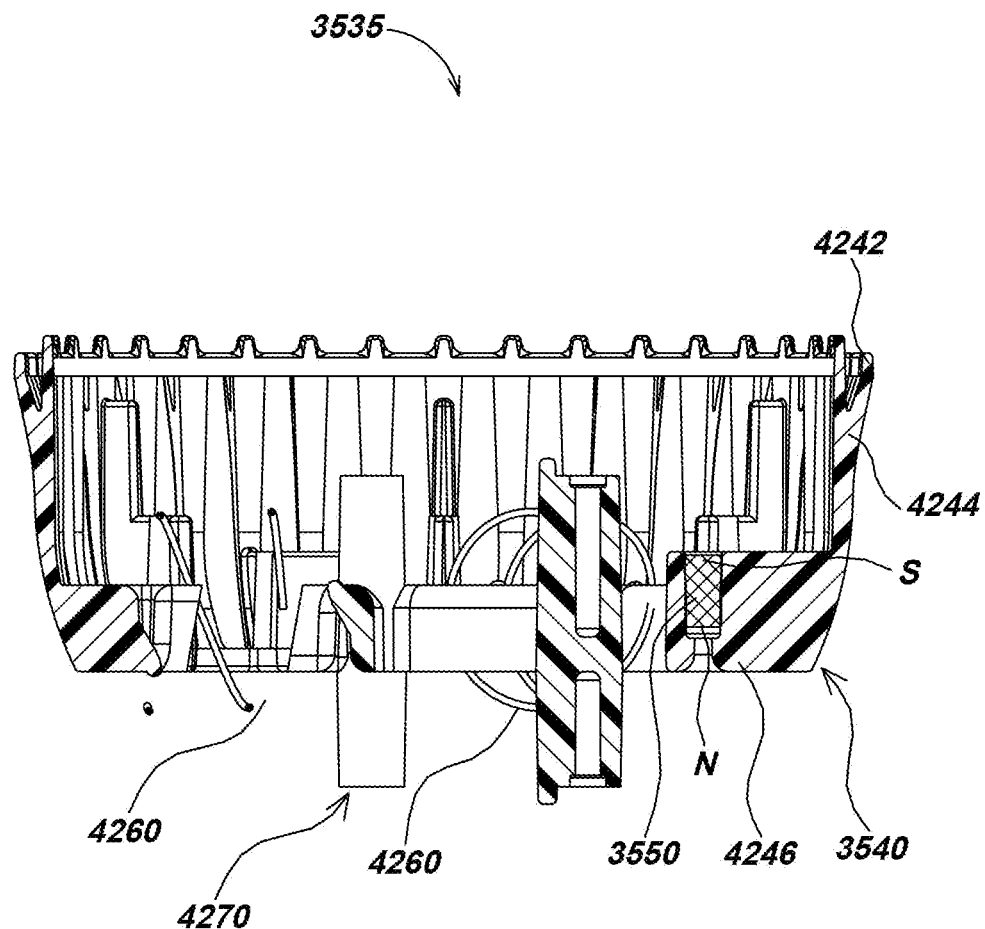
FIG. 44 is a sectional view of the lower actuator assembly embodiment from FIG. 43 along line 44-44.
Figure 45:
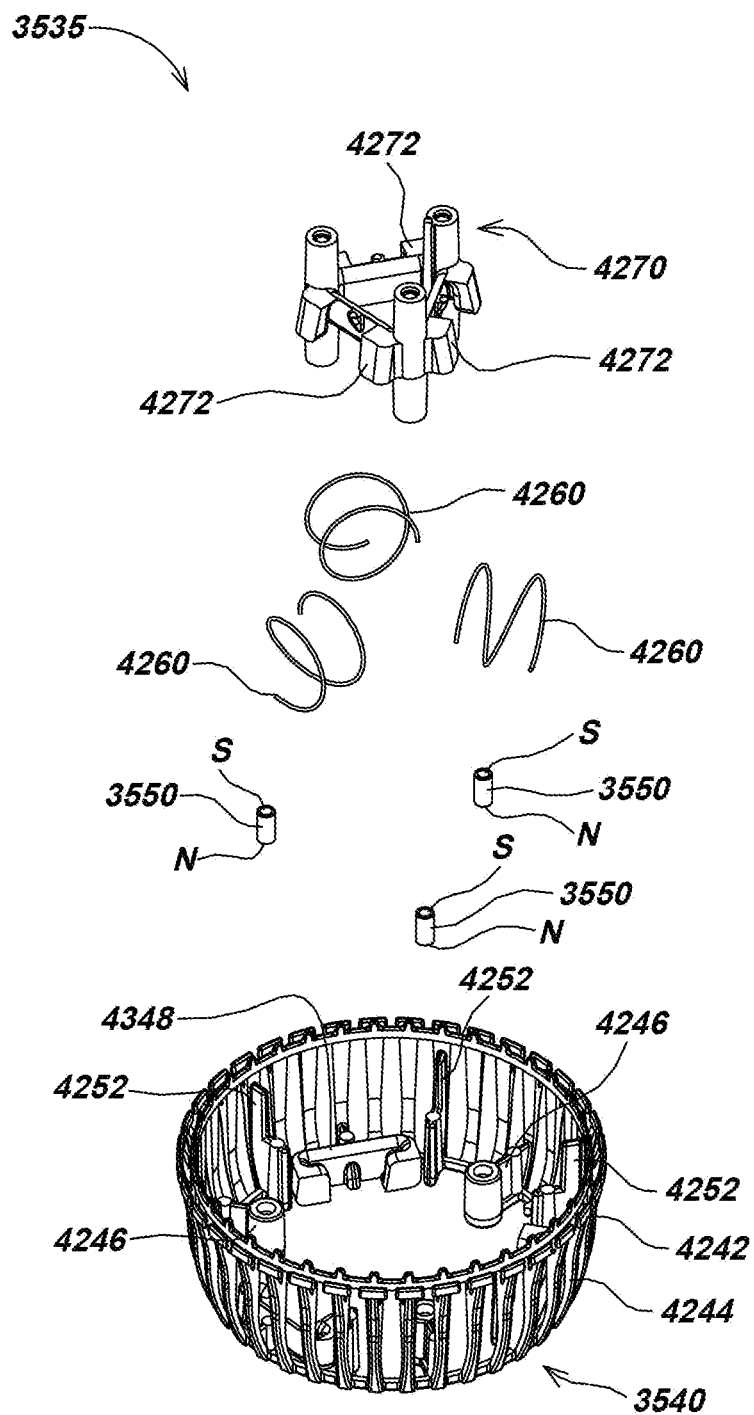
FIG. 45 is an exploded isometric view of the lower actuator assembly embodiment of FIG. 42 from the top thereof.
Figure 46:
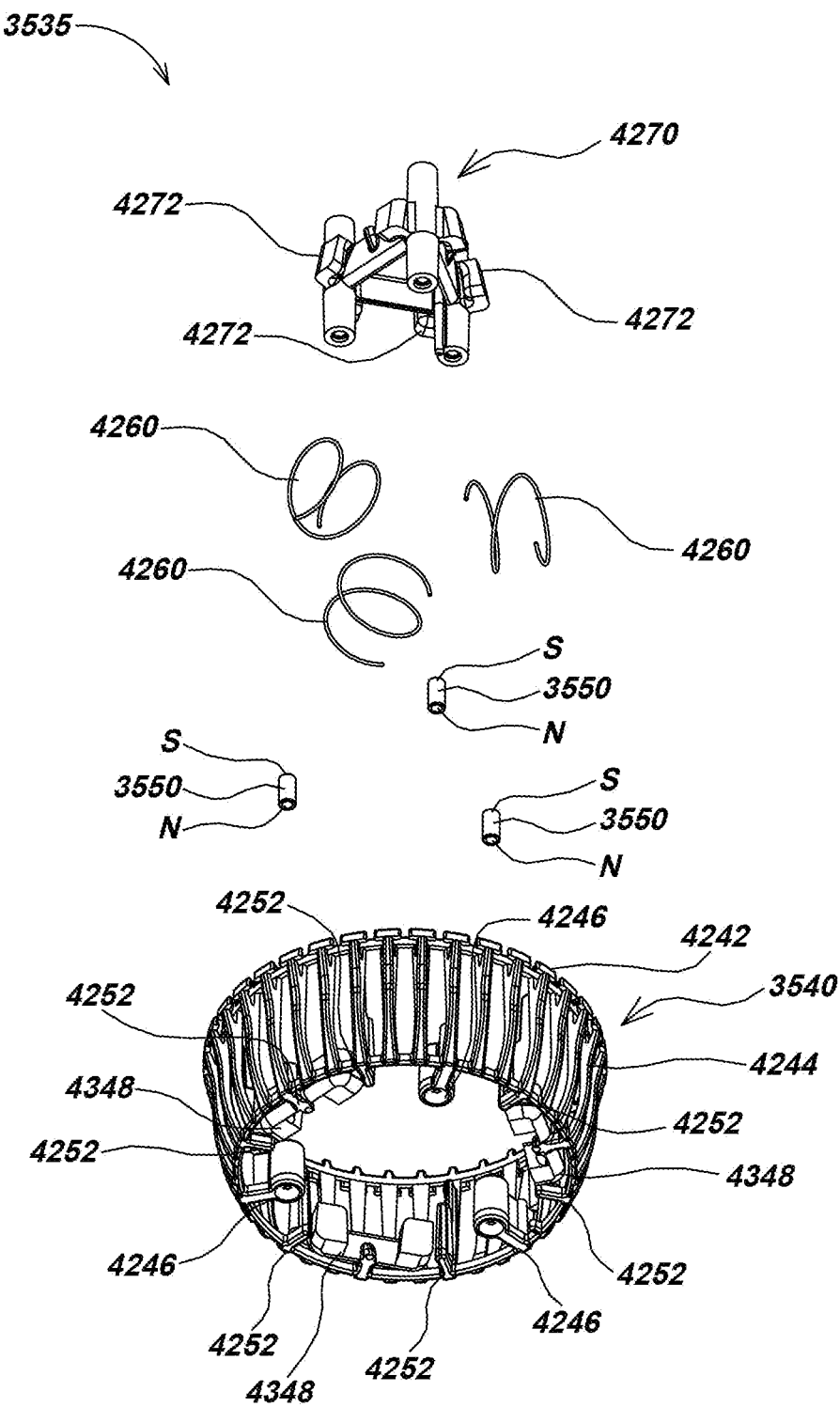
FIG. 46 is an exploded isometric view of the lower actuator assembly embodiment of FIG. 42 from the bottom thereof.

FIGS. 35 and 36 further illustrate details of the actuator assembly 3220 embodiment of FIGS. 32 and 33, showing example configurations for providing both motion sensing and deformation sensing. For example, the actuator assembly 3220 may include a boot or cover element, such as elastomeric cover 3510, configured to surround an upper actuator sub-assembly 3520 and a lower actuator sub-assembly 3535. The upper actuator sub-assembly 3520 may provide floating actuator functionality, and the lower actuator sub-assembly 3535 may provide deformable actuator functionality, such as shown in FIGS. 68 and 69.

A plurality of magnets, such as a series of three upper magnets 3545 as shown (or other numbers of magnets and associated sensors), may be mounted within upper actuator sub-assembly 3520, and a series of lower magnets 3550, such as the three magnets shown, may be mounted within lower actuator sub-assembly 3535. The magnets may be configured such that ones of the upper magnets 3545 and lower magnets 3550 may correspond to or be matched to a magnetic sensor element, such as magnetic sensor 3555, which may be a multi-axis magnetic sensor. A fixed base assembly may include limiting element 3570, as well as printed circuit board 3560, on which magnetic sensor may be mounted. For example, the magnetic sensor element may be mounted on or secured to a sensor printed circuit board (PCB) or other substrate, such as sensor PCB 3560. The upper and lower magnets may be configured to be in opposite polarity orientations, such as shown in FIGS. 35 and 36. The upper magnets 3545 may be a component of upper actuator sub-assembly 3520 and the lower magnets 3550 may be a component of lower actuator sub-assembly 3535. Assembly 3220 may correspond with apparatus 6800 as shown in FIGS. 68 and 69.

Some components of the upper actuator sub-assembly 3520 and/or some components of the lower actuator sub-assembly 3535 may be configured to move about other fixed components when manipulated by a user, such as through applied user displacement and/or deformation actions.

The actuator assembly 3220 may further include a fixed base assembly with mechanical or structural elements, such as limiting piece 3570, as well as a series of small screws 3575 or other mounting mechanisms to secure the sensor PCB 3560 and/or the limiting piece 3570 to a core join element 4270 (described subsequently herein).

The sections of the elastomer boot or cover 3510 that covers the upper actuator sub-assembly 3520 and the lower actuator sub-assembly 3535, the upper actuator sub-assembly 3520, and the outer ring of the bottom actuator half 3540 (described subsequently herein) of lower actuator sub-assembly 3535 of the actuator assembly 3220 may be configured to move in relation to the fixed base assembly (e.g., the sensor PCB 3560, the limiting piece 3570, core join element 4270, and related attachment components). Boot or cover 3510 may correspond with boot embodiment 7600 as shown in FIG. 76. Another boot configuration, such as boot embodiment 7500, may alternately be used in some implementations.

A lower bellows section 3512 of the elastomer boot or cover 3510 may be largely bellows-shaped, with longitudinal flex-rings providing flexibility and/or functioning as a dampening element. By providing a dampening element, such as lower bellows section 3512, vibrations that may occur during abrupt release of the movable element of the actuator assembly by the user may be suppressed. Additional dampening elements may be also be fitted within the lower actuator sub-assembly 3535 and/or elsewhere in the actuator assembly 3220 to aid in further dampening vibrations. In an exemplary embodiment, the bottom of the lower bellows section 3512 may be fixed so as to not be moveable during displacements of movable actuator elements of the actuator assembly.

The magnetic sensors 3555 may be, for example, magnetic multi-axis sensors such as an integrated circuit (IC) Melexis MLX90363 sensor, or other similar or equivalent sensors, or other magnetometers or magnetic sensing devices. The magnetic sensors 3555 may be secured to the sensor substrate or PCB 3560 such that three of the magnetic sensors 3555 may be secured to the upwards facing side of the sensor PCB 3560 to sense displacement movements, and three of the magnetic sensors 3555 may be secured to the downward facing side of the sensor PCB 3560 to sense deformations. In some embodiments the magnets and magnetic sensor locations may be reversed. Ones of the magnetic sensors may be configured in a staggered pattern on the base assembly to maximize distance between the other ones of the magnetic sensors.

In a fixed base assembly, a limiting element, such as limiting piece 3570, may be configured as a substantially ring-shaped structure configured so as to fit about the sensor PCB 3560, within the boot or cover. A series of limiting grooves 3572 may be formed around the circumference of the limiting piece 3570 such that when the floating actuator element of actuator assembly 3220 is moved into a displaced state by a user, the limiting piece 3570 and the limiting grooves 3572 restrict the extent of the displacement and prevent over-stressing the components of the user interface device. In some embodiments, the limiting piece 3570 may be fitted with bumpers, such as an elastomeric overmolded structure 7450 as shown in FIG. 74, and/or other cushioning or dampening elements that may soften the impact of colliding or scraping components and may further be configured to improve the tactile sensation of the device during use.

A mounting plate 3580 may be secured below the lower actuator sub-assembly 3535 using small screws 3575 or other attachment mechanisms that may be used to further mount the actuator assembly 3220 within a base or housing element, such as base element 3210.

A connector 3610, such as shown in FIG. 36, may be secured centrally to the downward facing side of the sensor PCB 3560 so that, when accompanied by the appropriate wiring, the sensor PCB 3560 may be connected to an electronic computing system. In alternative embodiments, a wireless element, such as a wireless transmitter, receiver, transceiver, or other wireless element may be used to communicate with the electronic computing system.

In some embodiments, the upper magnets 3545 and the lower magnets 3550 may be oriented such that the magnetic orientation of the upper magnets 3545 is in opposition to the magnetic orientation of the lower magnets 3550. In some embodiments, touch sensitive elements may also be optionally incorporated into the boot or cover 3510.

FIGS. 37-41 further illustrate details of the upper actuator sub-assembly embodiment 3520. The upper actuator sub-assembly 3520 may include a top actuator half, such as top actuator half 3530, a haptic or vibration element, such as vibration motor 3910 (as shown in FIGS. 39-42), a flexible substrate, such as flexible PCB 3920, which may be used to connect the vibration motor 3910 to the sensor PCB 3560 (as illustrated in FIG. 35), a magnet mounting disk, such as mounting disk 3930, as well as small screws 3575 or other attachment mechanisms.

The top actuator half 3530 may be largely dome shaped to accommodate a user's hand. The top actuator half 3530 may also be formed with a top deformation slot section 3732, which may define finger or other flexible elements so as to allow the top actuator half 3530 to be deformed by a user, and subsequently return to a non-deformed state when released. The top deformation slot section 3732 may be formed by a series of ribs or other structures providing deformability extending along the sides of the top actuator half 3530. Top keying sections 3734 may be formed along the bottom circumference and below the top deformation slot section 3732 of the top actuator half 3530, which may be used to secure the upper actuator sub-assembly 3520 to the lower actuator sub-assembly 3535. Other connection mechanisms may also be used to connect upper and lower sub-assemblies.

A series of screw mounting posts 3936 may be formed within the top of the dome of the top actuator half 3530. The vibration motor 3910 may be positioned snugly between the screw mounting posts 3936. The vibration motor 3910 may be, for example, the C1026B200F device commercially available from Jin Long Machinery or other similar or equivalent motors or other devices.

The vibration motor 3910 may be activated, for example, to indicate an icon present when scrolling across a screen on a computer or may activate to indicate a selection has been made in virtual space, such as in proximity to or in contact with a virtual object shown on a display screen of the electronic computing device. Activation of the vibration motor may be controlled by the processing element either in response to a user action or based on a signal or data provided from the electronic computing system. In some embodiments, a particular pre-defined pattern of vibration may be used to indicate switching between different possible modes, such as, for example, a mode indicating a two dimensional virtual space mode versus a three dimensional virtual space mode.

The flexible substrate or flexible PCB 3920 may be functionally secured to the bottom of the vibration motor 3910 with the magnet mounting disk 3930, secured to the top actuator half 3530 by the small screws 3575, and may further hold the vibration motor 3910 and the flexible PCB 3920, as well as the upper magnets 3545, in place.

The magnet mounting disk 3930 may be substantially disk shaped with a series of magnet mounting receptacles 3932, corresponding to a particular configuration of magnets (e.g., three in an exemplary embodiment) formed along the circumference. One of each of the upper magnets 3545 may be mounted within each of the magnet mounting receptacles 3932. The magnet mounting disk 3930 may further be formed with a pair of mounting nubbins 4034 on the upward facing side of the magnet mounting disk 3930 that may be used to aid in securing the flex PCB 3920 and the vibration motor 3910 to the magnet mounting disk 3930.

A connector gap 4036 may be formed in the magnet mounting disk 3930, thereby allowing the flexible PCB 3920 to pass through the magnet mounting disk 3930 and functionally connect to the sensor PCB 3560. In some embodiments the limiting piece 3570 may be fitted with bumpers, an elastomer over-mold, and/or other dampening or cushioning elements that may soften the impact of colliding or scraping components, and may also be configured to improve the tactile sensation of the device during use.

FIGS. 42-46 further illustrate details of the lower actuator sub-assembly 3535 embodiment. The lower actuator sub-assembly 3535 may include a bottom actuator half, such as bottom actuator half 3540, a series of springs 4260, and a core join element 4270. A bottom keying section 4242 may be formed along the circumference at the top of the bottom actuator half 3540. In assembly, the bottom keying section 4242 may mate with the top keying section 3734 of the top actuator half 3530. When assembled, the top actuator half 3530 and the bottom actuator half 3540 may form a shape that is approximately spherical. Around the sides of the bottom actuator half 3540, a bottom deformation slot section 4244 may be formed to allow the bottom actuator half 3540 to be deformed by force applied by a user and return to its original non-deformed state when released.

The bottom deformation slot section 4244 may be formed by a series of ribs formed along the sides of the bottom actuator half 3540. A series of magnet-bearing arms 4246 may be formed to extend inward on the bottom actuator half 3540. The magnet-bearing arms 4246 may be evenly spaced about the circumference of the bottom actuator half 3540, and may be formed to mount one of the lower magnets 3550 per each of the magnet-bearing arms 4246.

Between each of the magnet-bearing arms 4246 and neighboring ones of the magnet-bearing arms 4246, an actuator spring mounting section 4348 may be formed to hold one end of each of the springs 4260. The opposite end of each of the springs 4260 may be secured to a core join spring mounting section 4272 formed on each of the three vertical sides of the core join element 4270. In assembly, the springs 4260 may be heated by methods such as magnetic induction to melt the adjoining thermoplastic material of the actuator spring mounting sections 4348 and the core join spring mounting sections 4272 around the ends of the springs 4260 to further secure the springs 4260 in place.

On either side of each of the actuator spring mounting sections 4348, a limiting arm 4252 may be formed that is approximately "L" shaped. The limiting arms 4252 may be designed to fit within the limiting grooves 3572 of the limiting piece 3570 such that displacements of the actuator assembly 3220 are limited to prevent over-stressing of the springs 4260. In some embodiments, the various components of the lower actuator sub-assembly 3535, including but not limited to the core join element 4270, may be fitted with bumpers or a rubber over-mold that may soften the impact of scraping or colliding components and improve the tactile sensation of the device during use.

Figure 34:
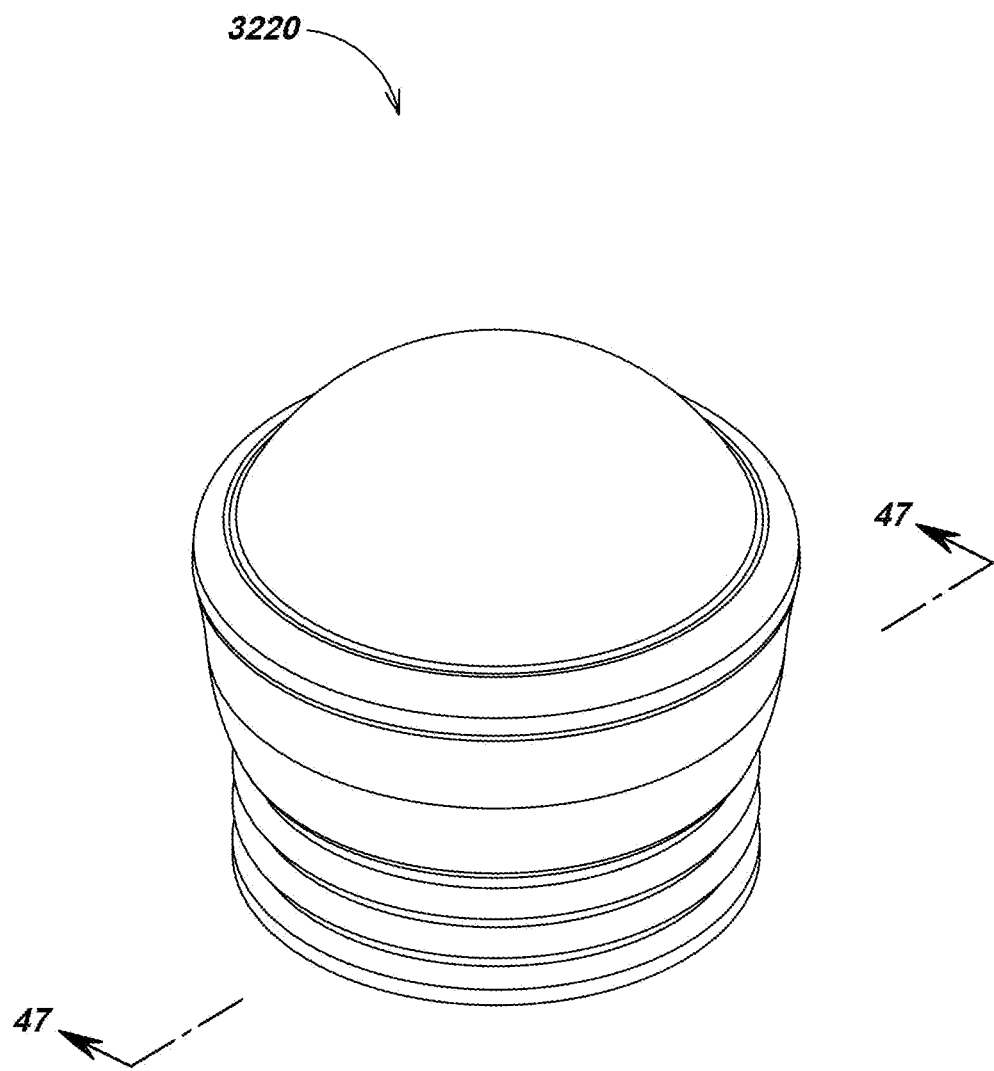
FIG. 34 is an isometric view of an actuator element embodiment.
Figure 47:
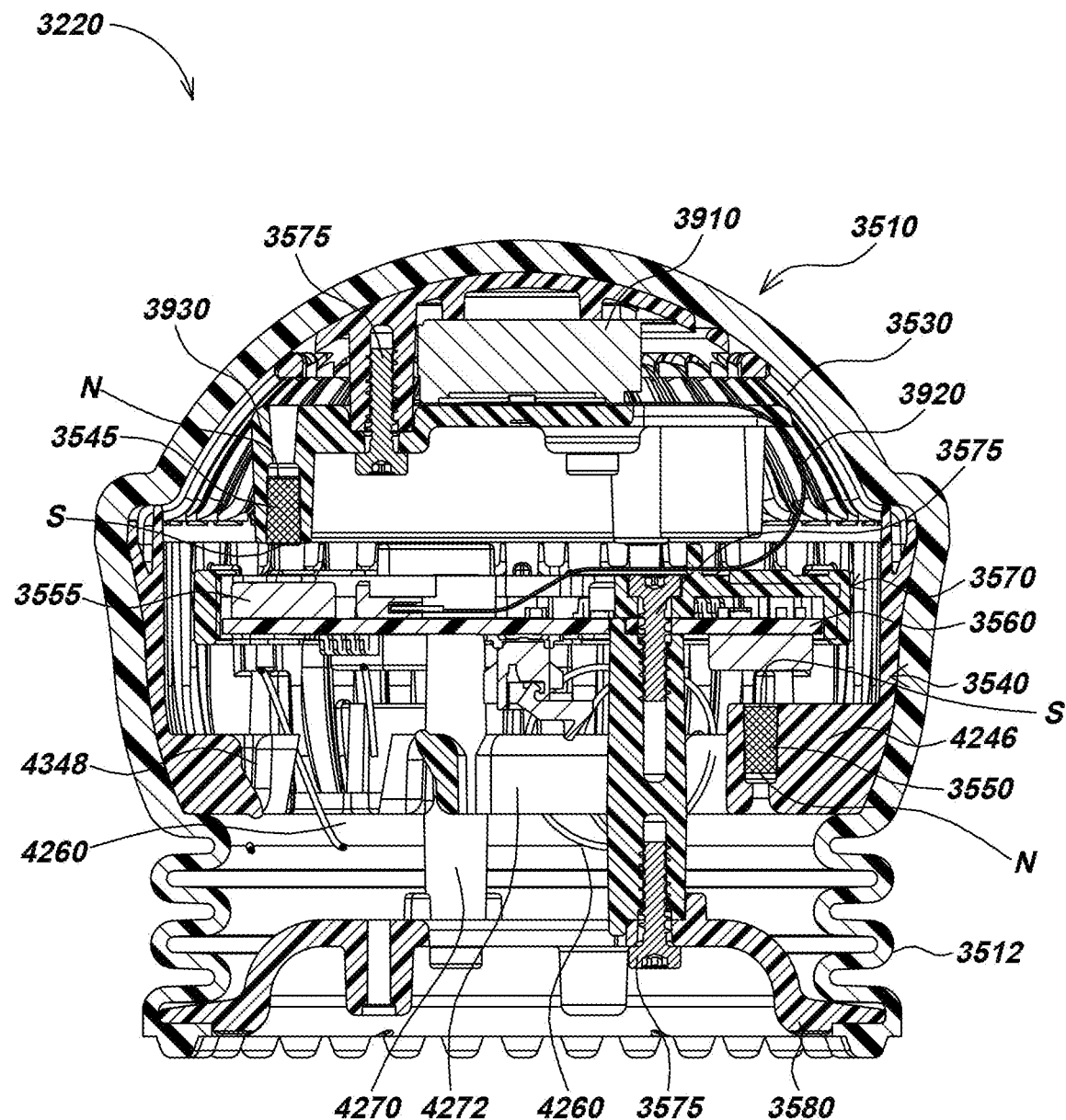
FIG. 47 is a sectional view of the embodiment of FIG. 34 along line 47-47.

FIG. 47 illustrates details of a cross-section of the actuator assembly 3220 embodiment along line 47-47 of FIG. 34. As shown, the sensor PCB 3560 and the limiting piece 3570 may be secured to the top of the core join element 4270 by small screws 3575 or other attachment mechanisms. The core join element 4270 may be configured to extend through a hole formed about the bottom of the bottom actuator half 3540 and be secured to the mounting plate 3580 by means of three of the small screws 3575. The hole formed about the bottom of the bottom actuator half 3540 may be dimensioned to allow the bottom actuator half 3540 to freely travel about the core join element 4270 during displacements of movable elements of the actuator assembly 3220.

When the mounting plate 3580, which may be secured to the core join element 4270, the sensor PCB 3560, and the limiting piece 3570, is made to remain stationary in relation to a working surface such as a table, desk, etc., the top actuator half 3530, with the magnet mounting disk 3930 and attached ones of the upper magnets 3545, and/or the bottom actuator half 3540, with attached ones of the lower magnets 3550, may be displaced and/or deformed from a released or neutral state position or shape by a user. When in a displaced and/or deformed state, the upper magnets 3545 and/or the lower magnets 3550 are displaced from their corresponding neutral or released state positions with respect to corresponding ones of the magnetic sensors 3555. The sensed magnetic fields may then be output to a processing element for use in position and/or deformation processing to determine actuator displacement and/or deformation.

Figure 48:
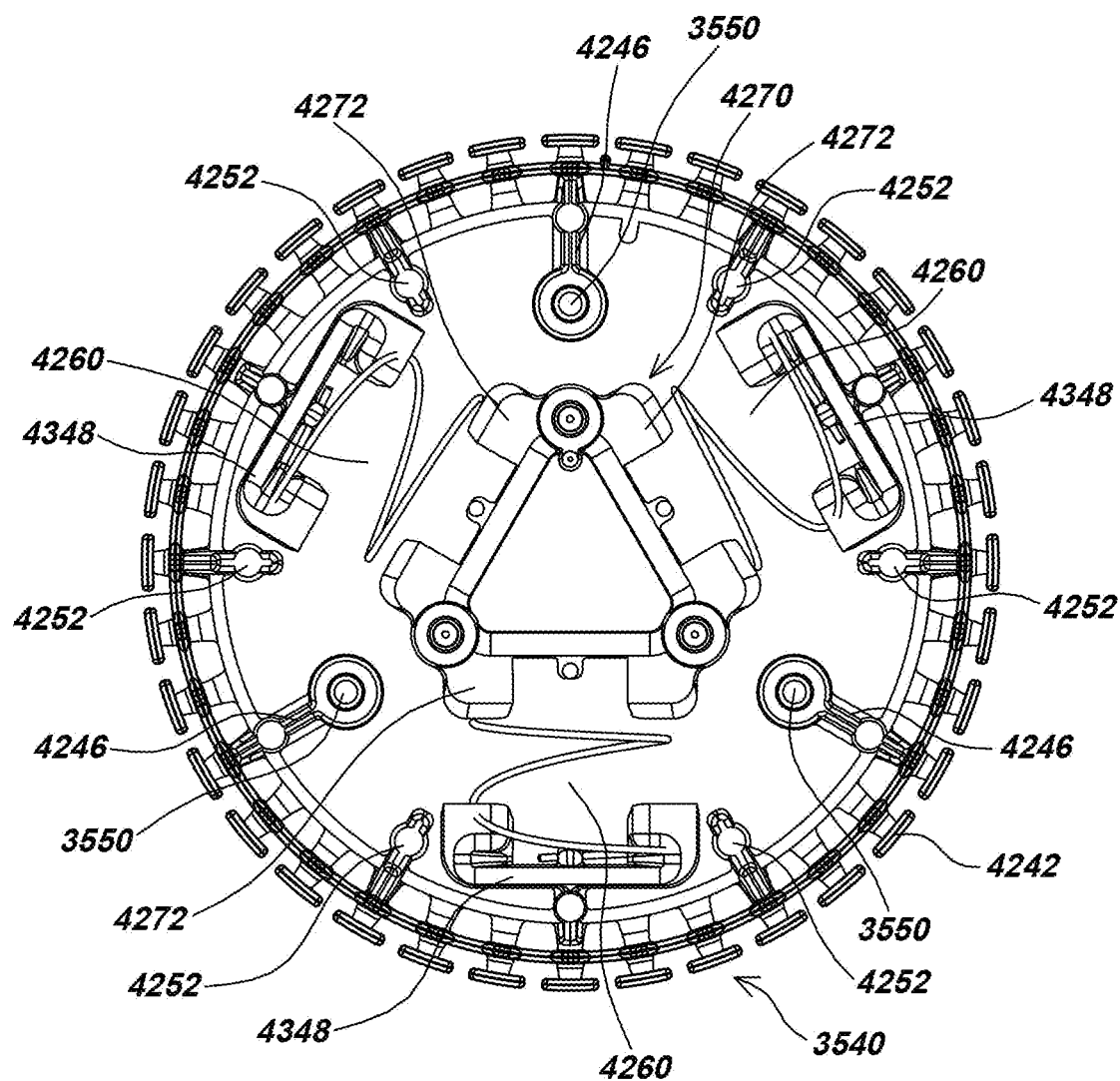
FIG. 48 is an enlarged top view of an embodiment of a lower actuator assembly and a series of magnets in a released or neutral state.

FIG. 48 illustrates details of the bottom actuator half 3540, the springs 4260, the core join element 4270, and the three of the lower magnets 3550 mounted within the magnet bearing arms 4246 of the bottom actuator half 3540 in a possible non-deformed and released state position.

Figure 49:
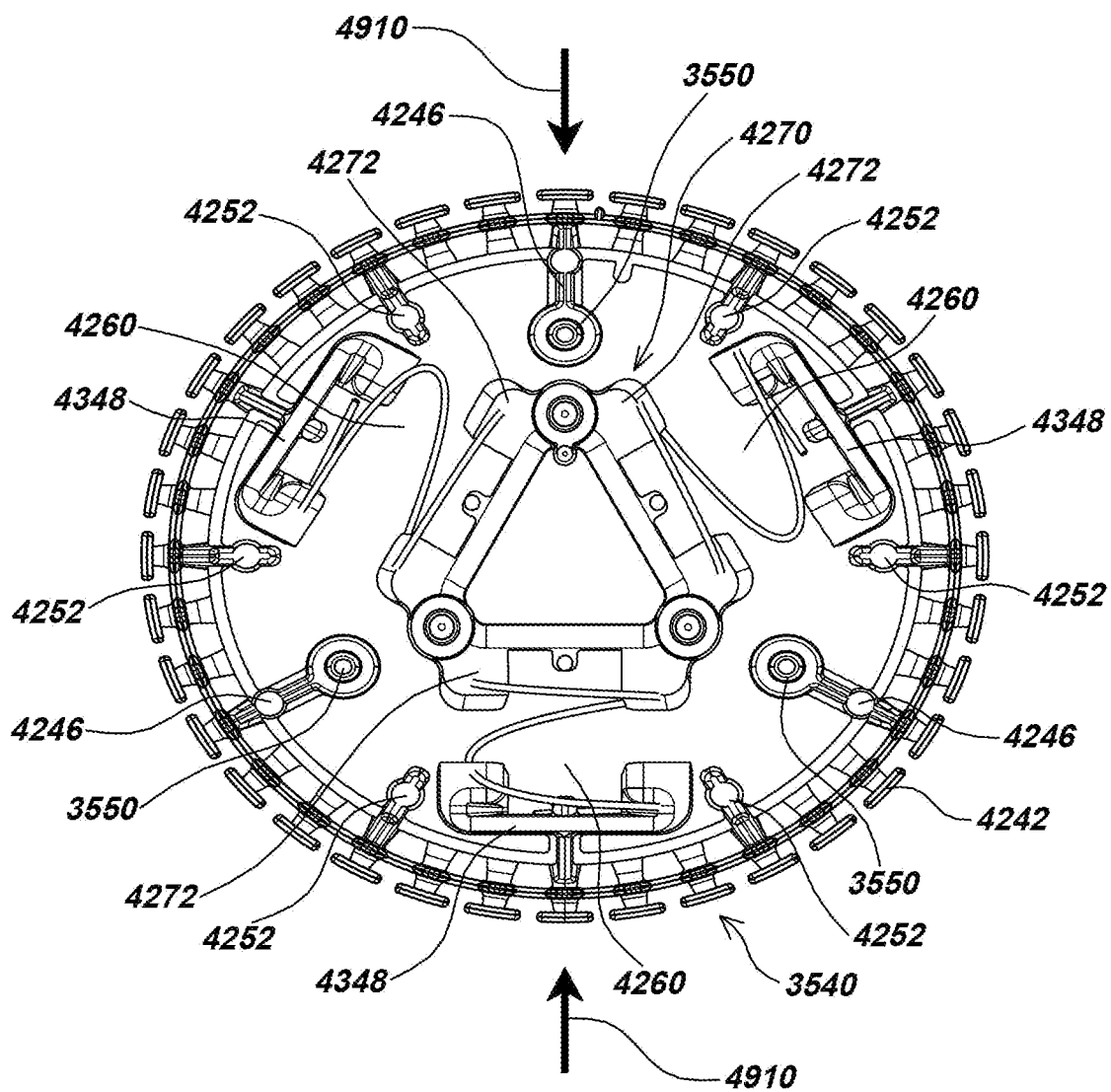
FIG. 49 is an enlarged top view of an embodiment of a lower actuator assembly and a series of magnets when a squeeze-type deformation action is applied.

When a deforming force, such as a squeeze-type force 4910 illustrated in FIG. 49, is applied to a deformable actuator element of the actuator assembly 3220, the bottom actuator half 3540 may bend and/or flex, allowing the magnet bearing arms 4246 and the attached ones of the lower magnets 3550 to move in varied directions and distances from one another, such as described previously with respect to FIGS. 65 and 66. In some embodiments, the direction and distance of the movement of the lower magnets 3550 may be analogous to the strength and direction of the deforming force, thereby allowing generation of vector squeeze or deformation actions.

The amount and direction of the deformation may be sensed by corresponding magnetic sensors 3555, and a deformation signal or signals generated accordingly which may be communicated to a processing element. If the magnet mounting disk 3930 of the upper actuator sub-assembly 3520 is preferably formed of largely rigid material and not designed to bend or flex, the upper magnets 3545, which may be secured thereto, may be restricted in movement in varied directions and distances to one another while deforming forces are applied to the actuator assembly 3220 (e.g., upon use squeezing or otherwise deforming deformable elements of the actuator assembly), such as described previously with respect to FIGS. 60-64.

In some embodiments and applications, the use of a deforming force such as the squeeze-type force 4910 may, for example, be used to signal the selection or grabbing of a virtual object and/or may be customizable to other uses, such as other interactions with virtual objects as described previously herein. In other embodiments, the lower magnets 3550 and corresponding magnetic sensors 3555 may be omitted, thereby providing a lower cost version of such a user interface device.

Figure 50:
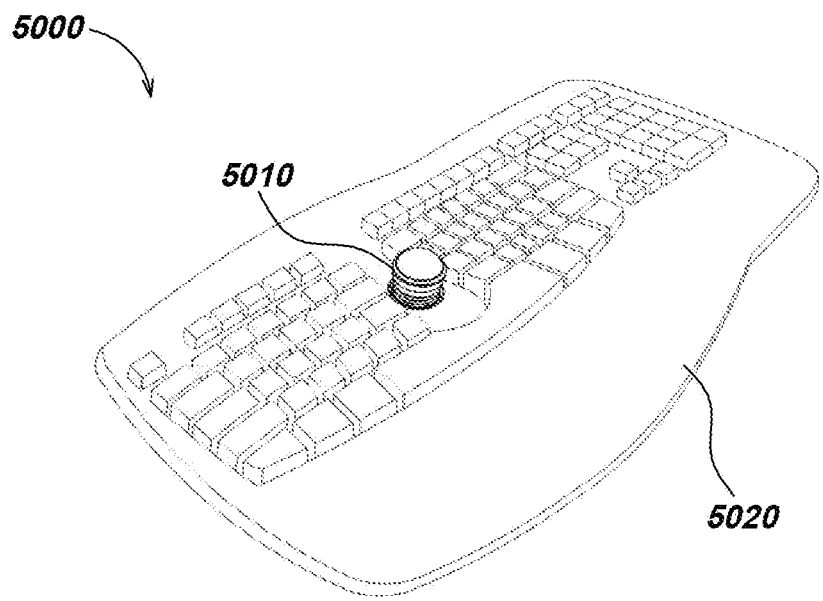
FIG. 50 is an embodiment of an ergonomic-style keyboard with an embodiment of a magnetically sensed user interface device installed.

FIG. 50 illustrates one application of a keyboard embodiment 5000, including an incorporated user interface device, wherein an actuator assembly 5010 of a user interface device, which may correspond to actuator assembly 3220 of FIGS. 32 and 33, or other actuator configurations described herein, such as actuator embodiment 6800, may be embedded in the keyboard housing 5020.

In some alternative embodiments, other sensor elements, such as a gyroscope (not illustrated) or an accelerometer (not illustrated) may be incorporated into the user interface device to provide additional signals to measure displacements of the deformable actuator. In some embodiments, an accelerometer may aid in determining an awakened state within the user interface device after a time of non-use. An accelerometer or gyroscope may also be incorporated to enable a user interface device such as the user interface device 3200 of FIG. 32 or user interface device embodiments described herein to sense tapping on the actuator surface to indicate specific commands, which may be configured to function similar to push-button type controls. This may be done by, for example, sensing deformations and/or displacements associated with the tapping action, and/or by sensing actuation of switching elements, button elements, and/or other elements of the user interface device and processing the sensed actions in a processing element.

In another aspect, the present invention relates to methods of generating and processing data associated with a user interface device, such as the user interface device 3200 of FIGS. 32 and 33, or other user interface device embodiments described previously herein. In an exemplary embodiment, a method of processing signals from the magnetic sensors 3555 includes a stage of generating a field model for each of the magnetic sensors 3555, in which the signals from each magnetic sensor 3555 correspond to a predetermined set of position data. Details of methods for processing signals from magnetic sensors in a processing element are described in, for example, U.S. patent application Ser. No. 13/214,209, filed Aug. 21, 2011 entitled MAGNETIC SENSING USER INTERFACE DEVICE METHODS AND APPARATUS, the entire disclosure of which is hereby incorporated by reference herein.

The position data for each of the magnetic sensors 3555 may be compared to determine a displacement of the actuator assembly 3220 from its released state and/or a deformation of the actuator assembly 3220. For example, in the actuator assembly embodiment 3220, the three magnetic sensors 3555 located on the upward facing side of the sensor PCB 3560 may be used to generate motion signals that may correspond with lateral, up and down movements, rotations, and, translations, tilts, yaws, and/or permutations and combinations thereof of a floating actuator element of the actuator assembly 3220, and provide the motion signals to the processing element for use in generating output signals. In addition, the three of the magnetic sensors 3555 located on the downward facing side of the sensor PCB 3560 may be used to determine signals that may indicate deformations or lack of deformations in deformable actuator elements of the actuator assembly 3220 to the processing element.

An output signal or signals may be generated in the processing element for transmission to an electronic computing system or other computer, control or other processor or logic-device based system (not illustrated) that corresponds with the displacement and/or deformations of the actuator assembly 3220. These output signals may be generated in a predetermined format that can be interpreted by the electronic computing system to correspond with particular actions at the actuator element (e.g., positions, movements, deformations, switching actions, etc.). The output signals may be generated to directly correspond to or be related to movements, variations, switch actions, etc., and/or may be mapped to more specific commands, such as commands to move, displace, and/or otherwise operate on virtual objects, grab or release virtual objects, deform virtual objects, and/or provide other command, control, data, and/or display functions.

Figure 51:
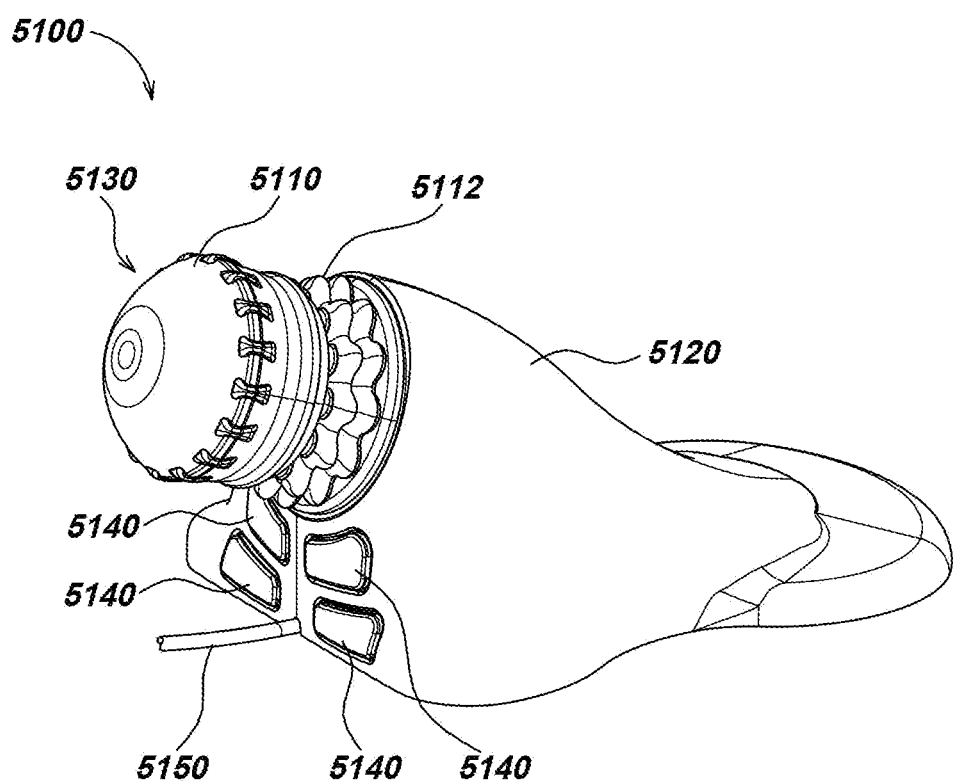
FIG. 51 is an isometric view of an embodiment of a user interface device with an alternative base configuration.
Figure 52:
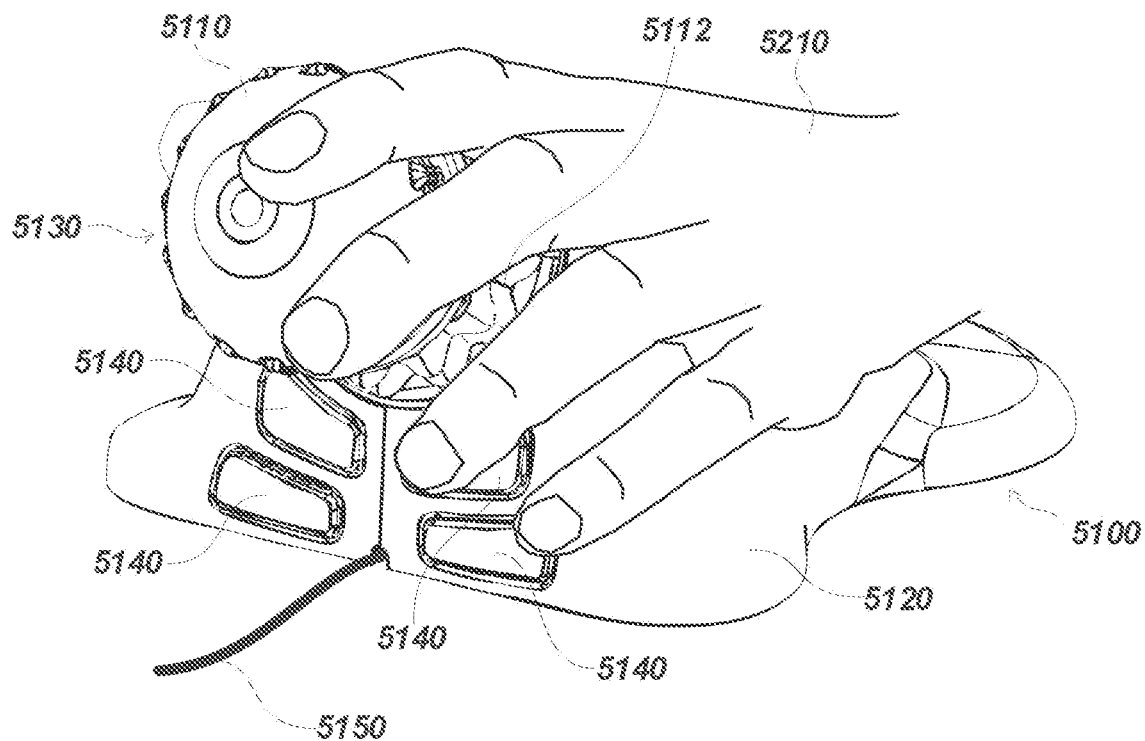
FIG. 52 is an isometric view of the embodiment of FIG. 51 illustrating interaction with a user's hand.

In FIGS. 51 and 52, another embodiment 5100 of a knob actuator user interface device with an enhanced elastomeric cover 5110, which may correspond with boot 7500 of FIG. 75, and an alternative base 5120, is shown. The enhanced elastomeric cover 5110 may be designed with a series of grooves to increase the tactile response of the actuator assembly 5130. A pleaded ribs section 5112 may be formed on the lower section of the elastomeric cover 5110. The pleaded ribs section 5112 may allow increased flexibility during rotational or twist displacements of the floating actuator element. As illustrated in FIG. 52, the alternative base 5120 may be contoured to allow a user's hand 5210 to rest upon the sloping surface of the base 5120 and manipulate the actuator assembly 5130 with their fingers. A series of buttons 5140 may be incorporated in the base 5120 to provide the user with push-button type control. In some embodiments such as the alternative embodiment 5100, a series of buttons may be provided for either left or right hand use. A cord 5150 may extend from the bottom of the alternative base 5120 to connect the alternative embodiment 5100 to a computing system such as the electronic computing system 720 described in FIG. 7.

In some embodiments, hardware and software may be used whereby the orientation of the user interface device such as UID 5100, in relation to a display monitor (not shown) is initially determined and stored as an initial user interface device reference position. In such embodiments, all subsequent incidents of moving or rotating the entire user interface device from the initial determined orientation to the monitor may be used to rotate the input coordinate system accordingly. The same hardware and software may also be enabled, during an initial set up process, to use operator intended actuator motions to correspond to and determine the orientation of the user interface device with respect to that of the monitor.

In some embodiments, permanent magnets, such as described previously herein, may be replaced, in whole or in part, with electromagnets, such as chip scale electromagnet devices (which may be configured, for example, similar to small SMT inductors). A high sensitivity sensor device, such as a compass sensor as described previously herein, may be used with the electromagnet to build a compact, single sensor user interface device. This approach may be viewed similar to a configuration where "permanent" magnets could be switched off and on, thereby allowing use of two different (electro)magnets with a single compact three axis sensor. This allows a far smaller, lower cost, single sensor UI device to be built compared to multiple, three axis sensors. Applications for this type of compact device may include notebook computers, smart phones, tablet devices, or devices where small and/or thin user interface devices may be useful. Since high sensitivity sensors such as compass sensors are very sensitive, a very low powered, very small electromagnet array (e.g., a cross-shaped pair or other configuration of electromagnets) may be used in place of permanent magnets.

One potential advantage of such an implementation is that a pair of crossed dipoles (e.g., the energized electromagnets) that are energized in sequence or in combination may be used to eliminate the ambiguity associated with the movement around the axis of symmetry of a single dipole, and thereby allow a single three axis sensor to be used while still allowing all six degrees of freedom to be sensed. Electromagnet embodiments may use similar elements and methods to those described previously for permanent magnet implementations. The primary difference is replacement of the small permanent magnets with small controllable electromagnets (dipoles) and associated electromagnet driver controls and/or associate sensor controls. For example, in one embodiment of an electromagnet magnetic UID configuration a cross-shaped electromagnet may use a small chip scale, wire wound surface mount (SMT) cross dipole inductor that can produce either a magnetic dipole A or a magnetic dipole B, such as by using a cross-shaped electromagnet, when electric current is run through wire windings A or B.

A cross-shaped electromagnet may be placed above a small digital magnetometer (such as Freescale MAG3110 device or other similar or equivalent device), and the crossed dipole may be moved by the user relative to a small compass or other high sensitivity magnetic field sensor (e.g., digital magnetometer) device, and sequential measurements of the field of dipole A and then dipole B may be measured when current is passed through each of these in sequence, thereby allowing the positional displacement and tilt of the relative movement and tilt between the two components to be measured.

Figure 53:
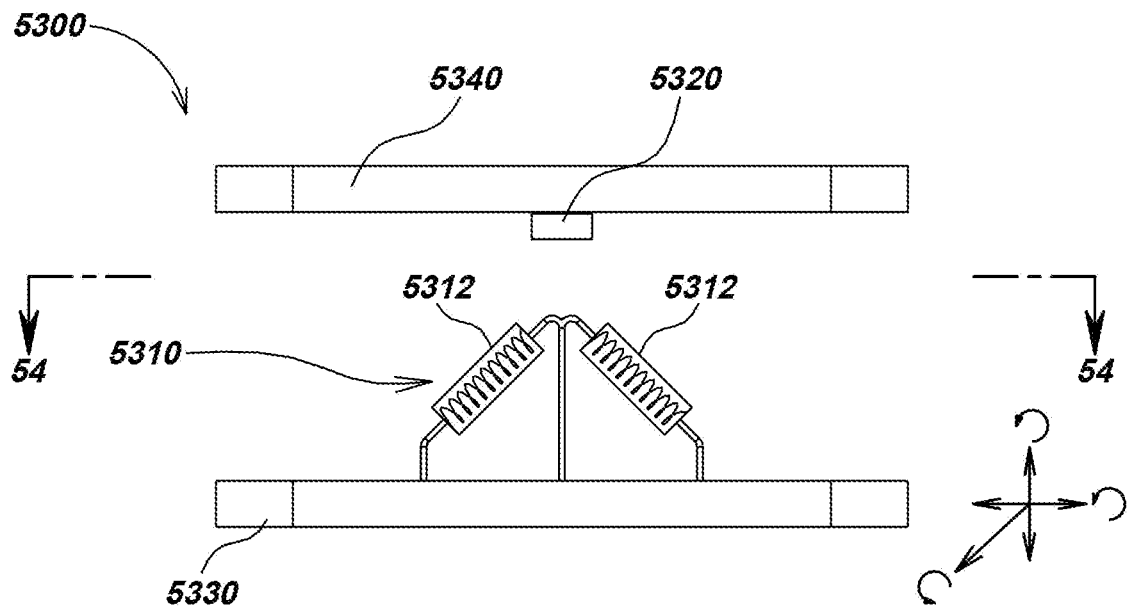
FIG. 53 is a side view of details of an electromagnet embodiment of a magnetically sensed user interface device.
Figure 54:
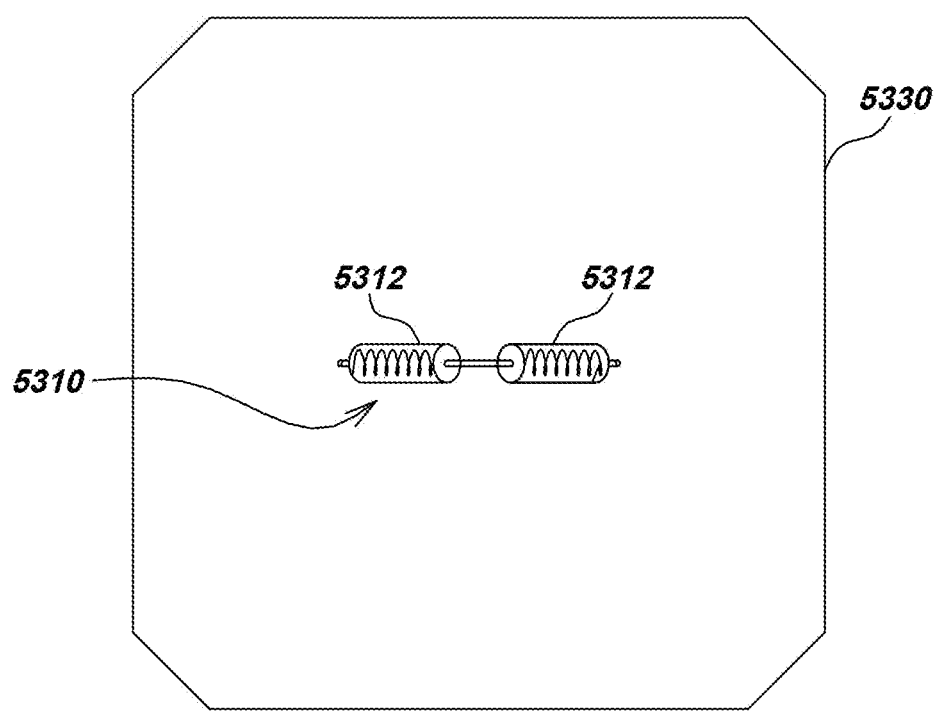
FIG. 54 is a sectional view of the embodiment of FIG. 53 along line 54-54.

Examples of electromagnet-configured user interface devices are shown in FIGS. 53-58. In FIGS. 53 and 54, an orthogonal dual electromagnet embodiment 5300 is illustrated. In embodiment 5300, an orthogonal dual electromagnet assembly 5310 may be formed by two electromagnets 5312 positioned orthogonally from one another. A high sensitivity magnetic sensor 5320 may be used to generate signals from each of the electromagnets 5312 of the orthogonal dual electromagnet assembly 5310 as they are energized in sequence. The orthogonal dual electromagnet assembly 5310 may be mounted on a lower PCB 5330 while the high sensitivity magnetic sensor 5320 may be mounted to an upper PCB 5340. In some embodiments, the orthogonal dual electromagnet assembly 5310 may be mounted on the upper PCB 5340 while the high sensitivity magnetic sensor 5320 may be mounted to the lower PCB 5330.

Figure 55:
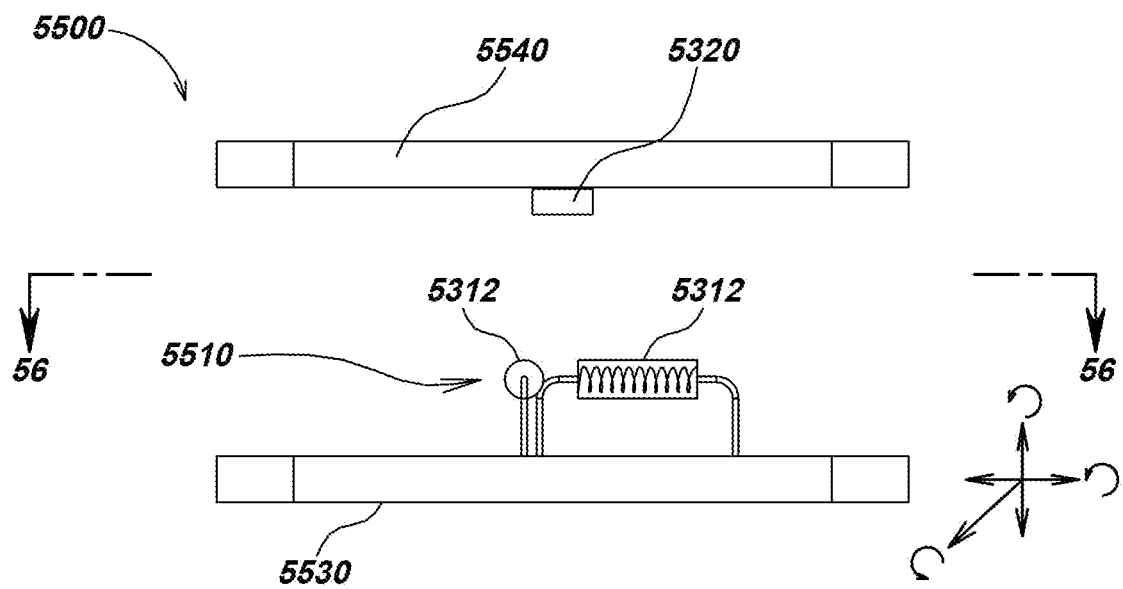
FIG. 55 is a side view of details of an electromagnet embodiment of a magnetically sensed user interface device.
Figure 56:
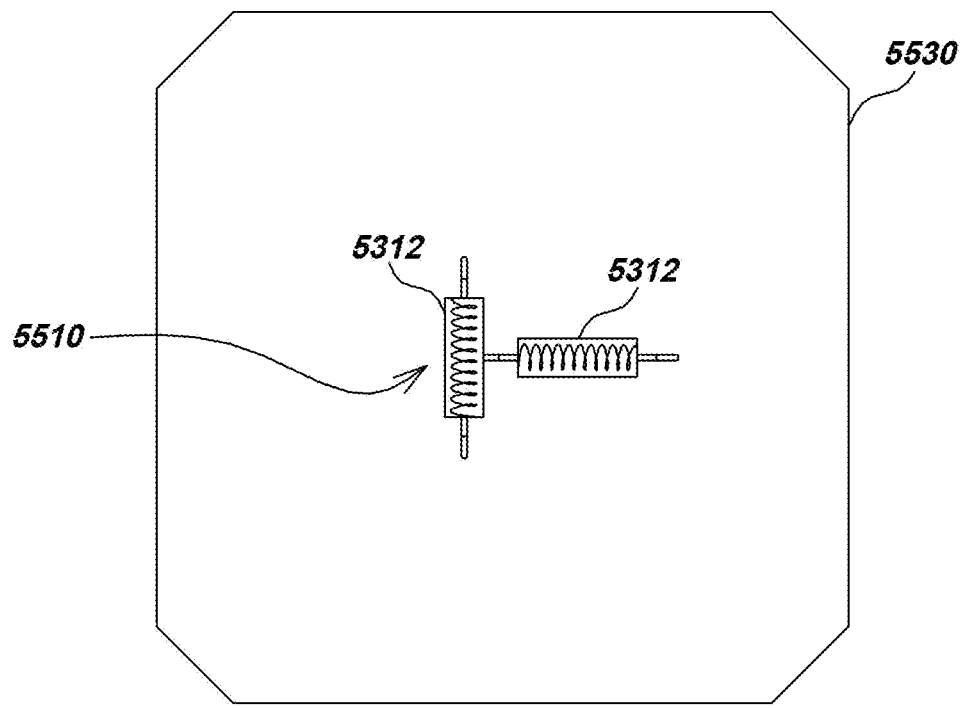
FIG. 56 is a sectional view of the embodiment of FIG. 55 along line 56-56.

In FIGS. 55 and 56, a T-shaped electromagnets embodiment 5500 is illustrated. In the embodiment 5500, a T-shaped electromagnet assembly 5510 may be formed by two electromagnets 5312 positioned in a 'T' type pattern. A high sensitivity magnetic sensor 5320 may be used to generate signals from each of the electromagnets 5312 of the T-shaped electromagnet assembly 5510 as they are energized in sequence. The T-shaped electromagnet assembly 5510 may be mounted on a lower PCB 5530 while the high sensitivity magnetic sensor 5320 may be mounted to an upper PCB 5540. In some embodiments, the T-shaped electromagnet assembly 5510 may be mounted on the upper PCB 5540 while the high sensitivity magnetic sensor 5320 may be mounted to the lower PCB 5530.

Figure 57:
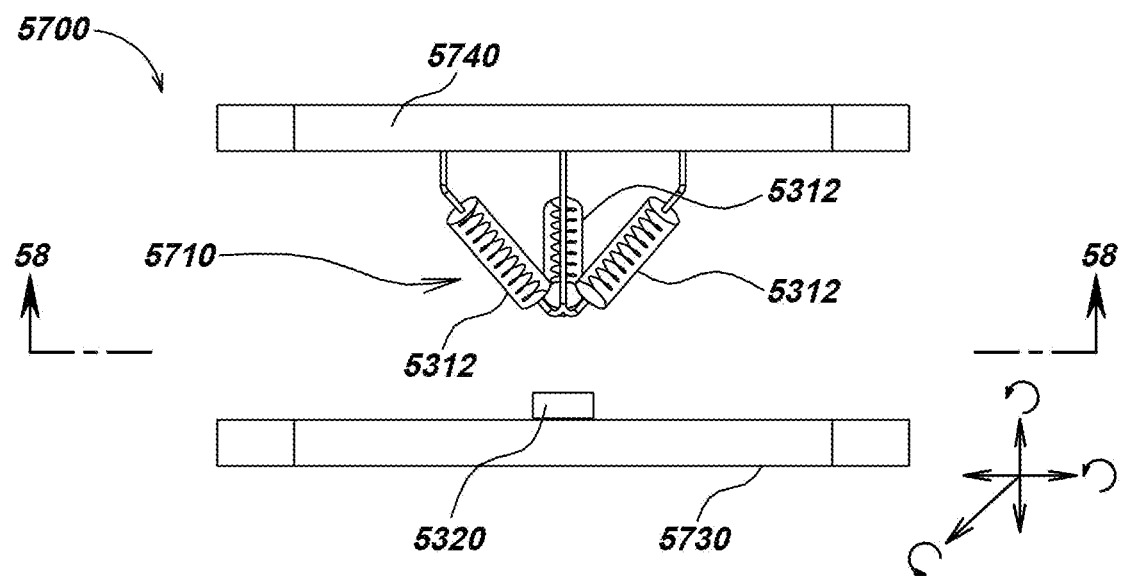
FIG. 57 is a side view of details of an electromagnet embodiment of a magnetically sensed user interface device.
Figure 58:
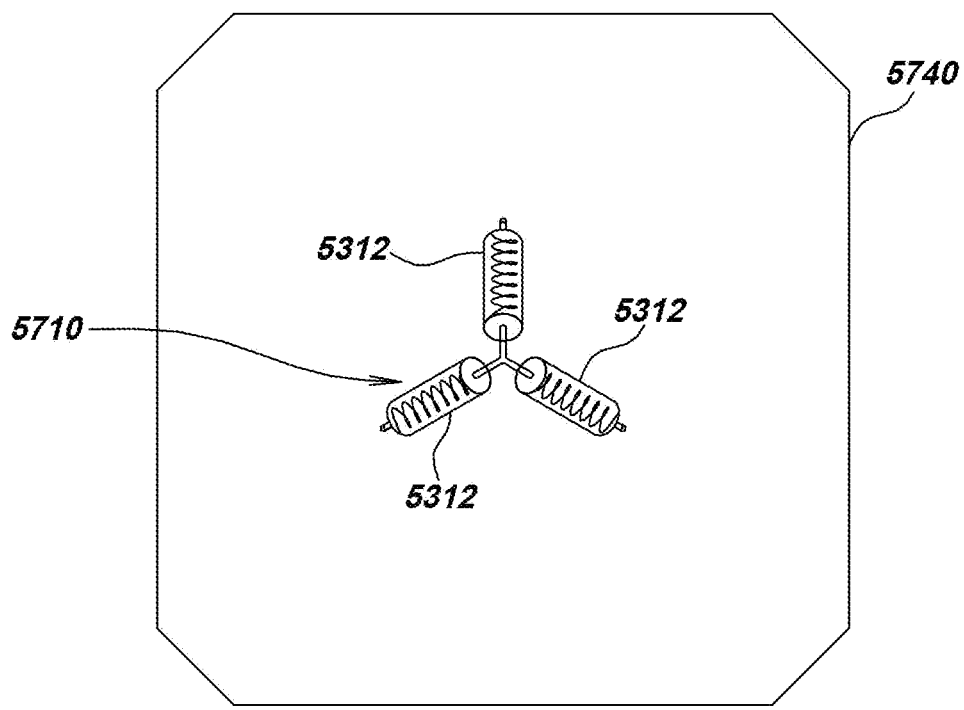
FIG. 58 is a sectional view of the embodiment of FIG. 57 along line 58-58.

In FIGS. 57 and 58, a tripod-shaped electromagnets embodiment 5700 is illustrated. In the embodiment 5700, a tripod-shaped electromagnet assembly 5710 may be formed by three electromagnets 5312 in a tripod type shape. A high sensitivity magnetic sensor 5320 may be used to generate signals from each of the electromagnets 5312 of the tripod-shaped electromagnet assembly 5710 as they are energized in sequence. The high sensitivity magnetic sensor 5320 may be mounted on a lower PCB 5730 while the tripod-shaped electromagnet assembly 5710 may be mounted to an upper PCB 5740. In some embodiments, the tripod-shaped electromagnet assembly 5710 may be mounted on the lower PCB 5730 while the high sensitivity magnetic sensor 5320 may be mounted to the upper PCB 5740.

While the embodiments of a knob-actuator user interface device have been described in a specific set of details, modifications and adaptations thereof will be apparent to persons of ordinary skill in the art. For example, a different number, arrangement, or shape of permanent magnets, sensors, springs, and/or other elements may be used with a different number, arrangement, or type of other elements. Varying the dimensions, quantity, materials used, or gauge of wire used in springs may vary the tactile response of the knob-actuator user interface device to the user. Varying the type, size, position, and/or other characteristics of permanent or electromagnets, which may be done in conjunction with specific magnetic sensors, may be used to adjust and/or optimize performance. Furthermore, varying the size of the knob actuator assembly or element, floating actuator assembly or element, deformable actuator element or assembly, or otherwise varying other elements that may alter the pivot point(s) within magnetic user interface devices may also be done to provide a different tactile response to the user. The addition of elastomeric bumpers or other dampening materials may also be used to alter the tactile response to the user.

In some configurations, the user interface device includes means for performing various electrical and mechanical functions as described herein. In one aspect, the aforementioned means may be particular elements and/or associated sub-elements. The aforementioned means may be magnets, magnetic sensors, springs, switches, and/or a processor or processors and associated memory in which embodiments reside, such as may be provided on a PCB and processing element such as described previously.

In one or more exemplary embodiments, certain functions, methods and processes described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It is understood that the specific order or hierarchy of steps or stages in the processes and methods disclosed herein are examples of exemplary approaches. Based upon design preferences, it is understood that the specific order or hierarchy of steps or stages in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The various illustrative logical blocks, modules, and circuits described in connection with the embodiments disclosed herein and, for example, in a processing element as described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A processing element may furthering include or be coupled to one or more memory elements for storing instructions, data, and/or other information in a digital storage format.

The steps or stages of a method, process or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The claims are not intended to be limited to the aspects shown herein, but is to be accorded the full scope consistent with the disclosure herein, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use embodiment of the present invention. Various modifications to these aspects will be readily apparent to those skilled in the art, and the generic principles defined herein may be applied to other aspects without departing from the spirit or scope of the invention. Thus, the present invention is not intended to be limited to the aspects shown herein but is to be accorded the widest scope consistent with the following claims and their equivalents.

We claim:

1. A magnetically sensing user interface device (UID), comprising:
    an actuator assembly including a plurality of magnets positioned in a substantially fixed array structure relative to each other;
    a base assembly including a plurality of multi-axis magnetic sensors, each magnetic sensor configured for sensing magnetic fields generated by the plurality of magnets in three orthogonal axes at a point in space;
    a mounting base;
    a flexible coupling assembly configured to floatably couple the actuator assembly to the base assembly, wherein the flexible coupling assembly includes a plurality of coil springs coupled to the base assembly and oriented perpendicular to a longitudinal axis of the actuator assembly; and
    a deformable actuator assembly including a second plurality of magnets, wherein the second plurality of magnets are disposed in movable positions relative to each other in a deformable magnet array.

2. The UID of claim 1, further comprising a limiting piece disposed in the base assembly for limiting an extent of displacement of the actuator assembly to prevent overstressing of the coil springs.

3. The UID of claim 1, further comprising a second base assembly including a second plurality of multi-axis magnetic sensors for sensing magnetic fields generated by the second plurality of magnets.

4. The UID of claim 3, further comprising a processing element, wherein the processing element is electrically coupled to the first plurality of multi-axis magnetic sensors to receive first magnetic sensor output signals from ones of the first plurality of magnetic sensors and generate, based on the first magnetic sensor output signals, a first UID output signal corresponding to a position or motion of the actuator assembly relative to the base assembly; and
    wherein the processing element is electrically coupled to the second plurality of multi-axis magnetic sensors to receive second magnetic sensor output signals from ones of the second plurality of magnetic sensors and generate, based on the second magnetic sensor output signals, a second UID output signal corresponding a deformation of the deformable actuator assembly.

5. The UID of claim 4, wherein the second UID output signal includes vector deformation information associated with a magnitude and a direction of the deformation of the deformable actuator assembly.

6. The UID of claim 1, wherein the flexible coupling assembly includes one or more restoration elements to provide restorative forces in response to user manipulation of the floating actuator assembly.

7. The UID of claim 6, wherein the restoration elements include coil springs oriented perpendicular to a longitudinal axis through the base assembly.

8. The UID of claim 1, further including a dampening element configured to dampen a motion of the floating actuator assembly relative to the base assembly.

9. The UID of claim 8, wherein the dampening element comprises a boot disposed about the floating actuator assembly and the base assembly.

10. The UID of claim 9, wherein the boot includes a longitudinal flexing section.

11. The UID of claim 10, wherein the boot further includes a rotational flexing section.

12. The UID of claim 1, further including a haptic feedback element.

13. The UID of claim 12, wherein the haptic feedback element is a vibrator motor.

* * * * *